United States Patent
Sugimoto

(10) Patent No.: US 9,922,999 B2
(45) Date of Patent: Mar. 20, 2018

(54) ELECTRO-OPTICAL DEVICE, ELECTRONIC APPARATUS

(71) Applicant: Seiko Epson Corporation, Tokyo (JP)

(72) Inventor: Yohei Sugimoto, Fujimi-machi (JP)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 15/279,327

(22) Filed: Sep. 28, 2016

(65) Prior Publication Data

US 2017/0102596 A1    Apr. 13, 2017

(30) Foreign Application Priority Data

Oct. 8, 2015    (JP) .................................. 2015-199981

(51) Int. Cl.
| | |
|---|---|
| *H01L 29/04* | (2006.01) |
| *H01L 31/036* | (2006.01) |
| *H01L 27/12* | (2006.01) |
| *H01L 27/06* | (2006.01) |
| *G02F 1/1362* | (2006.01) |
| *G02F 1/1368* | (2006.01) |

(52) U.S. Cl.
CPC ........ *H01L 27/1255* (2013.01); *G02F 1/1368* (2013.01); *G02F 1/136213* (2013.01); *G02F 1/136286* (2013.01); *H01L 27/0629* (2013.01); *G02F 1/136227* (2013.01); *G02F 2001/136218* (2013.01); *G02F 2201/40* (2013.01)

(58) Field of Classification Search
CPC ............. G02F 1/136213; G02F 1/1368; G02F 1/136227; G02F 1/136286; G02F 2001/136218; H01L 27/1255; H01L 27/0629

USPC ......................................... 349/38; 257/59, 72
See application file for complete search history.

(56) References Cited

U.S. PATENT DOCUMENTS

| 9,673,267 B2* | 6/2017 | Kim ..................... H01L 27/3262 |
|---|---|---|
| 2002/0089813 A1 | 7/2002 | Yamamoto et al. |
| 2004/0004221 A1 | 1/2004 | Murade |
| 2004/0135940 A1* | 7/2004 | Tsunekawa ....... G02F 1/136209 349/110 |
| 2004/0259359 A1* | 12/2004 | Chang ..................... H01L 27/12 438/689 |
| 2008/0129907 A1 | 6/2008 | Jun et al. |
| 2011/0149184 A1* | 6/2011 | Tsai .................. G02F 1/136213 349/38 |
| 2011/0242470 A1 | 10/2011 | Moriwaki |

(Continued)

FOREIGN PATENT DOCUMENTS

| JP | 2001-330857 A | 11/2001 |
|---|---|---|
| JP | 2002-277898 A | 9/2002 |
| JP | 2011-221071 A | 11/2011 |

(Continued)

*Primary Examiner* — Shouxiang Hu
(74) *Attorney, Agent, or Firm* — ALG Intellectual Property, LLC

(57) ABSTRACT

A liquid crystal device which is used as an electro-optical device according to the present embodiment includes at least five capacitance electrodes that are stacked on a substrate in a state where dielectric films are interposed therebetween. Two capacitance electrodes which are stacked on odd-numbered layers among the at least five capacitance electrodes are electrically connected to a capacitance line through a contact hole that is a common contact hole.

11 Claims, 46 Drawing Sheets

(56) References Cited

U.S. PATENT DOCUMENTS

2013/0082269 A1    4/2013  Hanamura
2015/0243722 A1*   8/2015  Kwon ................. H01L 27/3262
                                                            257/40

FOREIGN PATENT DOCUMENTS

| JP | 2013-080040 A | 5/2013 |
| JP | 2014-115676 A | 6/2014 |
| JP | 3197990 B | 6/2015 |
| JP | 2015-197582 A | 11/2015 |
| JP | 2015-197583 A | 11/2015 |
| JP | 2015-197584 A | 11/2015 |
| WO | WO-2015-151517 A | 10/2015 |

* cited by examiner

ELECTRO-OPTICAL DEVICE, ELECTRONIC APPARATUS

BACKGROUND

1. Technical Field

The present invention relates to an electro-optical device, an electronic apparatus including the electro-optical device, and a method of manufacturing the electro-optical device.

2. Related Art

For example, an active drive type liquid crystal device which is used as an electro-optical device includes a pixel electrode, a transistor which can control a potential of the pixel electrode, and a storage capacitor which is connected to the pixel electrode so as to retain the potential of the pixel electrode, in each of a plurality of pixels. The storage capacitor includes a pair of capacitance electrodes having a dielectric film interposed therebetween. A capacitance value of the storage capacitor is proportional to areas of the pair of capacitance electrodes. If the size of a pixel is decreased so as to realize high definition display quality, the areas of the pair of capacitance electrodes of the storage capacitor provided in each pixel are also decreased, and a capacitance value which can stably drive the pixel is difficult to be secured. If the pixel is unstably driven, display abnormality such as uneven brightness occurs.

In order to solve the problem relating to the storage capacitor, for example, JP-A-2001-330857 discloses an electro-optical device including five storage capacitors between a semiconductor layer of a transistor and a data line on a substrate. The five storage capacitors are electrically connected in series.

In addition, JP-A-2011-221071 discloses an electro-optical device in which an insulating film and a capacitance electrode that have a first electrode interposed therebetween are vertically disposed and each pixel includes two storage capacitors that are electrically connected in parallel.

In JP-A-2001-330857 and JP-A-2011-221071, a plurality of storage capacitors are provided on a substrate or storage capacitors are disposed in a stacked state, and thereby, a capacitance value is secured, but if the number of storage capacitors is increased, contact portions for electrical connection to the storage capacitors increase. If an area of a portion functioning as a capacitance electrode is limited in a state where the contact portion is provided, the capacitance value of the storage capacitor is affected. Hence, a high definition pixel is required, a capacitance value of the storage capacitor is secured, and a desirable display quality is realized.

SUMMARY

An advantage of some aspects of the invention is that the invention can be realized by the following aspects or application examples.

Application Example

According to this application example, there is provided an electro-optical device including a substrate; a plurality of pixels which are formed on the substrate; a transistor which is provided in each pixel; a pixel electrode which is provided in each pixel; and a pixel capacitor which is provided in each pixel. The pixel capacitor includes at least three storage capacitors which are electrically connected in parallel between the transistor and the pixel electrode, and a capacitance line to which a common potential is applied. The at least three storage capacitors include at least five capacitance electrodes which are stacked on the substrate in a state where dielectric films are interposed therebetween. At least two capacitance electrodes which are stacked on odd-numbered layers among the at least five capacitance electrodes are electrically connected to the capacitance line through a common contact hole on the substrate.

According to a configuration of the present application example, at least three storage capacitors are configured by stacking at least five capacitance electrodes on the substrate in a state where dielectric films are interposed therebetween. Hence, an area of each of the capacitance electrodes can be easily secured, compared to a case where a plurality of storage capacitors are configured at different positions in a planar view without being stacked. In addition, since at least two capacitance electrodes which are stacked on odd-numbered layers are electrically connected to the capacitance line through the common contact hole, the pixel structure on the substrate is simplified, compared to a case where contact holes for connection to the capacitance line are respectively provided corresponding to at least three storage capacitors. Hence, even if a high definition pixel is used, it is possible to provide an electro-optical device which can realize excellent display quality by securing a capacitance value of the pixel capacitor.

In the electro-optical device according to the application example, it is preferable that the pixel capacitor includes a first storage capacitor which is configured with a first capacitance electrode and a second capacitance electrode that have a first dielectric film interposed therebetween, a second storage capacitor which is configured with the second capacitance electrode and a third capacitance electrode that have a second dielectric film interposed therebetween, and a third storage capacitor which is configured with a fourth capacitance electrode and a fifth capacitance electrode that have a third dielectric film interposed therebetween. In addition, it is preferable that at least two of the first capacitance electrode, the third capacitance electrode, and the fifth capacitance electrode are electrically connected to the capacitance line through the common contact hole.

According to the configuration, it is possible to provide an electro-optical device which includes a pixel capacitor having three storage capacitors connected in parallel to the capacitance line, in each pixel, and realizes excellent display quality.

In the electro-optical device according to the application example, it is preferable that the pixel capacitor includes a first storage capacitor which is configured with a first capacitance electrode and a second capacitance electrode that have a first dielectric film interposed therebetween, a second storage capacitor which is configured with the second capacitance electrode and a third capacitance electrode that have a second dielectric film interposed therebetween, a third storage capacitor which is configured with the third capacitance electrode and a fourth capacitance electrode that have a third dielectric film interposed therebetween, and a fourth storage capacitor which is configured with the fourth capacitance electrode and a fifth capacitance electrode that have a fourth dielectric film interposed therebetween. In addition, it is preferable that at least two of the first capacitance electrode, the third capacitance electrode, and the fifth capacitance electrode are electrically connected to the capacitance line through the common contact hole.

According to the configuration, it is possible to provide an electro-optical device which includes a pixel capacitor having four storage capacitors connected in parallel to the capacitance line, in each pixel, and realizes excellent display quality.

In the electro-optical device according to the application example, it is preferable that, in the second capacitance electrode and the third capacitance electrode, electrode end portions of the substrate are aligned in a planar view.

According to the configuration, the second capacitance electrode and the third capacitance electrode have the same area. Hence, it is possible to increase a capacitance value of the second storage capacitor in which the second capacitance electrode and the third capacitance electrode that have the second dielectric film interposed therebetween are disposed, compared to a case where areas are different from each other.

In the electro-optical device according to the application example, it is preferable that the second capacitance electrode and the fourth capacitance electrode are electrically connected to the transistor through one contact hole.

According to the configuration, a pixel structure can be simplified, compared to a case where the second capacitance electrode and the fourth capacitance electrode are connected to the transistor through contact holes different from each other.

In the electro-optical device according to the application example, it is preferable that at least one dielectric film of the first dielectric film, the second dielectric film, the third dielectric film, and the fourth dielectric film covers at least a part of an end surface of a lower capacitance electrode under the at least one dielectric film. In addition, it is preferable that an upper capacitance electrode which is disposed through the at least one dielectric film with respect to the lower capacitance electrode has a portion which faces the at least a part of an end surface of the lower capacitance electrode.

According to the configuration, an actual area increases when the lower capacitance electrode and the upper capacitance electrode face each other through the dielectric film, and thus, it is possible to increase a capacitance value of at least one storage capacitor of at least three storage capacitors.

In the electro-optical device according to the application example, it is preferable that a thickness of the lower capacitance electrode is greater than a thickness of the at least one dielectric film.

According to the configuration, it is possible to further increase an actual area when the lower capacitance electrode and the upper capacitance electrode face each other through the dielectric film.

In the electro-optical device according to the application example, it is preferable that the at least one dielectric film has a greater thickness than other dielectric films.

According to the configuration, if the upper capacitance electrode and the lower capacitance electrode face each other through a dielectric film with a thickness greater than thicknesses of other dielectric films, on a surface including an end surface of the lower capacitance electrode, it is possible to increase an actual area when the lower capacitance electrode and the upper capacitance electrode face each other through the dielectric film.

In the electro-optical device according to the application example, it is preferable that the at least one dielectric film is a silicon-based oxide film, and covers an opening of the pixel.

According to the configuration, since the silicon-based oxide film has higher transmissivity than, for example, a silicon-based nitride film, light use efficiency of the pixel is not decreased even if a silicon-based oxide film is provided to cover an opening. Hence, it is possible to secure excellent optical characteristics even if the silicon-based oxide film is used as the dielectric film.

In the electro-optical device according to the application example, it is preferable that a capacitance electrode which is farthest away from the transistor on the substrate among the at least five capacitance electrodes has light shielding properties.

According to the configuration, light which is incident on the transistor can be shielded by a capacitance electrode having light shielding properties. Hence, it is possible to reduce unstable operation of the transistor due to the incident light.

Application Example

According to this application example, there is provided an electronic apparatus including the electro-optical device described in the above-described application example.

According to the application example, even if a high definition pixel is used, an electro-optical device can secure a capacitance value of the pixel capacitor and realize a desirable display quality. Accordingly, it is possible to provide an electronic apparatus with a nice display quality.

Application Example

According to this application example, there is provided a method of manufacturing an electro-optical device including a transistor, a pixel electrode, a pixel capacitor, and a capacitance line to which a common potential is applied, which are provided in each pixel, on a substrate, the method including: forming at least three storage capacitors by stacking at least five capacitance electrodes on the substrate in a state where dielectric films are interposed therebetween; and forming a common contact hole for electrically connecting at least two capacitance electrodes which are stacked on odd-numbered layers among the at least five capacitance electrodes to the capacitance line, on the substrate.

According to the application example, at least three storage capacitors are configured by stacking at least five capacitance electrodes on the substrate in a state where dielectric films are interposed therebetween. Hence, an area of each of the capacitance electrodes can be easily secured, compared to a case where a plurality of storage capacitors are configured at different positions in a planar view without being stacked. In addition, since at least two capacitance electrodes which are stacked on odd-numbered layers are electrically connected to the capacitance line through the common contact hole, the pixel structure on the substrate is simplified, compared to a case where a plurality of contact holes for connection to the capacitance line are formed corresponding to at least three storage capacitors. Hence, even if a high definition pixel is used, it is possible to manufacture an electro-optical device which realizes excellent display quality by securing a capacitance value of the pixel capacitor.

In the method of manufacturing the electro-optical device according to the application example, it is preferable that forming of the at least three storage capacitors includes forming a first capacitance electrode on the substrate; forming a second capacitance electrode on the first capacitance electrode through a first dielectric film; forming a third capacitance electrode on the second capacitance electrode through a second dielectric film; forming a fourth capacitance electrode on an upper layer of the third capacitance electrode; and forming a fifth capacitance electrode on the fourth capacitance electrode through a third dielectric film. In addition, it is preferable that in the forming of the common contact hole, the common contact hole for electrically connecting at least two of the first capacitance electrode, the third capacitance electrode, and the fifth capacitance electrode to the capacitance line is formed.

According to the method, it is possible to manufacture an electro-optical device in which a pixel capacitor having three storage capacitors connected in parallel to the capacitance line is formed in each pixel, and which realizes excellent display quality.

In the method of manufacturing the electro-optical device according to the application example, it is preferable that forming of the at least three storage capacitors includes forming a first capacitance electrode on the substrate; forming a second capacitance electrode on the first capacitance electrode through a first dielectric film; forming a third capacitance electrode on the second capacitance electrode through a second dielectric film; forming a fourth capacitance electrode on the third capacitance electrode through a third dielectric film; and forming a fifth capacitance electrode on the fourth capacitance electrode through a fourth dielectric film. In addition, it is preferable that in the forming of the common contact hole, the common contact hole for electrically connecting at least two of the first capacitance electrode, the third capacitance electrode, and the fifth capacitance electrode to the capacitance line is formed.

According to the method, it is possible to manufacture an electro-optical device in which a pixel capacitor having four storage capacitors electrically connected in parallel to the capacitance line is formed in each pixel, and which realizes excellent display quality.

In the method of manufacturing the electro-optical device according to the application example, it is preferable that forming of the at least three storage capacitors includes forming a first capacitance electrode on the substrate; forming a first electrode film on the first capacitance electrode through a first dielectric film; forming a second electrode film on the first electrode film through a second dielectric film; forming a second capacitance electrode and a third capacitance electrode by collectively patterning the first electrode film, the second dielectric film, and the second electrode film; forming a fourth capacitance electrode on an upper layer of the third capacitance electrode; and forming a fifth capacitance electrode on the fourth capacitance electrode through a third dielectric film. In addition, it is preferable that in the forming of the common contact hole, the common contact hole for electrically connecting at least two of the first capacitance electrode, the third capacitance electrode, and the fifth capacitance electrode to the capacitance line is formed.

According to the method, a pixel capacitor having three storage capacitors connected in parallel to the capacitance line is formed in each pixel. In addition, the second capacitance electrode and the third capacitance electrode are formed by collectively patterning the first electrode film, the second dielectric film, and the second electrode film. Accordingly, it is possible to efficiently manufacture an electro-optical device with excellent display quality.

In the method of manufacturing the electro-optical device according to the application example, it is preferable that forming of the at least three storage capacitors includes forming a first capacitance electrode on the substrate; forming a first electrode film on the first capacitance electrode through a first dielectric film; forming a second electrode film on the first electrode film through a second dielectric film; forming a second capacitance electrode and a third capacitance electrode by collectively patterning the first electrode film, the second dielectric film, and the second electrode film; forming a fourth capacitance electrode on the third capacitance electrode through a third dielectric film; and forming a fifth capacitance electrode on the fourth capacitance electrode through a fourth dielectric film. In addition, it is preferable that in the forming of the common contact hole, the common contact hole for electrically connecting at least two of the first capacitance electrode, the third capacitance electrode, and the fifth capacitance electrode to the capacitance line is formed.

According to the method, a pixel capacitor having four storage capacitors connected in parallel to the capacitance line is formed in each pixel. In addition, the second capacitance electrode and the third capacitance electrode are formed by collectively patterning the first electrode film, the second dielectric film, and the second electrode film. Accordingly, it is possible to efficiently manufacture an electro-optical device with excellent display quality.

In the method of manufacturing the electro-optical device according to the application example, it is preferable that forming of the at least three storage capacitors includes forming one contact hole which electrically connects the second capacitance electrode and the fourth capacitance electrode among the at least five capacitance electrodes to the transistor.

According to the method, it is possible to manufacture an electro-optical device having a simplified pixel structure, compared to a case where contact holes which respectively connect the second capacitance electrode and the fourth capacitance electrode to the capacitance line are formed corresponding to the second capacitance electrode and the fourth capacitance electrode, respectively.

In the method of manufacturing the electro-optical device according to the application example, it is preferable that at least one dielectric film of the first dielectric film, the second dielectric film, the third dielectric film, and the fourth dielectric film is formed to cover at least a part of an end portion of a lower capacitance electrode under the at least one dielectric film, and an upper capacitance electrode is formed to face at least a part of an end portion of the lower capacitance electrode, on the at least one dielectric film.

According to the method, an actual area increases when the lower capacitance electrode and the upper capacitance electrode face each other through the dielectric film, and thus, it is possible to increase a capacitance value of at least one storage capacitor of at least three storage capacitors.

In the method of manufacturing the electro-optical device according to the application example, it is preferable that a thickness of the lower capacitance electrode is greater than a thickness of the at least one dielectric film.

According to the method, an actual area further increases when the lower capacitance electrode and the upper capacitance electrode face each other through the dielectric film, and thus, it is possible to further increase a capacitance value of at least one storage capacitor of at least three storage capacitors.

In the method of manufacturing the electro-optical device according to the application example, it is preferable that the at least one dielectric film with a thickness greater than thicknesses of other dielectric films is formed.

According to the method, if the upper capacitance electrode and the lower capacitance electrode face each other through a dielectric film with a thickness greater than thicknesses of other dielectric films, on a surface including an end surface of the lower capacitance electrode, it is possible to increase an actual area when the lower capacitance electrode and the upper capacitance electrode face each other through the dielectric film.

In the method of manufacturing the electro-optical device according to the application example, it is preferable that the at least one dielectric film is formed to cover an opening of the pixel by using a silicon-based oxide film.

According to the method, since the silicon-based oxide film has higher transmissivity than, for example, a silicon-based nitride film, light use efficiency of the pixel is not decreased even if the silicon-based oxide film is formed to cover an opening. Hence, it is possible to secure excellent optical characteristics even if the silicon-based oxide film is used as the dielectric film.

In the method of manufacturing the electro-optical device according to the application example, it is preferable that a capacitance electrode which is farthest away from the transistor among the at least five capacitance electrodes is formed on the substrate by using a conductive film with light shielding properties.

According to the method, light which is incident on the transistor can be shielded by a capacitance electrode formed by using a conductive film having light shielding properties. Hence, it is possible to reduce unstable operation of the transistor due to the incident light.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments that specify the invention will be described with reference to the accompanying drawings. The drawings which are used are illustrated in an appropriately expanded or contracted manner, such that portions to be described are in a recognizable state.

In the present embodiment, an active drive type liquid crystal device that includes a thin film transistor (referred to as TFT) for each pixel as an electro-optical device will be described as an example. The liquid crystal device can be appropriately used, for example, as an optical modulation element (liquid crystal light valve) of a projection type display device (liquid crystal projector) to be described below.

First Embodiment

Figure 1:
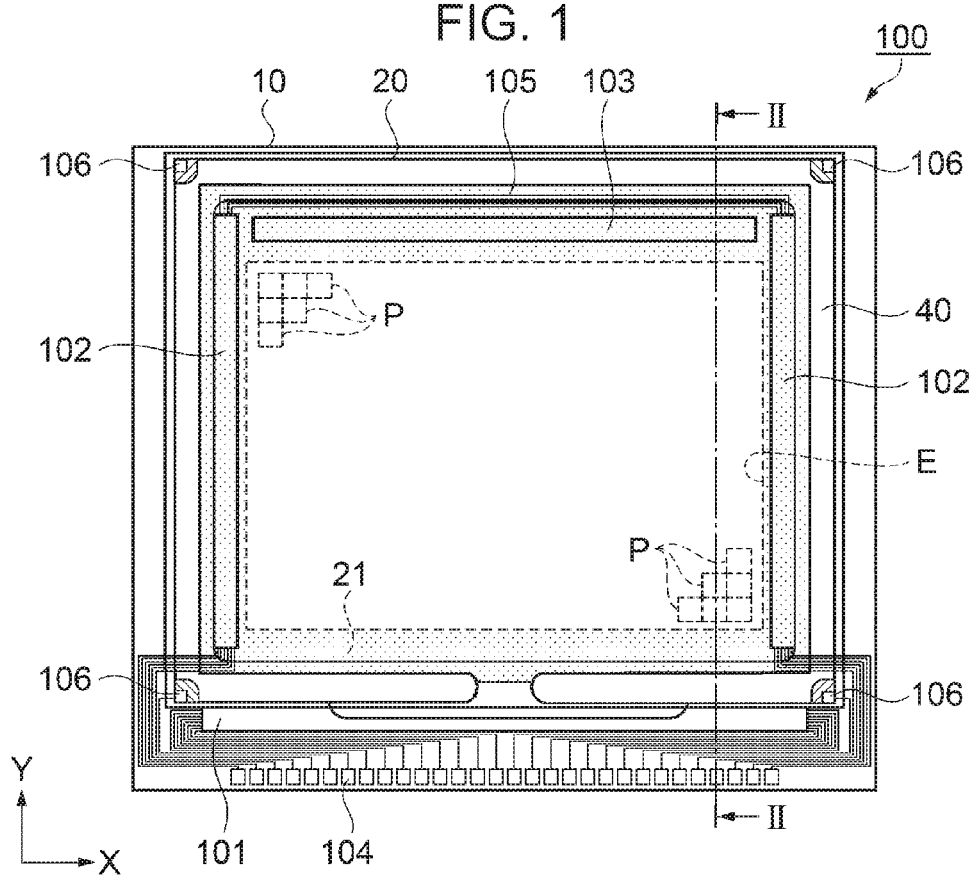
FIG. 1 is a schematic plan view illustrating a configuration of a liquid crystal device.
Figure 2:
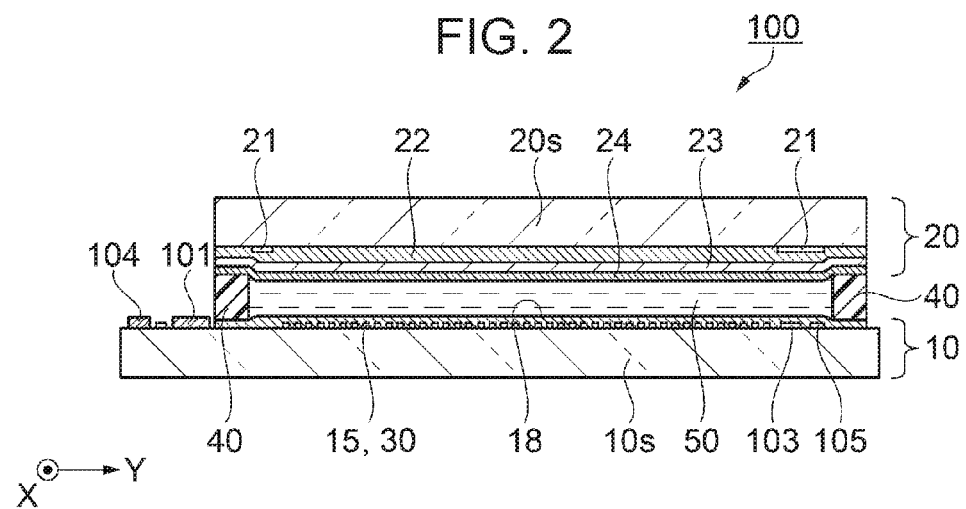
FIG. 2 is a schematic sectional view taken along the line II-II of the liquid crystal device illustrated in FIG. 1.
Figure 3:
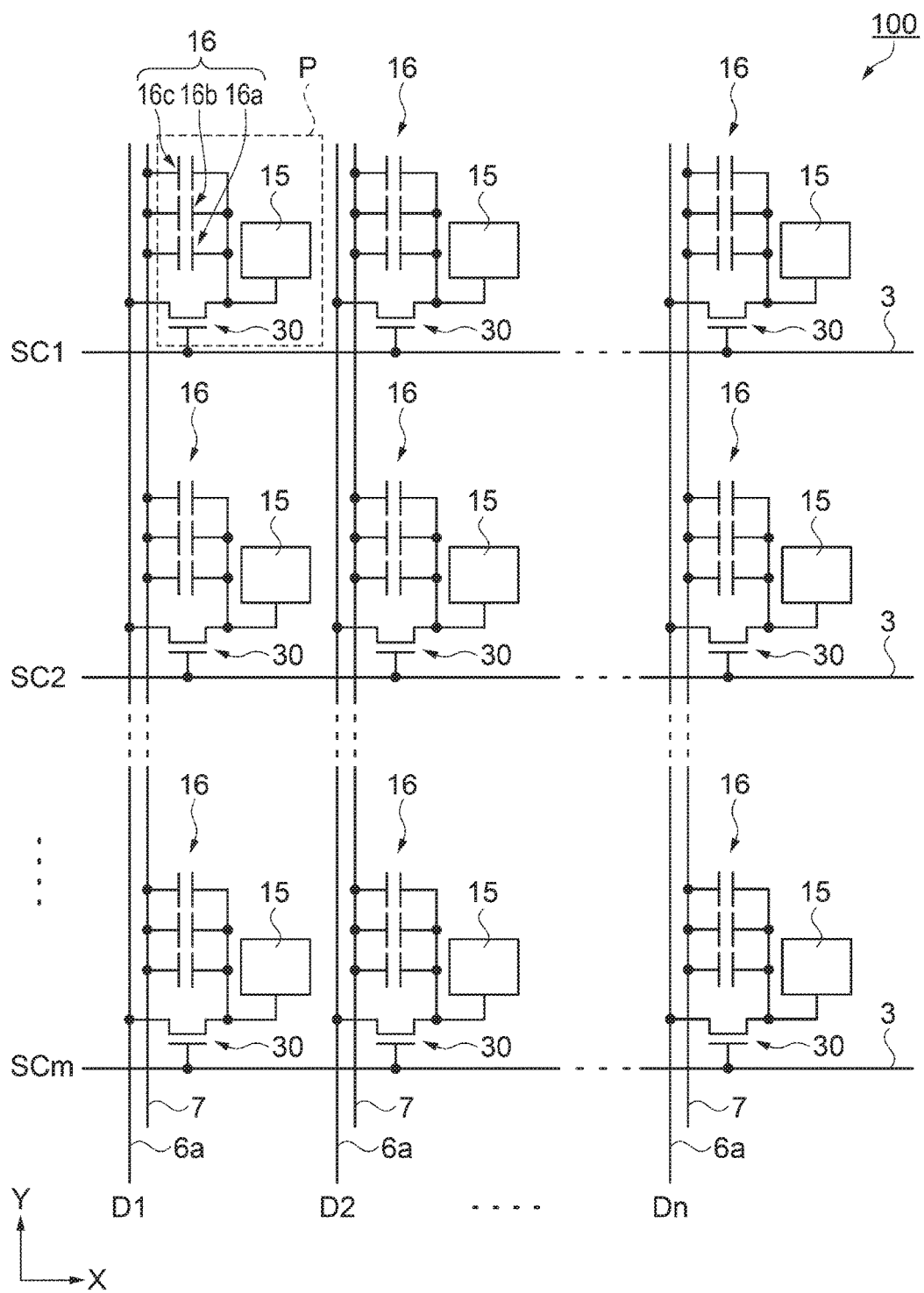
FIG. 3 is an equivalent circuit diagram illustrating an electrical configuration of the liquid crystal device.

To begin with, a configuration of a liquid crystal device that is used as an electro-optical device according to the present embodiment will be described with reference to FIG. 1 to FIG. 3. FIG. 1 is a schematic plan view illustrating a configuration of the liquid crystal device. FIG. 2 is a schematic sectional view taken along the line II-II of the liquid crystal device illustrated in FIG. 1. FIG. 3 is an equivalent circuit diagram illustrating an electrical configuration of the liquid crystal device.

As illustrated in FIG. 1 and FIG. 2, a liquid crystal device 100 according to the present embodiment includes an element substrate 10 and a counter substrate 20 that are disposed to face each other, and a liquid crystal layer 50 that is interposed between a pair of the substrates. A base member 10s of the element substrate 10 and a base member 20s of the counter substrate 20 use a transparent material, such as a quartz substrate or a glass substrate. In the present specification, transparency means that at least 85% or more of visible light can transmit through a material.

The element substrate 10 is slightly larger than the counter substrate 20. The element substrate 10 and the counter substrate 20 are bonded together via a sealing material 40 that is disposed in a frame shape along an outer edge of the counter substrate 20, and a liquid crystal layer 50 is configured by sealing liquid crystal having a positive or negative dielectric anisotropy in an interval therebetween. An adhesive such as a heat-curable or ultraviolet curable epoxy resin is employed in the sealing material 40. A spacer (not illustrated) for constantly maintaining the interval between a pair of substrates is mixed into the sealing material 40.

A display region E in which a plurality of pixels P are arranged in a matrix is provided in the inner side of the sealing material 40. In addition, in the counter substrate 20, a parting section 21 that surrounds the display region E is provided between the sealing material 40 and the display region E. The parting section 21 is configured with, for example, a metal having light shielding properties, an alloy of metals, an oxide, or the like. The display region E may include dummy pixels that are disposed to surround the plurality of pixels P, in addition to the plurality of pixels P contributing to displaying.

A terminal section in which a plurality of external connection terminals 104 are arranged is provided in the element substrate 10. A data line drive circuit 101 is provided between a first side portion along the terminal section of the element substrate 10 and the sealing material 40. In addition, a test circuit 103 is provided between the sealing material 40 along a second side portion facing the first side portion and the display region E. Furthermore, scan line drive circuits 102 are provided between the sealing material 40 along third and fourth side portions that are orthogonal to the first side portion and face each other and display region E. A plurality of wires 105 which connect the two scan line drive circuits 102 together are provided between the sealing material 40 of the second side portion and the test circuit 103.

The wires that are connected to the data line drive circuit 101 and the scan line drive circuit 102 are connected to a plurality of external connection terminals 104 that are arranged along the first side portion. Thereafter, it will be described that a direction along the first side portion is referred to as an X direction, and a direction along the third side portion and the fourth side portion is referred to as a Y direction. In the present specification, a direction orthogonal to the X direction and the Y direction, and a normal direction of the counter substrate 20 are referred to as a "planar view" or "planar".

As illustrated in FIG. 2, the element substrate 10 includes the base member 10s, TFTs 30 or pixel electrodes 15 that are formed on a surface of the base member 10s on a liquid crystal layer 50 side, and an alignment film 18 that covers the pixel electrodes 15. The TFT 30 and the pixel electrode 15 are configuration elements of the pixel P. The pixel P will be described in detail below.

The counter substrate 20 includes the base member 20s, the parting sections 21 that are sequentially stacked on a surface of the base member 20s on the liquid crystal layer 50 side, a planarization layer 22, a counter electrode 23, an alignment film 24, and the like.

As illustrated in FIG. 1, the parting sections 21 surround the display region E, and are provided in positions that respectively overlap the scan line drive circuit 102 and the test circuit 103 in a planar manner. Thereby, the parting section performs a function of shielding light incident on the peripheral circuit including the drive circuits from the counter substrate 20 side and preventing the peripheral circuit from malfunctioning due to the light. In addition, light is shielded such that unnecessary stray light is not incident on the display region E, and thus, it is possible to secure high contrast for displaying on the display region E.

The planarization layer 22 with light transparency is formed of, for example, an inorganic material such as a silicon oxide, and is provided to cover the parting sections 21. The planarization layer 22 is a silicon oxide film which is formed by using, for example, a plasma CVD method or the like, and has a thickness to the extent that roughness of a surface of the counter electrode 23 which is formed on the planarization layer 22 can be reduced.

The counter electrode 23 is formed of a transparent conductive film such as an indium tin oxide (ITO) or an indium zinc oxide (IZO), covers the planarization layer 22, and is electrically connected to wires on the element substrate 10 side by vertical connection sections 106 that are provided on four corners of the counter substrate 20, as illustrated in FIG. 1.

The alignment film 18 that covers the pixel electrodes 15 and the alignment film 24 that covers the counter electrode 23 are set based on an optical design of the liquid crystal device 100, and employs an oblique deposition film (inorganic alignment film) of an inorganic material such as a silicon oxide. The alignment films 18 and 24 may employ an organic alignment film such as polyimide, in addition to the inorganic alignment film.

The liquid crystal device 100 is a transmission type, and employs an optical design of a normally white mode in which display is bright when the pixel P is not driven or a normally black mode in which display is dark when the pixel is not driven. Polarization elements are respectively disposed on an incident side and an exit side of light, according to an optical design.

Next, an electrical configuration of the liquid crystal device 100 will be described with reference to FIG. 3. The liquid crystal device 100 includes a plurality of scan lines 3 and a plurality of data lines 6a that are used as signal wires which are insulated with each other and orthogonal to each other in at least the display region E, and capacitance lines 7 to which a common potential is applied. In FIG. 3, the capacitance lines 7 are illustrated so as to be in parallel along the data lines 6a, but are not limited to this.

The pixel electrode 15, the TFT 30, and a pixel capacitor 16 are provided in a region that is separated by the scan line 3 and the data line 6a, and a pixel circuit of the pixel P is configured by those. The pixel capacitor 16 includes three storage capacitors 16a, 16b, and 16c which are electrically connected in parallel between the TFT 30 and the pixel electrode 15, and the capacitance line 7.

The scan line 3 is electrically connected to a gate of the TFT 30, the data line 6a is electrically connected to a first source•drain region of the TFT 30, and the pixel electrode 15 is electrically connected to a second source•drain region of the TFT 30.

The data line 6a is connected to the data line drive circuit 101 (refer to FIG. 1). Image signals D1, D2, . . . , Dn are supplied to the respective pixels P from the data line drive circuit 101 through the data lines 6a. The scan line 3 is connected to the scan line drive circuit 102 (refer to FIG. 1). Scan signals SC1, SC2, . . . , SCm are supplied to the respective pixels P from the scan line drive circuit 102 through the scan lines 3.

The image signals D1 to Dn which are supplied from the data line drive circuit 101 may be supplied to the data lines 6a in an ascending order of lines, and may be supplied to each group of a plurality of data lines 6a adjacent to each other. The scan line drive circuit 102 supplies the scan signals SC1 to SCm to the scan lines 3 in an ascending order of lines in a pulse manner at a predetermined timing.

The liquid crystal device 100 has a configuration in which the TFT 30 that is a switching element is in an ON state only for a predetermined period by inputting of the scan signals SC1 to SCm and thereby the image signals D1 to Dn that are supplied from the data lines 6a are written to the pixel electrodes 15 at a predetermined timing. Then, the image signals D1 to Dn with predetermined levels that are written to the liquid crystal layer 50 through the pixel electrodes 15 are retained for a predetermined period between the counter electrodes 23 and the pixel electrodes 15.

In order to prevent the retained image signals D1 to Dn from leaking, the pixel capacitor 16 is connected in parallel to a liquid crystal capacitor formed between the pixel electrode 15 and the counter electrode 23. Specifically, the pixel capacitor 16 is provided between the second source•drain region of the TFT 30 and the capacitance line 7.

The data lines 6a are connected to the test circuit 103 illustrated in FIG. 1, and the test circuit 103 is configured such that operation defects or the like of the liquid crystal device 100 can be confirmed by detecting the image signals during manufacturing of the liquid crystal device 100, but this is omitted in the equivalent circuit of FIG. 3.

In addition, the test circuit 103 may include a sampling circuit that samples the image signals and supplies the sampled image signals to the data lines 6a, and a precharge circuit which supplies precharge signals with a predetermined voltage level to the data lines 6a prior to the image signals.

Figure 4:
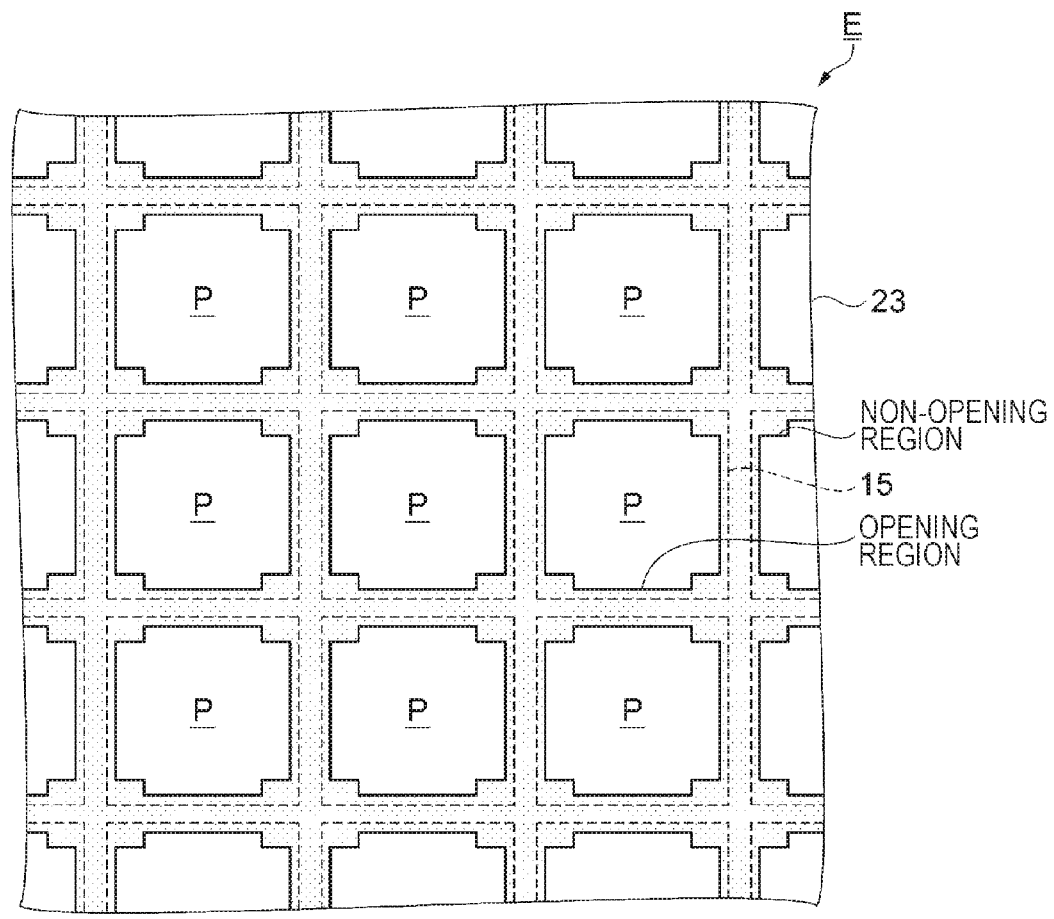
FIG. 4 is a schematic plan view illustrating disposition of pixels.

Next, a configuration of the pixel P in the liquid crystal device 100 will be described with reference to FIG. 4. FIG. 4 is a schematic plan view illustrating disposition of the pixels.

As illustrated in FIG. 4, the pixel P in the liquid crystal device 100 has, for example, an approximately rectangular (approximately square) opening region (also referred to as an opening) in a planar view. The opening region is surrounded by a non-opening region (also referred to as a non-opening portion) with light shielding properties that extends in the X and Y directions and is provided in a lattice pattern.

The scan line 3 illustrated in FIG. 3 is provided in the non-opening region which extends in the X direction. The scan line 3 uses a conductive member with light shielding properties, and a part of the non-opening region is configured by the scan line 3.

In the same manner, the data line 6a illustrated in FIG. 3 and the capacitance line 7 are provided in the non-opening region which extends in the Y direction. The data line 6a and the capacitance line 7 also use a conductive member with light shielding properties, and a part of the non-opening region is configured by the data line and the capacitance line.

The TFT 30 and the pixel capacitor 16 which are illustrated in FIG. 3 are provided near an intersection of the non-opening regions. A configuration of the pixel P will be described in detail below, but a width of the non-opening region near the intersection is greater than those of other portions, in relation to providing the TFT 30 and the pixel capacitor 16 near the intersection. By providing the TFT 30 and the pixel capacitor 16 near the intersection of the non-opening regions with light shielding properties, an aperture ratio of an opening is secured.

The pixel electrode 15 is provided in each pixel P. The pixel electrode 15 is approximately a square in a planar view, and is provided in the opening region such that an outer edge of the pixel electrode 15 overlaps the non-opening region.

The liquid crystal device 100 according to the present embodiment is transparent, and is configured on the assumption that light is incident from the counter substrate 20 side. As described above, the TFT 30, the pixel electrode 15, and the pixel capacitor 16 are provided in each pixel P in the element substrate 10. In addition, the pixel capacitor 16 is configured with the three storage capacitors 16a, 16b, and 16c, and the three storage capacitors 16a, 16b, and 16c are disposed in the non-opening region. In other words, the three storage capacitors 16a, 16b, and 16c also configure a part of the non-opening region.

Structure of Element Substrate

Figure 5:
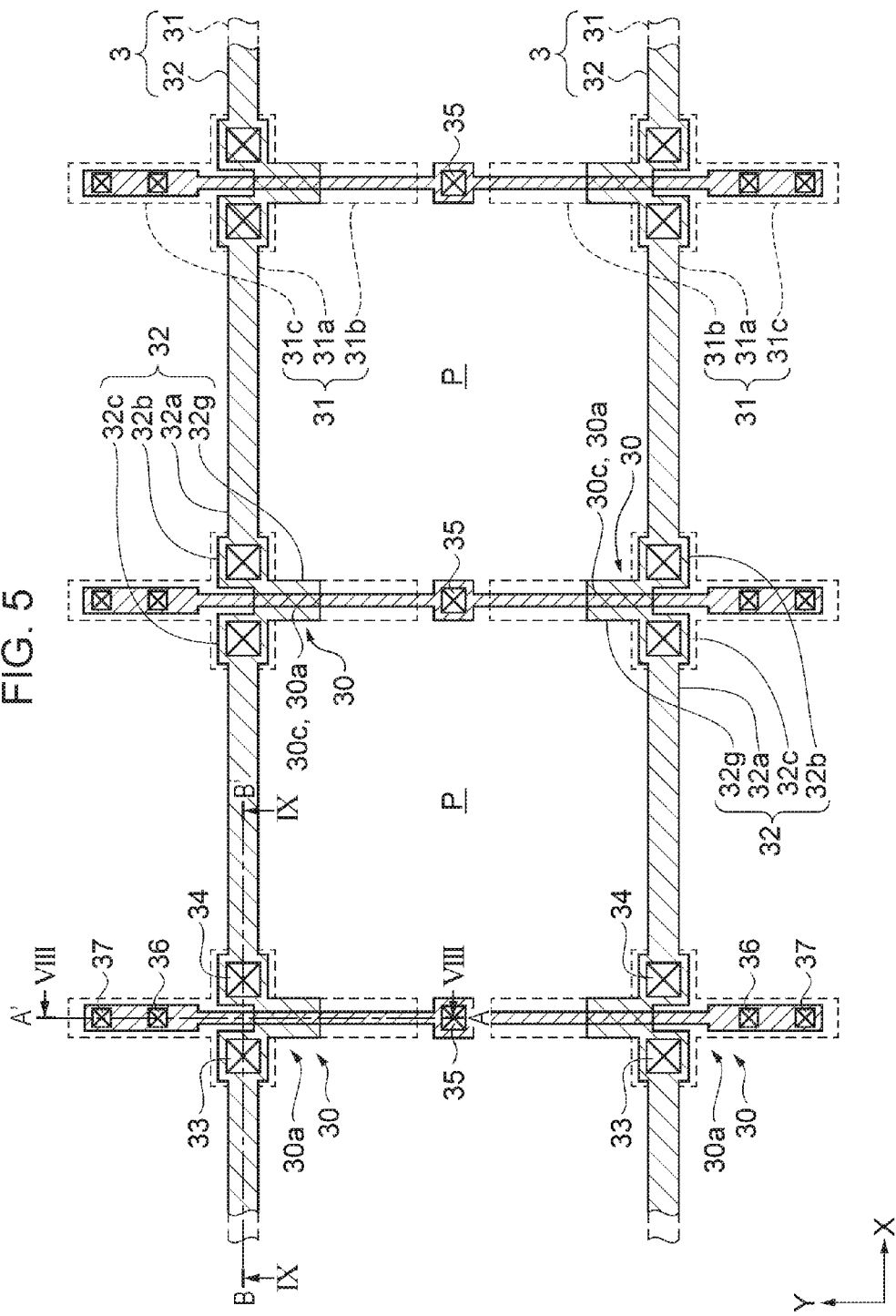
FIG. 5 is a schematic plan view illustrating disposition of transistors and scan lines in an element substrate.
Figure 6:
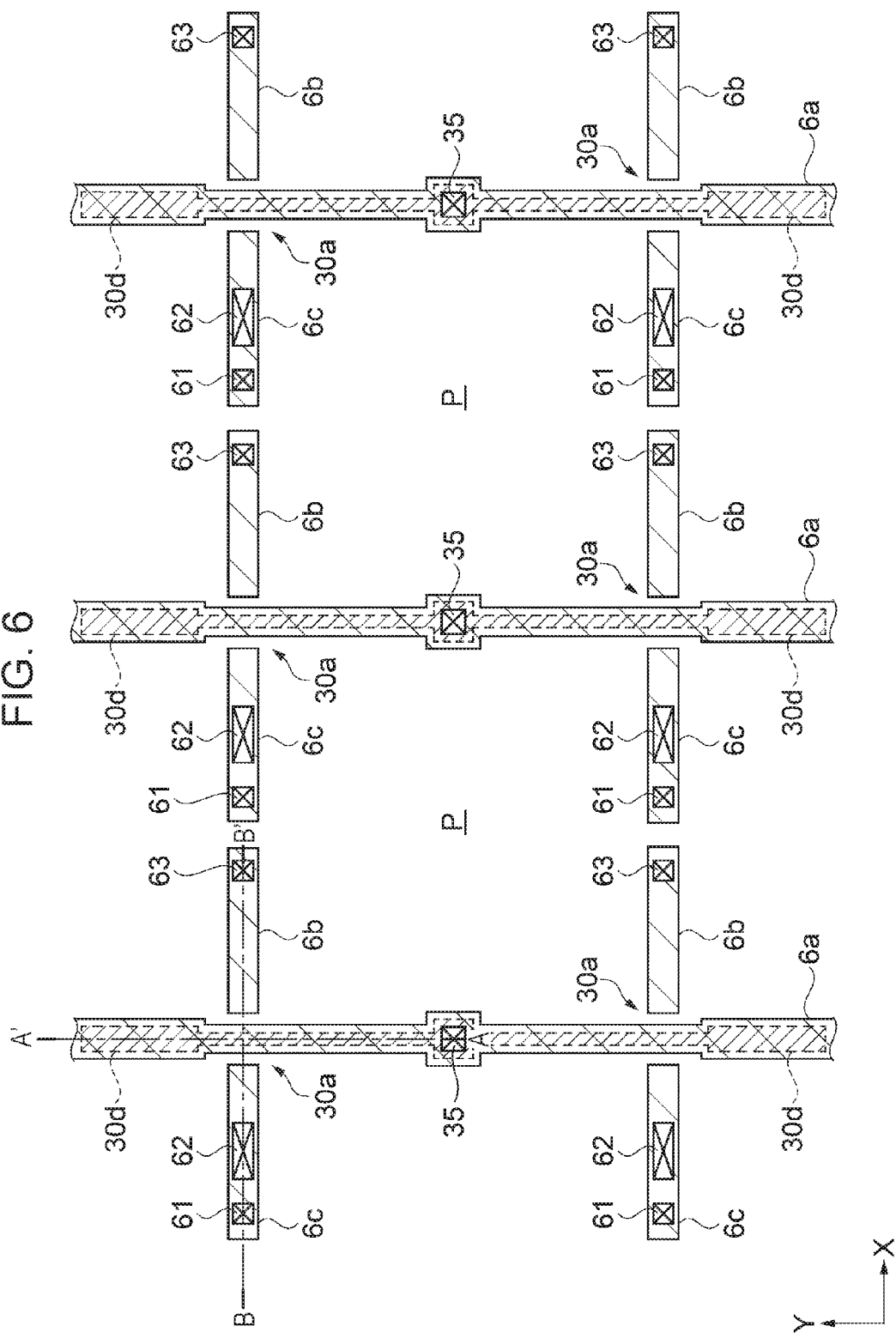
FIG. 6 is a schematic plan view illustrating disposition of data lines and contact holes relating to the data lines in the element substrate.
Figure 7:
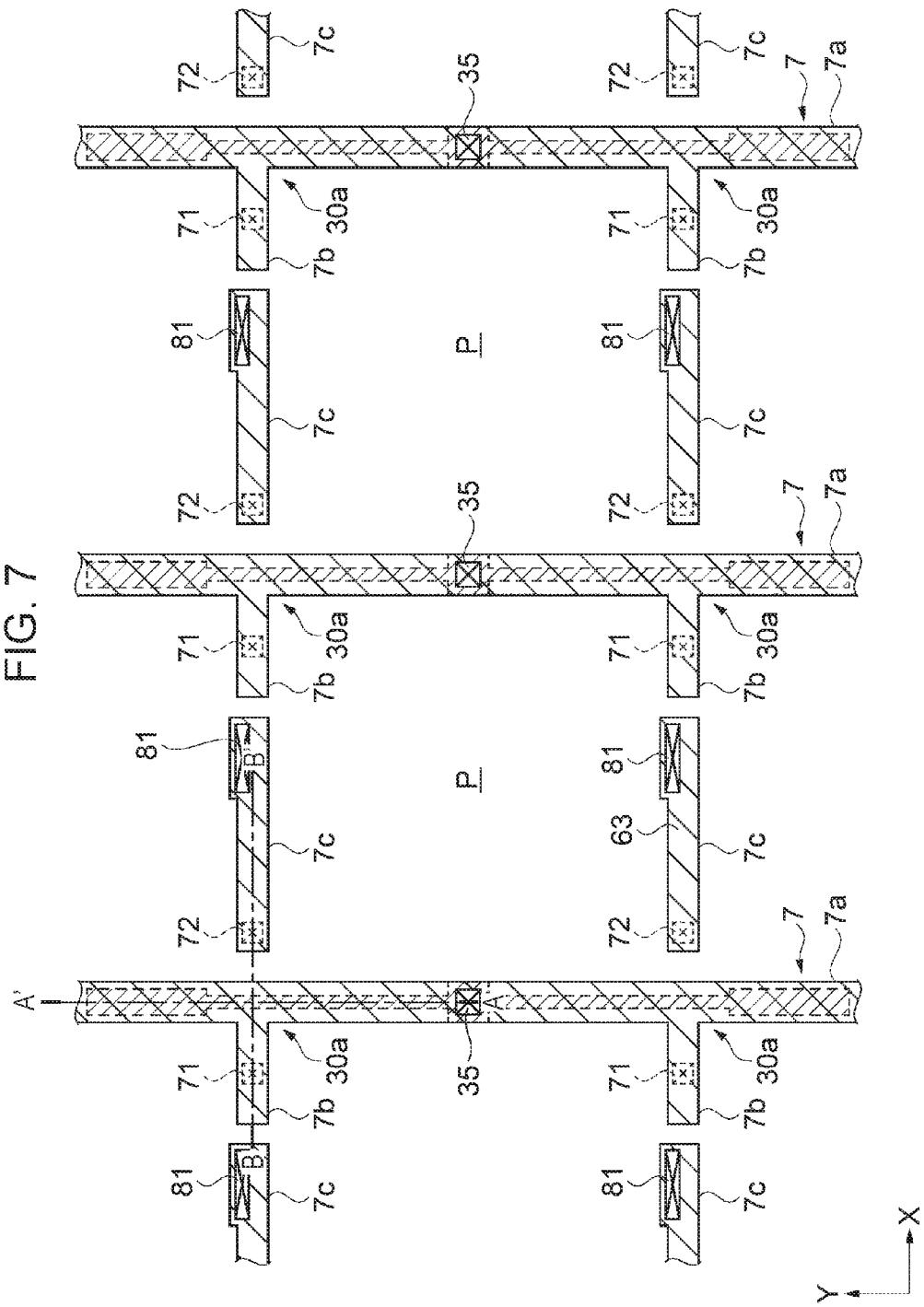
FIG. 7 is a schematic plan view illustrating disposition of capacitance lines and contact holes relating to the capacitance lines in the element substrate.
Figure 8:
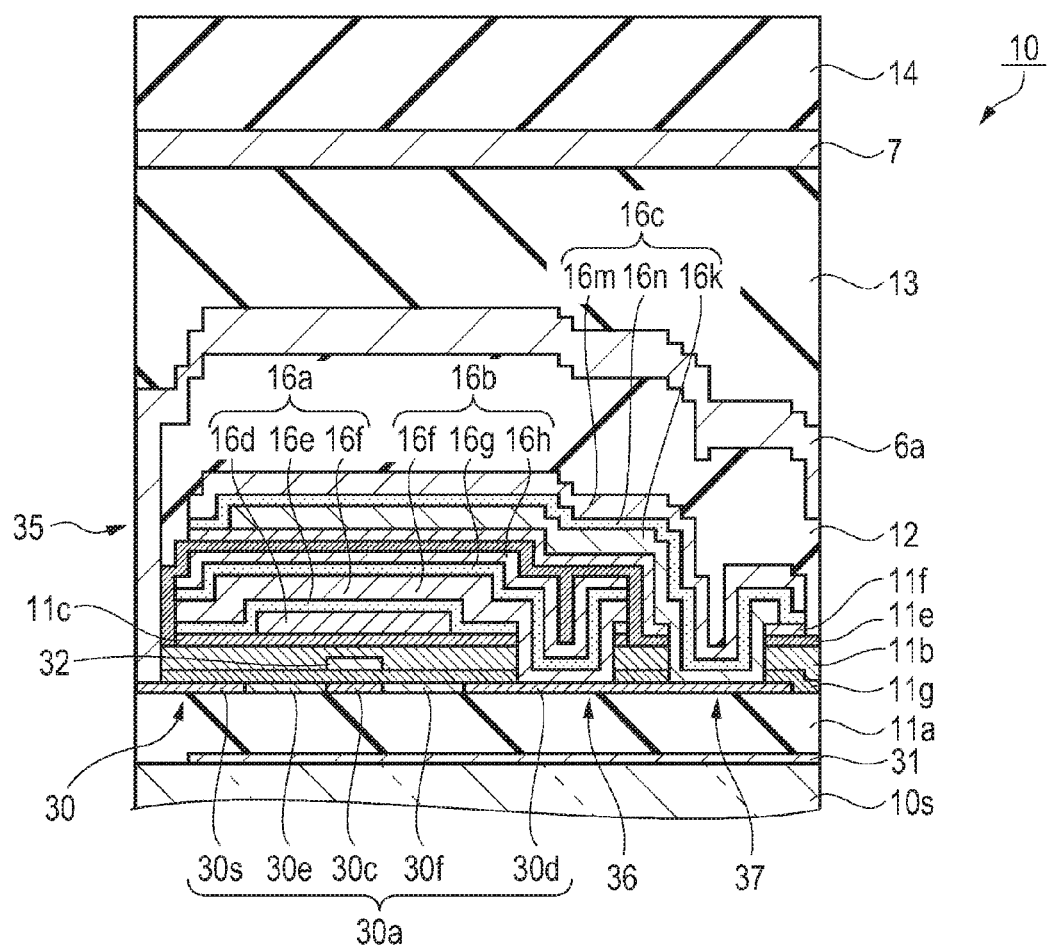
FIG. 8 is a schematic sectional view illustrating a structure of the element substrate taken along the line VIII-VIII of FIG. 5.
Figure 9:
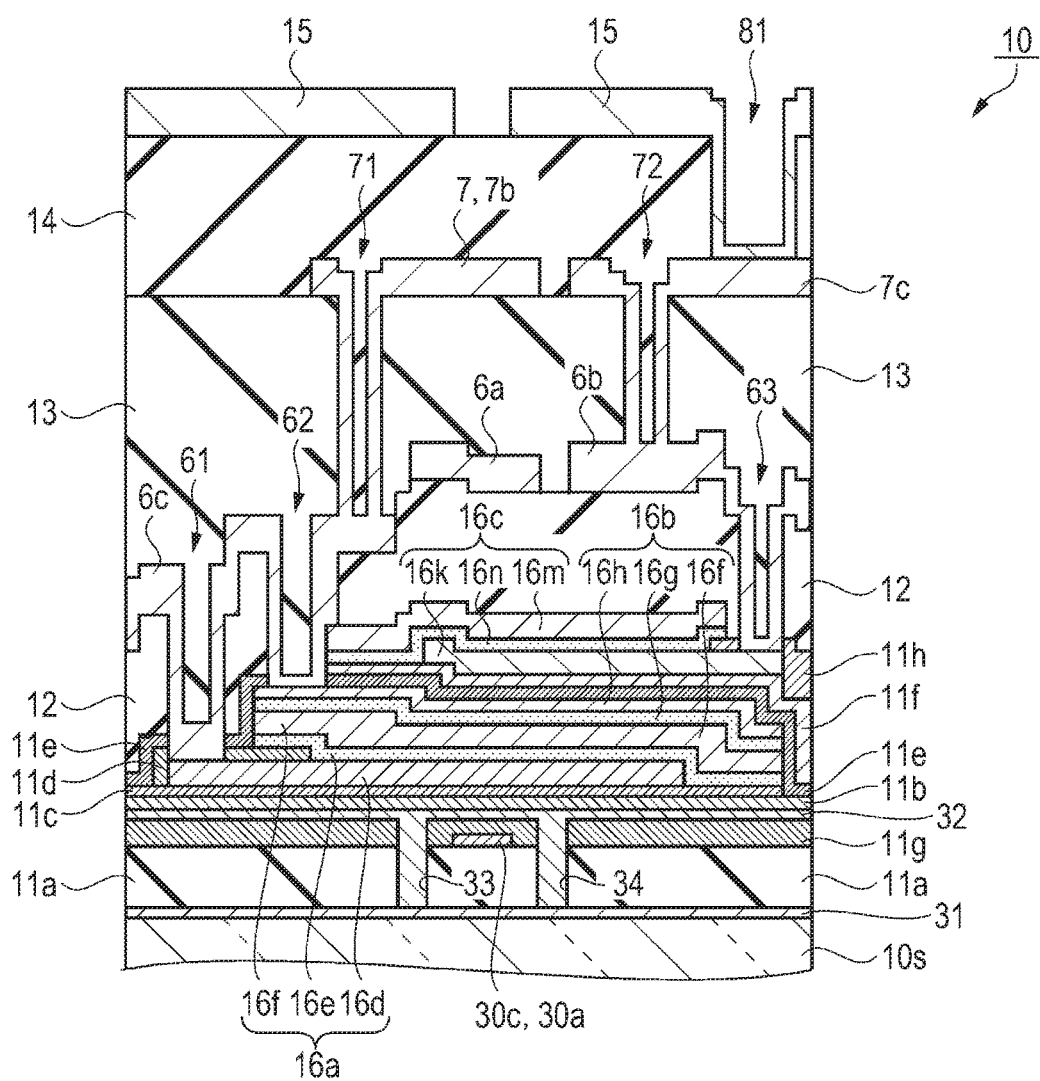
FIG. 9 is a schematic sectional view illustrating the structure of the element substrate taken along the line IX-IX of FIG. 5.

Next, each configuration of the element substrate 10 will be described with reference to FIG. 5 to FIG. 9. FIG. 5 is a schematic plan view illustrating disposition of transistors and the scan lines in the element substrate. FIG. 6 is a schematic plan view illustrating disposition of the data lines and contact holes relating to the data lines in the element substrate. FIG. 7 is a schematic plan view illustrating disposition of the capacitance lines and the contact holes relating to the capacitance lines in the element substrate. FIG. 8 is a schematic sectional view illustrating a structure of the element substrate taken along the line VIII-VIII of FIG. 5. FIG. 9 is a schematic sectional view illustrating the structure of the element substrate taken along the line IX-IX of FIG. 5. The element substrate 10 includes a plurality of wiring layers in which each configuration is formed on the base member 10s, and FIG. 5 to FIG. 7 illustrate a planar disposition of the wiring layer of the corresponding configuration. In addition, a value of a film thickness of each configuration which will be described hereinafter is preferably a planar value.

FIG. 5 illustrates the pixels P adjacent to each other in the X direction, and disposition of the corresponding TFTs 30, and the scan lines 3. As illustrated in FIG. 5, the scan line 3 is configured to include a first scan line 31 (illustrated by a dashed line in FIG. 5) which extends in the X direction over the pixel P adjacent to each other in the X direction, and a second scan line 32 (illustrated by a solid line in FIG. 5) which is disposed to overlap the first scan line 31 in a planar view and in the same manner, extends in the X direction.

The first scan line 31 includes a main line portion 31a extending in the X direction, and two protrusion portions 31b and 31c protruding in the Y direction from an expansion portion of the main line portion 31a. The non-opening regions of a lattice pattern illustrated in FIG. 4 are configured by disposing the first scan lines 31, with a predetermined interval in the Y direction, based on a pitch between the pixels P. A semiconductor layer 30a of the TFT 30 which is provided in each pixel P is disposed at a position which overlaps the protrusion portions 31b and 31c of the first scan line 31 on an upper-left corner of the pixel P, in the present embodiment.

The semiconductor layer 30a which is slender and long in the Y direction includes the first source•drain region, a channel region 30c, and the second source•drain region. The first source•drain region overlaps the protrusion portion 31b. The second source•drain region overlaps the protrusion portion 31c. The channel region 30c is between the first source•drain region and the second source•drain region. The first source•drain region is electrically connected to the data line 6a in the aforementioned equivalent circuit illustrated in FIG. 3 through the contact hole 35, and thus, the first source•drain region will be hereinafter referred to as a source region. In the same manner, the second source•drain region is electrically connected to the pixel electrode 15 or the pixel capacitor 16 through the two contact holes 36 and 37 in the equivalent circuit of FIG. 3, and thus, the second source•drain region will be hereinafter referred to as a drain region.

In the present embodiment, in the semiconductor layers 30a of the TFTs 30 in the pixel P adjacent to each other in the Y direction, the semiconductor layer 30a of another pixel P is disposed in a direction opposite to the semiconductor layer 30a of one pixel P, such that one contact hole 35 can be shared and the source regions face each other in the Y direction. Hence, the protrusion portion 31b of the first scan lines 31 are also disposed to face each other in the Y direction, and the contact hole 35 is provided between the protrusion portions 31b facing each other.

The second scan line 32 includes the main line portion 32a extending in the X direction, two expansion portions 32b and 32c which are provided with an interval in the X direction, and a protrusion portion 32g which is disposed to connect the two expansion portions 32b and 32c and protrudes in the Y direction. In addition, the protrusion portion 32g is disposed to overlap the channel region 30c of the semiconductor layer 30a. Contact holes 33 and 34 which electrically connect the first scan line 31 to the second scan line 32 are provided in the two expansion portions 32b and 32c. That is, the scan line 3 is configured by the first scan line 31 and the second scan line 32 which are electrically connected to each other by the contact holes 33 and 34. The protrusion portion 32g, which is disposed to overlap the channel region 30c of the semiconductor layer 30a, in the scan line 3 functions as a gate electrode of the TFT 30.

In order to hereinafter describe a structure of each configuration of the element substrate 10, a line from the contact hole 35 to a contact hole 37 along the semiconductor layer 30a is marked with the line VIII-VIII in FIG. 5 to FIG. 7. In addition, a line crossing the contact hole 33, the semiconductor layer 30a, and the contact hole 34 is marked with the line IX-IX. There is a case where start points and end points of the line IX-IX are located differently from each other in FIG. 5 to FIG. 7 for the sake of convenience of description.

As illustrated in FIG. 6, the data lines 6a extend in the Y direction, and are disposed in parallel with an interval in the X direction, based on a pitch between the pixels P. Widths of the data lines 6a in a portion overlapping a drain region 30d of the semiconductor layer 30a and a portion overlapping the contact hole 35 are greater than those in other portions. In addition, two relay layers 6b and 6c in parallel along the X direction are provided between the data lines 6a adjacent to each other in the X direction. The two relay layers 6b and 6c are disposed at a position which overlaps the main line portions 31a and 32a of the scan line 3 illustrated in FIG. 5. That is, the data line 6a and the relay layers 6b and 6c are provided on the same wiring layer so as to configure the non-opening region illustrated in FIG. 4. Contact holes 61, 62, and 63 for connection to a capacitance electrode of the pixel capacitor 16 that will be described below are provided in the relay layers 6b and 6c. Specifically, the contact hole 63 is provided in the relay layer 6b, and the two contact holes 61 and 62 are provided in the relay layer 6c. The contact hole 62 is longer than the contact hole 61, in the X direction, and the contact hole 62 is an example of a common contact hole, in the invention. Detailed description will be made below.

As illustrated in FIG. 7, the capacitance line 7 includes a main line portion 7a extending in the Y direction, and a protrusion portion 7b protruding on a left side of the figure from the main line portion 7a in the X direction. The capacitance lines 7 are disposed in parallel with an interval in the X direction, based on a pitch between the pixels P. The main line portion 7a of the capacitance line 7 is disposed to overlap the semiconductor layer 30a in a planar view. A relay layer 7c extending in the X direction is provided between the capacitance lines 7 adjacent to each other in the X direction. The protrusion portion 7b of the capacitance line 7 and the relay layer 7c are disposed at a position overlapping the relay layers 6b and 6c illustrated in FIG. 6. A contact hole 71 for electrical connection to the relay layer 6c is provided in the protrusion portion 7b, and a contact hole 72 for electrical connection to the relay layer 6b is provided in the relay layer 7c. In addition, a contact hole 81 for electrical connection to the pixel electrode 15 is provided in the relay layer 7c. That is, the capacitance line 7 and the relay layer 7c are provided on the same wiring layer so as to configure the non-opening region illustrated in FIG. 4.

Next, sectional structures taken along the lines VIII-VIII and IX-IX of the element substrate 10 will be described with reference to FIG. 8 and FIG. 9.

As illustrated in FIG. 8 and FIG. 9, the first scan line 31 is first formed on the base member 10s. The first scan line 31 includes at least a part of high-melting-point metals such as, Ti, Cr, Mo, Ta, W, and the like, and are formed by using a single metal, an alloy, metal silicide, polysilicide, a member in which the single metal, the alloy, the metal silicide, and the polysilicide are stacked, conductive polysilicon, or the like. Particularly, it is preferable that the first scan line 31 is formed by using metal silicide with light shielding properties from a viewpoint that leakage light which is incident from the base member 10s side is shielded and input light which is incident from the counter substrate 20 side is not reflected. In the present embodiment, the first scan line 31 is formed by using tungsten silicide (WSi). A thickness of the first scan line 31 is, for example, 200 nm to 500 nm.

Next, a first interlayer insulating film 11a covering the first scan line 31 is formed. Since the semiconductor layer 30a is hereinafter formed on the first interlayer insulating film 11a, the first interlayer insulating film 11a is formed by using, for example, a silicon oxide film (non-doped silicate glass; NSG film) or a silicon nitride film, without intentional injection of impurity. A method of forming the first interlayer insulating film 11a can include an atmospheric pressure CVD method which uses processing gas such as monosilane ($SiH_4$), 2 chloride silane ($SiCl_2H_2$), tetraethyl orthosilicate (TEOS), ammonia, or the like, a low pressure CVD method, a plasma CVD method, or the like. A thickness of the first interlayer insulating film 11a is, for example, 200 nm to 500 nm.

Subsequently, the semiconductor layer 30a is formed on the first interlayer insulating film 11a. For example, the semiconductor layer 30a is formed of a polysilicon film which is obtained by crystallizing an amorphous silicon film which is accumulated by, for example, a low pressure CVD method or the like. A lightly doped drain (LDD) structure which includes a source region 30s, a bond region 30e, a channel region 30c, a bond region 30f, and a drain region 30d is constructed by selectively injecting impurity ions into the polysilicon film. A thickness of the semiconductor layer 30a is, for example, 30 nm to 70 nm.

Subsequently, a gate insulating film 11g covering the semiconductor layer 30a is formed. The gate insulating film 11g is configured by a two-layer structure of a first silicon oxide film which is obtained by thermally oxidizing, for example, a semiconductor film of silicon, and a second silicon oxide film which is formed at high-temperature conditions of 700° C. to 900° C. by using a low pressure CVD method. A thickness of the gate insulating film 11g is, for example, 50 nm to 100 nm.

The second scan line 32 is formed on the gate insulating film 11g. The second scan line 32 is formed by using a conductive film such as, a conductive polysilicon film, a metal silicide film, a metal film, or a metal compound film. In the present embodiment, the second scan line 32 is configured by a two-layer structure of a conductive polysilicon film and a tungsten silicide film. The conductive polysilicon film is formed by accumulating a polysilicon film in which phosphorous (P) is doped by using a low pressure CVD method, performing phosphorous diffusion processing, and containing phosphorous atoms in the polysilicon film in a concentration of $1×10^{19}/cm^3$ or higher. As described above, the second scan line 32 is patterned to overlap the channel region 30c of the semiconductor layer 30a in a planar view. In the present embodiment, it is hereinafter assumed that the conductive polysilicon film is conductive by doping the phosphorous atoms, as described above. The doped atoms are not limited to phosphorous (P).

Subsequently, a second interlayer insulating film 11b covering the second scan line 32 is formed. The second interlayer insulating film 11b is formed by using a silicon-based oxide film such as, the aforementioned NSG film, a phospho silicate glass (PSG) film containing phosphorous (P), a boro-silicate glass (BSG) film containing boron, or a boro-phospho silicate glass (BPSG) film containing boron (B) and phosphorous (P). A method of forming the silicon-based oxide film can include an atmospheric pressure CVD method which uses monosilane, 2 silane chloride, TEOS, tetraethyl boat rate (TEB), tetra-methyl-oxy voss rate (TMOP), or the like, a low pressure CVD method, a plasma CVD method, or the like. A thickness of the second interlayer insulating film 11b is, for example, 200 nm to 500 nm.

Subsequently, a first protection film 11c covering the second interlayer insulating film 11b is formed. The first protection film 11c is formed by using a silicon nitride film such that etching selectivity is obtained between the first protection film 11c and a second protection film 11d which will be formed in a stacked state hereinafter, in the present embodiment. A thickness of the first protection film 11c is, for example, 20 nm to 50 nm.

The pixel capacitor 16 is configured by stacking to form the three storage capacitors 16a, 16b, and 16c on the first protection film 11c. A detailed method of forming the pixel capacitor 16 will be described below, but the three storage capacitors 16a, 16b, and 16c are configured to include five capacitance electrodes 16d, 16f, 16h, 16k, and 16m. A third interlayer insulating film 11e and a third protection film 11f are formed between the third capacitance electrode 16h and the fourth capacitance electrode 16k. In addition, a fourth interlayer insulating film 12 which surrounds the three storage capacitors 16a, 16b, and 16c, that is, the pixel capacitor 16 is formed. The fourth interlayer insulating film 12 is formed by using a silicon-based oxide film such as, the NSG film, the PSG film, the BSG film, or the BPSG film in the same manner as the second interlayer insulating film 11b.

In the present embodiment, the three storage capacitors 16a, 16b, and 16c may be hereinafter referred to as a first storage capacitor 16a, a second storage capacitor 16b, and a third storage capacitor 16c in an order of being stacked on the base member 10s. In the same manner, the five capacitance electrodes 16d, 16f, 16h, 16k, and 16m may also be referred to as a first capacitance electrode 16d, a second capacitance electrode 16f, a third capacitance electrode 16h, a fourth capacitance electrode 16k, and a fifth capacitance electrode 16m.

The contact holes 61 and 62 for connecting the odd-numbered stacked capacitance electrode of the five capacitance electrodes 16d, 16f, 16h, 16k, and 16m, that is, the first capacitance electrode 16d, the third capacitance electrode 16h, and the fifth capacitance electrode 16m to the capacitance line 7, are formed in the fourth interlayer insulating film 12. In addition, the contact hole 63 which connects the fourth capacitance electrode 16k to the relay layer 6b is formed. As illustrated in FIG. 8, the second capacitance electrode 16f is formed such that an inner side of the contact hole 36 penetrating the gate insulating film 11g and the second interlayer insulating film 11b is coated with the second capacitance electrode, and is connected to the drain region 30d of the semiconductor layer 30a. In addition, in the same manner, the fourth capacitance electrode 16k is also formed such that an inner side of the contact hole 37 penetrating the gate insulating film 11g and the second interlayer insulating film 11b is coated with the fourth capacitance electrode, and is connected to the drain region 30d of the semiconductor layer 30a. Hence, the second capacitance electrode 16f is electrically connected to the fourth capacitance electrode 16k through the drain region 30d.

As illustrated in FIG. 9, the data line 6a and the relay layers 6b and 6c are formed on the fourth interlayer insulating film 12. The data line 6a and the relay layers 6b and 6c are formed by using a conductive film with low resistance such as, an aluminum alloy film or a stack film having an aluminum film and a titanium nitride film which are stacked. The relay layer 6c is connected to the contact holes 61 and 62. The third capacitance electrode 16h is electrically connected to the fifth capacitance electrode 16m by the contact hole 62 that is used as a common contact hole. The contact hole 61 is electrically connected to the first capacitance electrode 16d. Hence, the first capacitance electrode 16d is electrically connected to the third capacitance electrode 16h and the fifth capacitance electrode 16m.

A fifth interlayer insulating film 13 covering the data line 6a and the relay layers 6b and 6c is formed. The fifth interlayer insulating film 13 is also formed by using a silicon-based oxide film such as, the NSG film, the PSG film, the BSG film, or the BPSG film in the same manner as the second interlayer insulating film 11b. A surface of the formed fifth interlayer insulating film 13 is affected by the wiring layer of the lower layer and thereby roughness is generated. Accordingly, planarization processing such as CMP processing is performed such that the roughness does not affect the pixel electrode 15 which is formed thereafter.

The contact hole 71 reaching the relay layer 6c and the contact hole 72 reaching the relay layer 6b are formed in the planarized fifth interlayer insulating film 13. The capacitance line 7 and the relay layer 7c are formed on the fifth interlayer insulating film 13. The capacitance line 7 and the relay layer 7c are also formed by using a conductive film with low resistance in the same manner as the data line 6a.

A sixth interlayer insulating film 14 covering the capacitance line 7 and the relay layer 7c is formed. The sixth interlayer insulating film 14 is also formed by using a silicon-based oxide film such as, the NSG film, the PSG film, the BSG film, or the BPSG film in the same manner as the second interlayer insulating film 11b. The contact hole 81 reaching the relay layer 7c is formed in the sixth interlayer insulating film 14. The pixel electrode 15 is formed on the sixth interlayer insulating film 14 by using a transparent conductive film such as an ITO film. The pixel electrode 15 is connected to the relay layer 7c through the contact hole 81.

Method of Manufacturing Electro-Optical Device

Next, a method of forming the pixel capacitor 16 according to a method of manufacturing an electro-optical device according to the present embodiment will be described in detail with reference to FIG. 10 to FIG. 31.

The method of forming the pixel capacitor 16 according to the present embodiment includes a step of forming the first capacitance electrode 16d, a step of forming a first electrode film in the first capacitance electrode 16d through a first dielectric film, a step of forming a second electrode film in the first electrode film through a second dielectric film, a step of forming the second capacitance electrode 16f and the third capacitance electrode 16h by collectively patterning the first electrode film, the second dielectric film, and the second electrode film, a step of forming the fourth capacitance electrode 16k on an upper layer of the third capacitance electrode 16h, a step of forming the fifth capacitance electrode 16m in the fourth capacitance electrode 16k through a third dielectric film, and a step of forming the contact hole 62 which is a common contact hole for electrically connecting the third capacitance electrode 16h and the fifth capacitance electrode 16m to the capacitance line 7. Hereinafter, description will be made with reference to figures corresponding to each step. A method of patterning the capacitance electrode, the dielectric film, the protection film, or the like to a predetermined shape is performed by using a photolithography method.

Step of Forming First Capacitance Electrode

Figure 10:
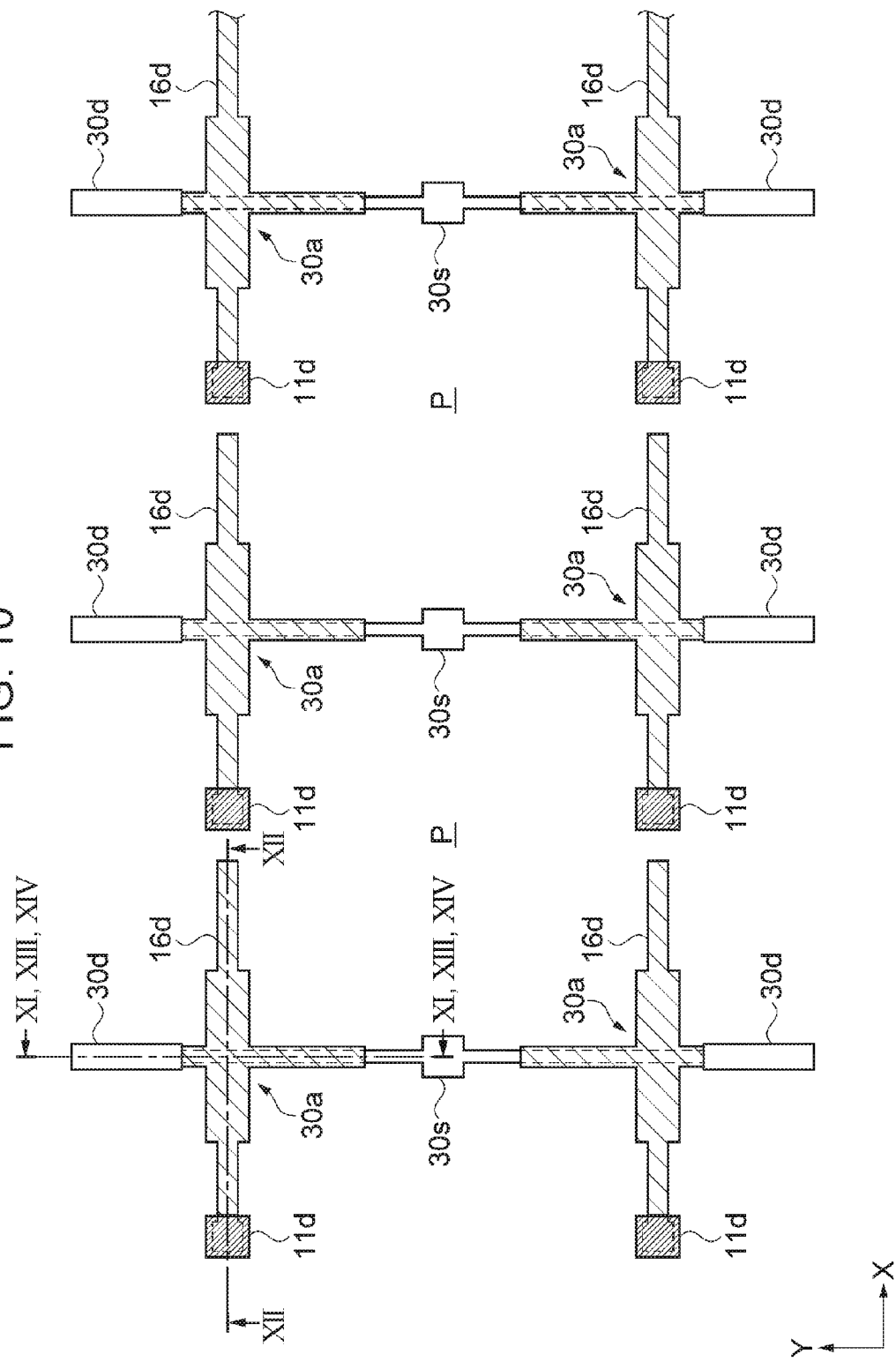
FIG. 10 is a schematic plan view illustrating a method of forming a first capacitance electrode.
Figure 11:
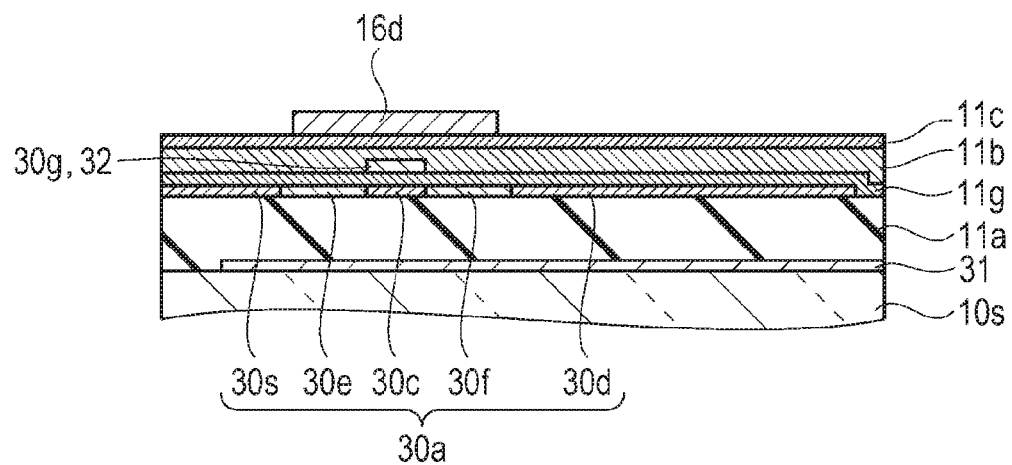
FIG. 11 is a schematic sectional view illustrating the method of forming the first capacitance electrode taken along the line XI-XI of FIG. 10.
Figure 12:
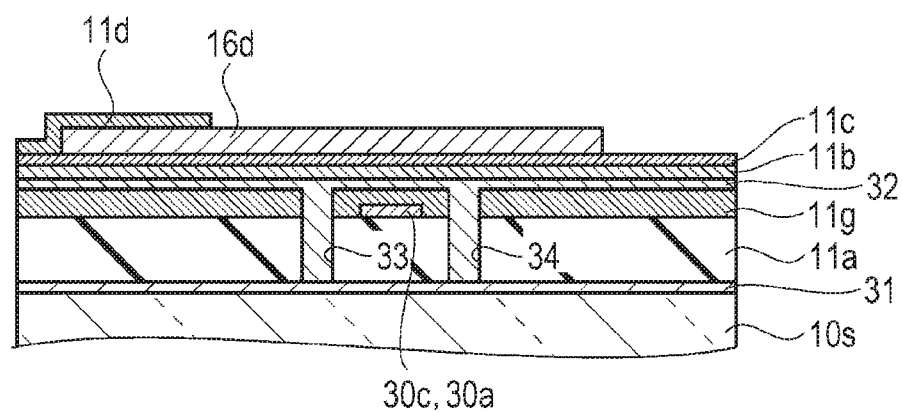
FIG. 12 is a schematic sectional view illustrating the method of forming the first capacitance electrode taken along the line XII-XII of FIG. 10.

FIG. 10 is a schematic plan view illustrating a method of forming the first capacitance electrode. FIG. 11 is a schematic sectional view illustrating the method of forming the first capacitance electrode taken along the line XI-XI of FIG. 10. FIG. 12 is a schematic sectional view illustrating the method of forming the first capacitance electrode taken along the line XII-XII of FIG. 10.

As illustrated in FIG. 10, the first capacitance electrode 16d is formed in a cross shape so as to overlap the semiconductor layer 30a in a planar view, corresponding to the intersection (refer to FIG. 4) of the non-opening region illustrated in the previous figure. The first capacitance electrode 16d includes a first portion extending in the Y direction and a second portion which intersects with the first portion and extends in the X direction. As illustrated in FIG. 11, the first portion is formed to overlap the channel region 30c of the semiconductor layer 30a and the bond regions 30e and 30f having the channel region 30c interposed therebetween in a planar view. As illustrated in FIG. 12, the second protection film 11d is formed in an island shape so as to cover one end portion (a left end portion in FIG. 10) of the first capacitance electrode 16d (second portion) extending in the X direction along the line XII-XII. The contact hole 61 is formed in a portion covering the second protection film 11d thereafter.

The first capacitance electrode 16d can be formed by using a conductive film such as, a conductive polysilicon film, a metal silicide film, a metal film, or a metal compound film. In the present embodiment, the first capacitance electrode 16d with a thickness of, for example, 200 nm to 500 nm is formed by using the aforementioned conductive polysilicon film. The first capacitance electrode 16d is formed more thickly than a thickness of the first dielectric film 16e (refer to FIG. 13) covering the first capacitance electrode 16d and the second protection film 11d thereafter.

The second protection film 11d can be formed by using the silicon-based oxide film such as, the NSG film, the PSG film, the BSG film, or the BPSG film. In the present embodiment, the second protection film 11d with a thickness of, for example, 100 nm to 300 nm is formed by using the NSG film.

Step of Forming Second Capacitance Electrode and Third Capacitance Electrode

Figure 13:
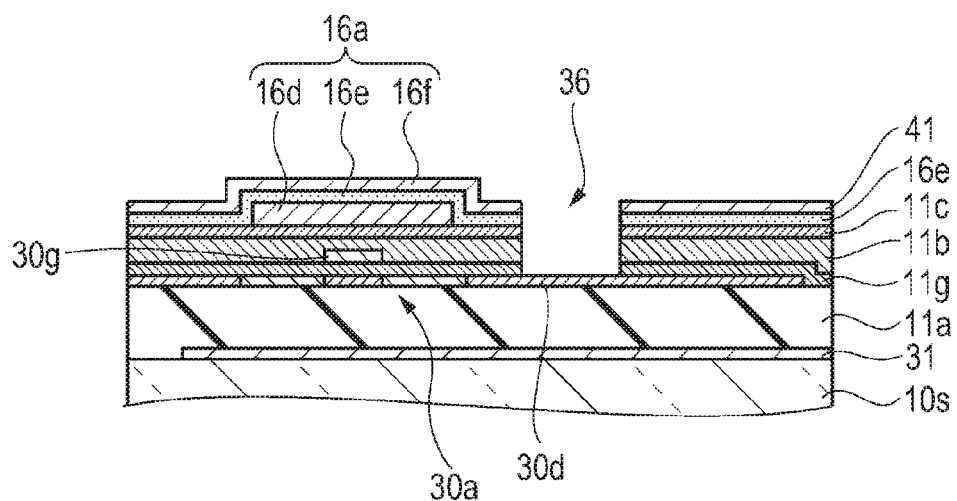
FIG. 13 is a schematic sectional view illustrating a method of forming a first dielectric film and a first electrode film taken along the line XIII-XIII.
Figure 14:
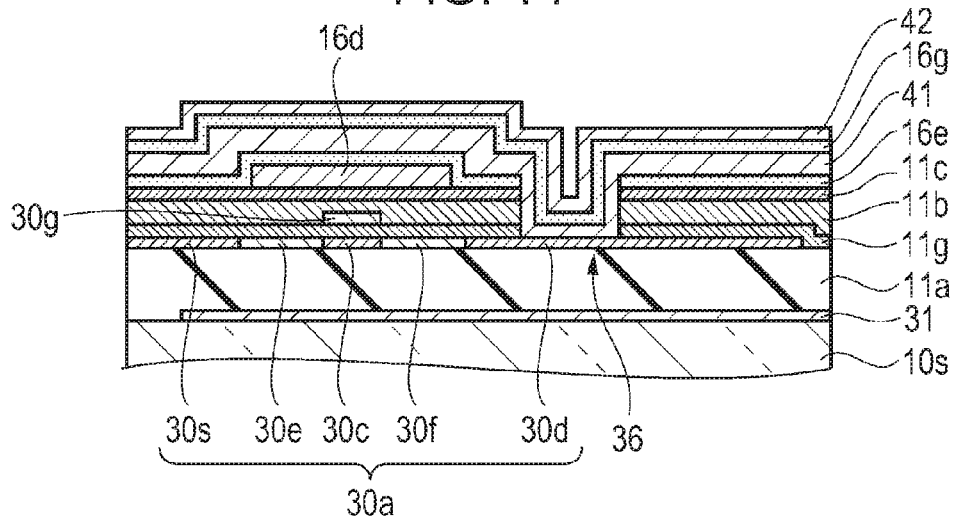
FIG. 14 is a schematic sectional view illustrating a method of forming a second dielectric film and a second electrode film taken along the line XIV-XIV.

FIG. 13 is a schematic sectional view illustrating a method of forming the first dielectric film and the first electrode film taken along the line XIII-XIII. FIG. 14 is a schematic sectional view illustrating a method of forming the second dielectric film and the second electrode film taken along the line XIV-XIV.

As illustrated in FIG. 13, the first dielectric film 16e is first formed to cover the first capacitance electrode 16d, and subsequently, a first electrode film 41 is formed so as to be stacked on the first dielectric film 16e. The first dielectric film 16e can be formed by using a silicon compound material such as a silicon oxide film or a silicon nitride film. In addition, the first dielectric film may be formed by using a dielectric film with high permittivity, such as, an aluminum oxide film, a titanium oxide film, a tantalum oxide film, a niobium oxide film, a hafnium oxide film, a lanthanum oxide film, or a zirconium oxide film. Furthermore, the first dielectric film 16e may be formed by selecting any one of the dielectric films and stacking. A method of forming the dielectric film can include the atmospheric pressure CVD method, the low pressure CVD method, the plasma CVD method, a deposition method, a sputtering method, or the like.

In the present embodiment, the first dielectric film 16e with a thickness of, for example, 10 nm to 30 nm is formed by stacking the silicon oxide film and the silicon nitride film. Since the silicon oxide film has higher insulation properties than the silicon oxide film, the silicon oxide film is first formed and then the silicon nitride film is stacked thereon. A thickness of the first dielectric film 16e is thinner than a thickness of the first capacitance electrode 16d. The first dielectric film 16e may be formed by stacking the silicon oxide films having the silicon nitride film interposed therebetween.

The first electrode film 41 can be formed by using a conductive film such as, a conductive polysilicon film, a metal silicide film, a metal, or a metal compound material. In the present embodiment, the first electrode film 41 with a thickness of, for example, 20 nm to 50 nm is formed by using the conductive polysilicon film.

After the first electrode film 41 is formed, the contact hole 36 which reaches the drain region 30d of the semiconductor layer 30a by penetrating the first electrode film 41, the first dielectric film 16e, the first protection film 11c, the second interlayer insulating film 11b, and the gate insulating film 11g is formed by dry-etching. In addition, as illustrated in FIG. 14, a conductive polysilicon film is again formed such that an inner side of the contact hole 36 is coated with the conductive polysilicon film. Accordingly, a thickness of the first electrode film 41 of a portion facing the first capacitance electrode 16d through the first dielectric film 16e is increased, and is, for example, 120 nm to 150 nm. Subsequently, a second dielectric film 16g and a second electrode film 42 are sequentially stacked on the first electrode film 41.

The second dielectric film 16g can have the same film configuration as the first dielectric film 16e, and in the present embodiment, the second dielectric film 16g with a thickness of, for example, 10 nm to 30 nm is formed by stacking the silicon oxide film and the silicon nitride film.

The second electrode film 42 has the same film configuration as the first electrode film 41, and in the present embodiment, the second electrode film 42 with a thickness of, for example, 50 nm to 100 nm is formed by using the conductive polysilicon film.

Figure 15:
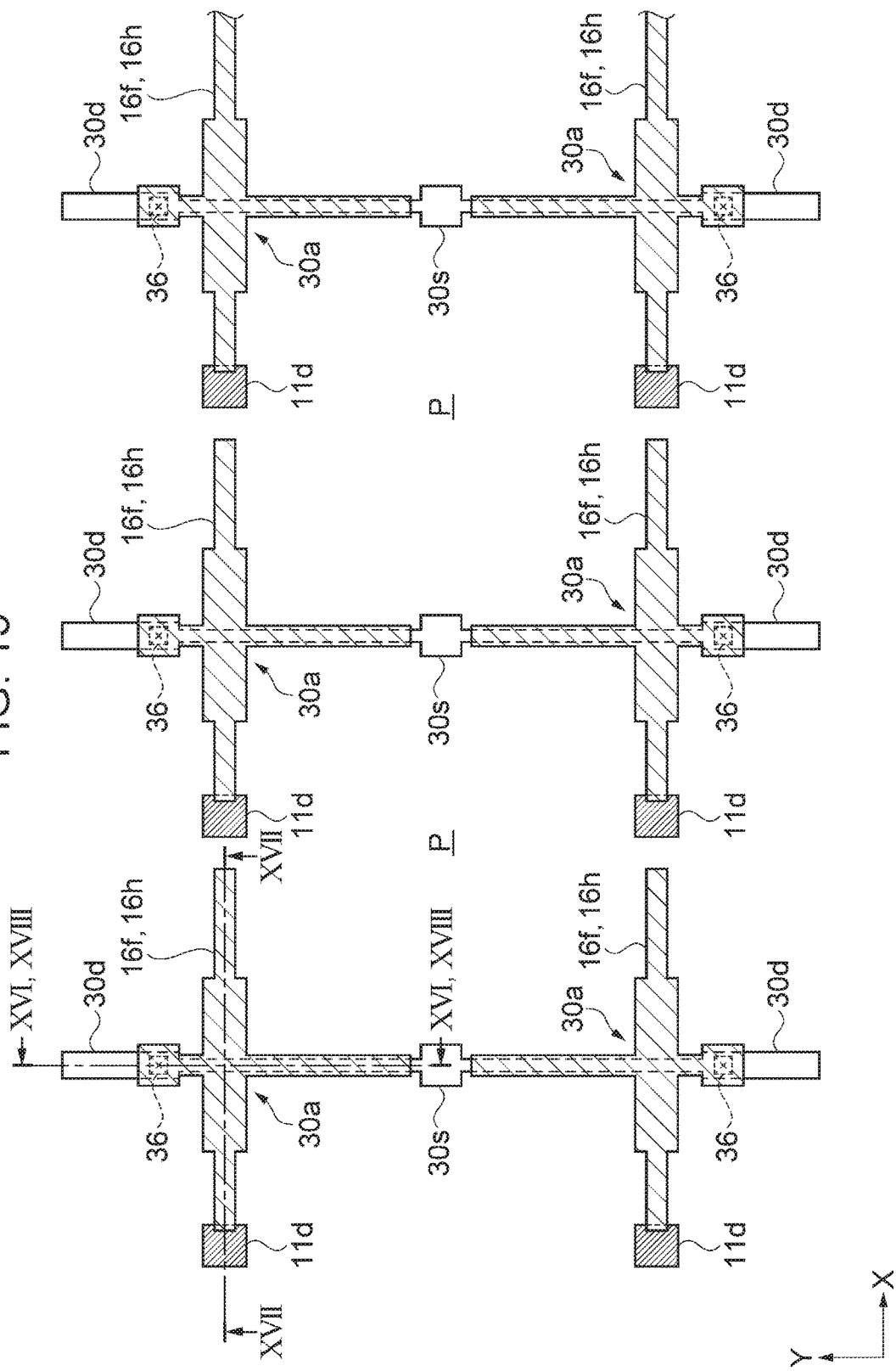
FIG. 15 is a schematic plan view illustrating a method of forming a second capacitance electrode and a third capacitance electrode.
Figure 16:
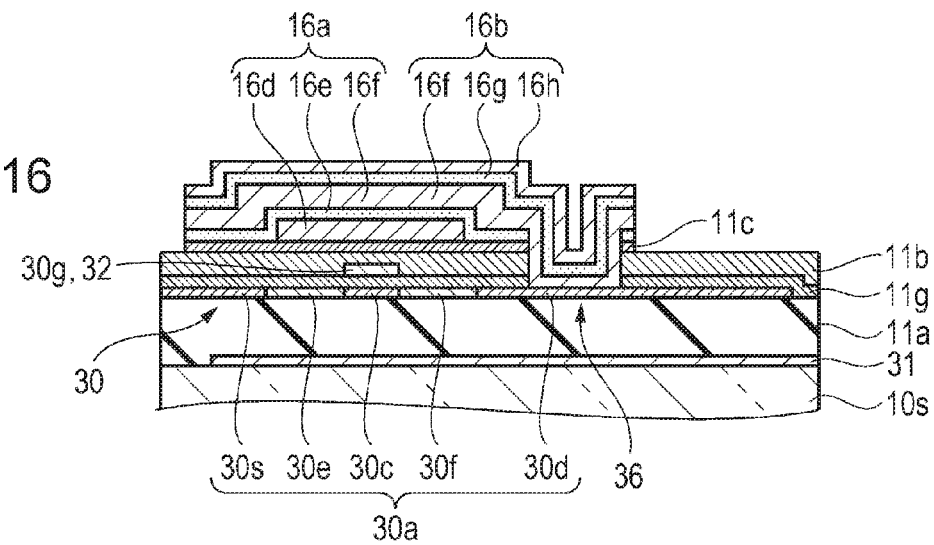
FIG. 16 is a schematic sectional view illustrating the method of forming the second capacitance electrode and the third capacitance electrode taken along the line XVI-XVI.
Figure 17:
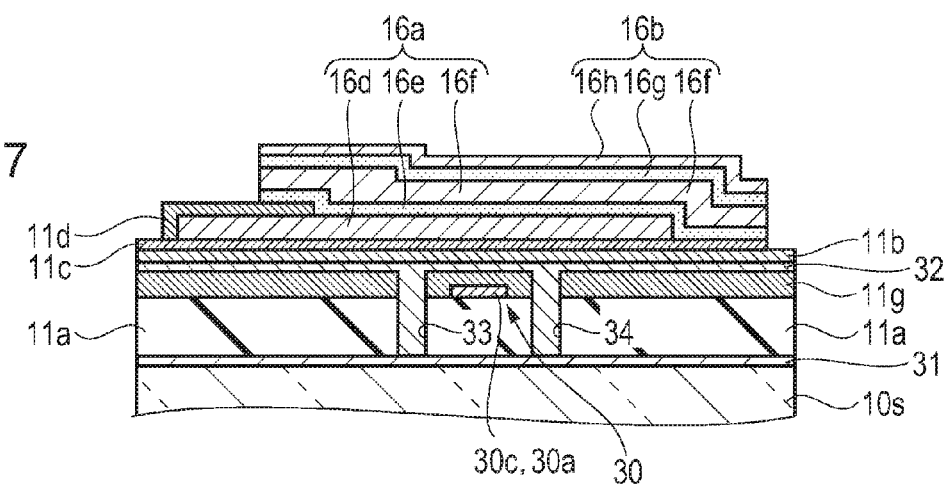
FIG. 17 is a schematic sectional view illustrating the method of forming the second capacitance electrode and the third capacitance electrode taken along the line XVII-XVII.

FIG. 15 is a schematic plan view illustrating a method of forming the second capacitance electrode and the third capacitance electrode, FIG. 16 is a schematic sectional view illustrating the method of forming the second capacitance electrode and the third capacitance electrode taken along the line XVI-XVI, and FIG. 17 is a schematic sectional view illustrating the method of forming the second capacitance electrode and the third capacitance electrode taken along the line XVII-XVII.

As illustrated in FIG. 15, the second capacitance electrode 16f and the third capacitance electrode 16h are also formed in a cross shape so as to overlap the semiconductor layer 30a in a planar view, at the intersection (refer to FIG. 4) of the non-opening region illustrated in the previous figure. The second capacitance electrode and the third capacitance electrode are different from a shape of the first capacitance electrode 16d in that one end portion (a left end portion in the figure) extending in the X direction is in a state of partially overlapping a region where the second protection film 11d is provided. In addition, one end portion (an upper end portion in the figure) of a portion extending in the Y direction overlaps the contact hole 36 in a planar view. Furthermore, external shapes of the second capacitance electrode 16f and the third capacitance electrode 16h are the same as each other, and end portions thereof are aligned.

In a method of forming the second capacitance electrode 16f and the third capacitance electrode 16h, the first electrode film 41, the second dielectric film 16g, and the second electrode film 42 which are illustrated in FIG. 14 are collectively patterned by dry-etching, and the second capacitance electrode 16f and the third capacitance electrode 16h whose end portions are aligned are formed as illustrated in FIG. 16 and FIG. 17. At this time, the first protection film 11c is formed by using a silicon nitride film, thereby functioning as an etching control film. As illustrated in FIG. 16, the second capacitance electrode 16f and the third capacitance electrode 16h are patterned to be disposed in a region including the first capacitance electrode 16d and the contact hole 36, in the Y direction along the line XVI-XVI. In addition, as illustrated in FIG. 17, the second capacitance electrode 16f and the third capacitance electrode 16h are patterned such that an end portion on one side in the X direction along the line XVII-XVII rides on the second protection film 11d, and an end portion on the other side exceeds an end portion of the first capacitance electrode 16d.

In the steps up to this point, the first storage capacitor 16a configured by the first capacitance electrode 16d and the second capacitance electrode 16f which have the first dielectric film 16e interposer therebetween and which face each other, and the second storage capacitor 16b configured by the second capacitance electrode 16f and the third capacitance electrode 16h which have the second dielectric film 16g interposed therebetween and which face each other, are formed so as to be stacked. Since a thickness of the first capacitance electrode 16d is greater than a thickness of the first dielectric film 16e, an area in which the first capacitance electrode 16d and the second capacitance electrode 16f actually face is increased, compared to a case where a thickness of the first capacitance electrode is equal to or less than that of the first dielectric film 16e, and thus, the first storage capacitor 16a having an increased capacitance value is formed. The first capacitance electrode 16d is an example of a lower capacitance electrode according to the invention, and the second capacitance electrode 16f is an example of an upper capacitance electrode according to the invention.

In addition, the second storage capacitor 16b is tridimensionally formed up to the inside of the contact hole 36. That is, the second storage capacitor 16b whose capacitance value is increased compared to a case where the second capacitance electrode 16f and the third capacitance electrode 16h are disposed in a flat surface through the second dielectric film 16g, is formed.

Figure 18:
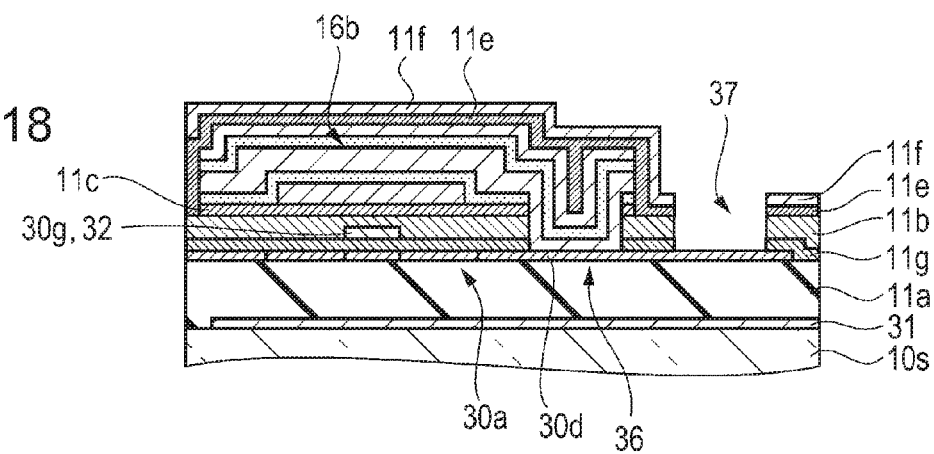
FIG. 18 is a schematic sectional view illustrating a method of forming a third interlayer insulating film and a third protection film taken along the line XVIII-XVIII.

FIG. 18 is a schematic sectional view illustrating a method of forming the third interlayer insulating film and the third protection film taken along the line XVIII-XVIII. As illustrated in FIG. 18, the third interlayer insulating film lie covering the second storage capacitor 16b is formed, and subsequently, the third protection film 11f is formed to be stacked on the third interlayer insulating film lie. The third interlayer insulating film lie can be formed by using the silicon-based oxide film such as, the NSG film, the PSG film, the BSG film, or the BPSG film in the same manner as the second interlayer insulating film 11b. In the present embodiment, the third interlayer insulating film lie with a thickness of, for example, 100 nm to 300 nm is formed by using the NSG film. Not only a surface of the second storage capacitor 16b but also end surfaces of the second storage capacitor 16b whose end portions are lined up are coated with the third interlayer insulating film lie. While not illustrated in FIG. 18, the third interlayer insulating film lie is an example of a dielectric film interposed between the capacitance electrodes according to the invention, and is formed over the display region E in which at least a plurality of the pixels P are disposed. As described above, since the third interlayer insulating film lie is formed by using the silicon-based oxide film, the third interlayer insulating film has approximately the same refractive index as the base member 10s compared to, for example, the silicon nitride film, and it is possible to realize high transmissivity in an opening of the pixel P. In addition, the third interlayer insulating film lie is formed to have a greater thickness than those of other dielectric films. Accordingly, it is possible to increase an actual area affecting a capacitance value of the fourth capacitance electrode 16k which is formed in a region including a rough portion of a surface of the third interlayer insulating film lie.

The third protection film 11f is formed by using a silicon nitride film which obtains selectivity with respect to a silicon-based oxide in dry-etching. A method of forming the third protection film 11f can include an atmospheric pressure CVD method which uses monosilane, 2 silane chloride, ammonia, or nitrogen as a processing gas, a low pressure CVD method, or a plasma CVD method. A thickness of the third protection film 11f is, for example, 20 nm to 50 nm. Hereafter, the third protection film 11f functions as an etching control film of the fourth capacitance electrode 16k and the fourth protection film 11h which are formed on the third protection film 11f.

Subsequently, the contact hole 37 reaching the drain region 30d of the semiconductor layer 30a by penetrating the third protection film 11f, the third interlayer insulating film lie, the second interlayer insulating film 11b, and the gate insulating film 11g is formed by dry-etching. FIG. 18 illustrates a structure of a wiring layer in which the contact hole 37 is formed.

Step of Forming Fourth Capacitance Electrode

Figure 19:
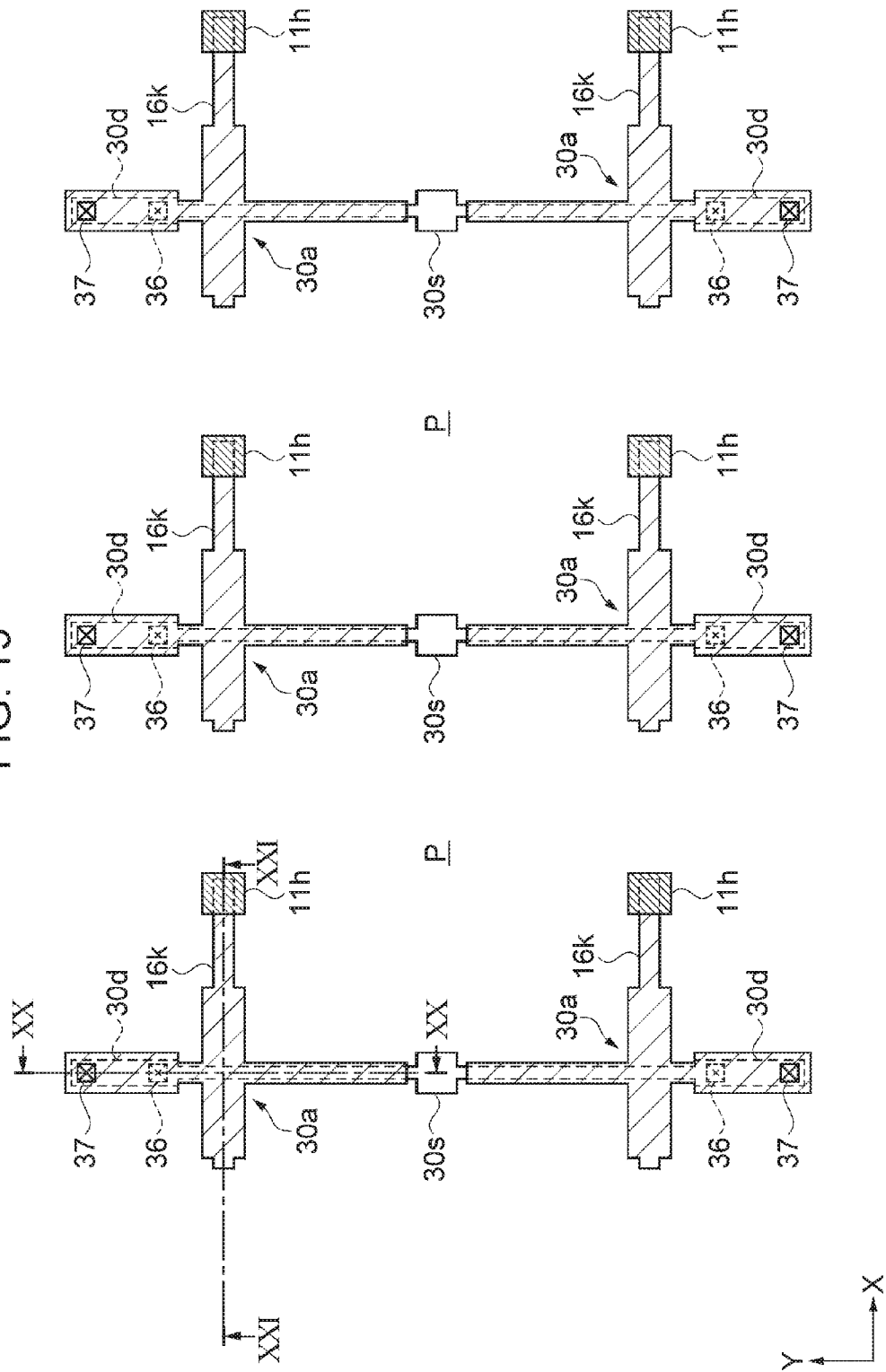
FIG. 19 is a schematic plan view illustrating a method of forming a fourth capacitance electrode and a fourth protection film.
Figure 20:
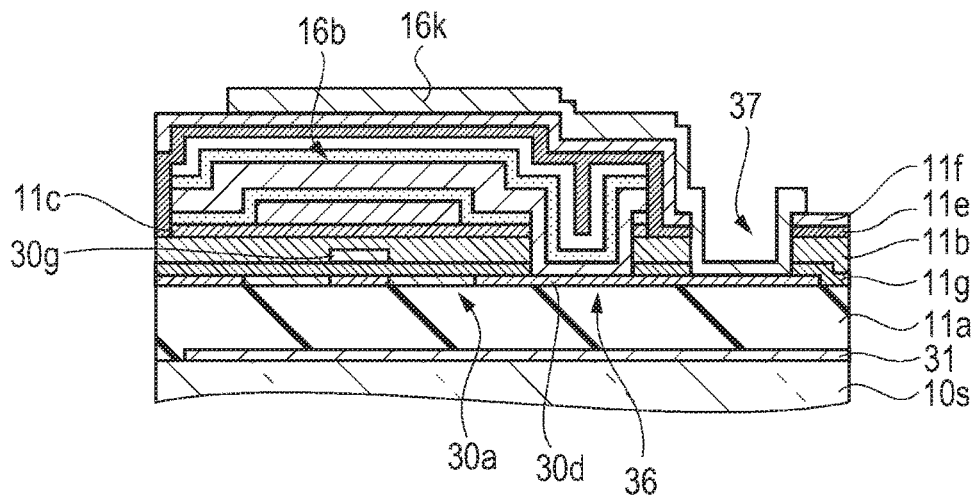
FIG. 20 is a schematic sectional view illustrating the method of forming the fourth capacitance electrode taken along the line XX-XX.
Figure 21:
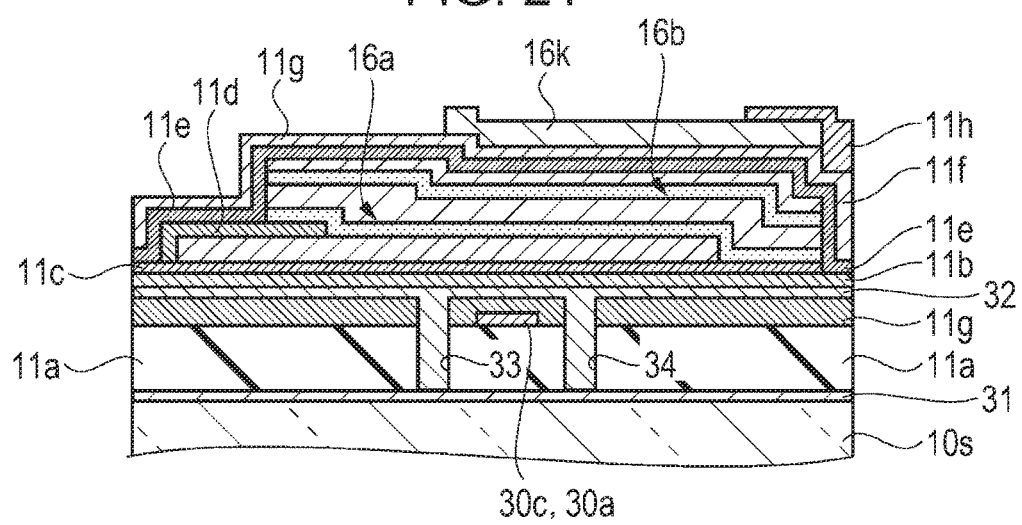
FIG. 21 is a schematic sectional view illustrating the method of forming the fourth capacitance electrode and the fourth protection film taken along the line XXI-XXI.

FIG. 19 is a schematic plan view illustrating a method of forming the fourth capacitance electrode and the fourth protection film. FIG. 20 is a schematic sectional view illustrating the method of forming the fourth capacitance electrode taken along the line XX-XX. FIG. 21 is a schematic sectional view illustrating the method of forming the fourth capacitance electrode and the fourth protection film taken along the line XXI-XXI.

As illustrated in FIG. 19, the fourth capacitance electrode 16k is also formed in a cross shape so as to overlap the semiconductor layer 30a in a planar view, at the intersection (refer to FIG. 4) of the non-opening region illustrated in the previous figure. The fourth capacitance electrode 16k is different from a shape of the second capacitance electrode 16f (the third capacitance electrode 16h) in that a length of a portion protruding on the left side in the X direction from an intersection in the figure is small, and an end portion of a portion protruding on the right side in the X direction from the intersection is covered with the fourth protection film 11h formed in an island shape. Thereafter, a contact hole 63 (refer to FIG. 25) is formed in a portion covered with the fourth protection film 11h. In addition, one end portion (upper end portion in the figure) in the Y direction extends to a position which overlaps the contact hole 37 in a planar view. The other end portion (lower end portion in the figure) of a portion extending in the Y direction is located at the front of a portion in which the source region 30s is expanded, in the same manner as the second capacitance electrode 16f (the third capacitance electrode 16h).

The fourth capacitance electrode 16k can have the same film configuration as the second capacitance electrode 16f (the third capacitance electrode 16h), and in the present embodiment, the fourth capacitance electrode 16k with a thickness of, for example, 200 nm to 500 nm is formed by using a conductive polysilicon film. The fourth capacitance electrode 16k is formed such that an inner side of the contact hole 37 reaching the drain region 30d is coated with the fourth capacitance electrode, as illustrated in FIG. 20. In addition, as illustrated in FIG. 21, the fourth protection film 11h is formed to overlap an end portion on the right side in the X direction along the line XXI-XXI of the fourth capacitance electrode 16k. The fourth protection film 11h can have the same film configuration as the second protection film 11d, and in the present embodiment, the fourth protection film 11h with a thickness of 100 nm to 300 nm is formed by using the NSG film.

Step of Forming Fifth Capacitance Electrode

Figure 22:
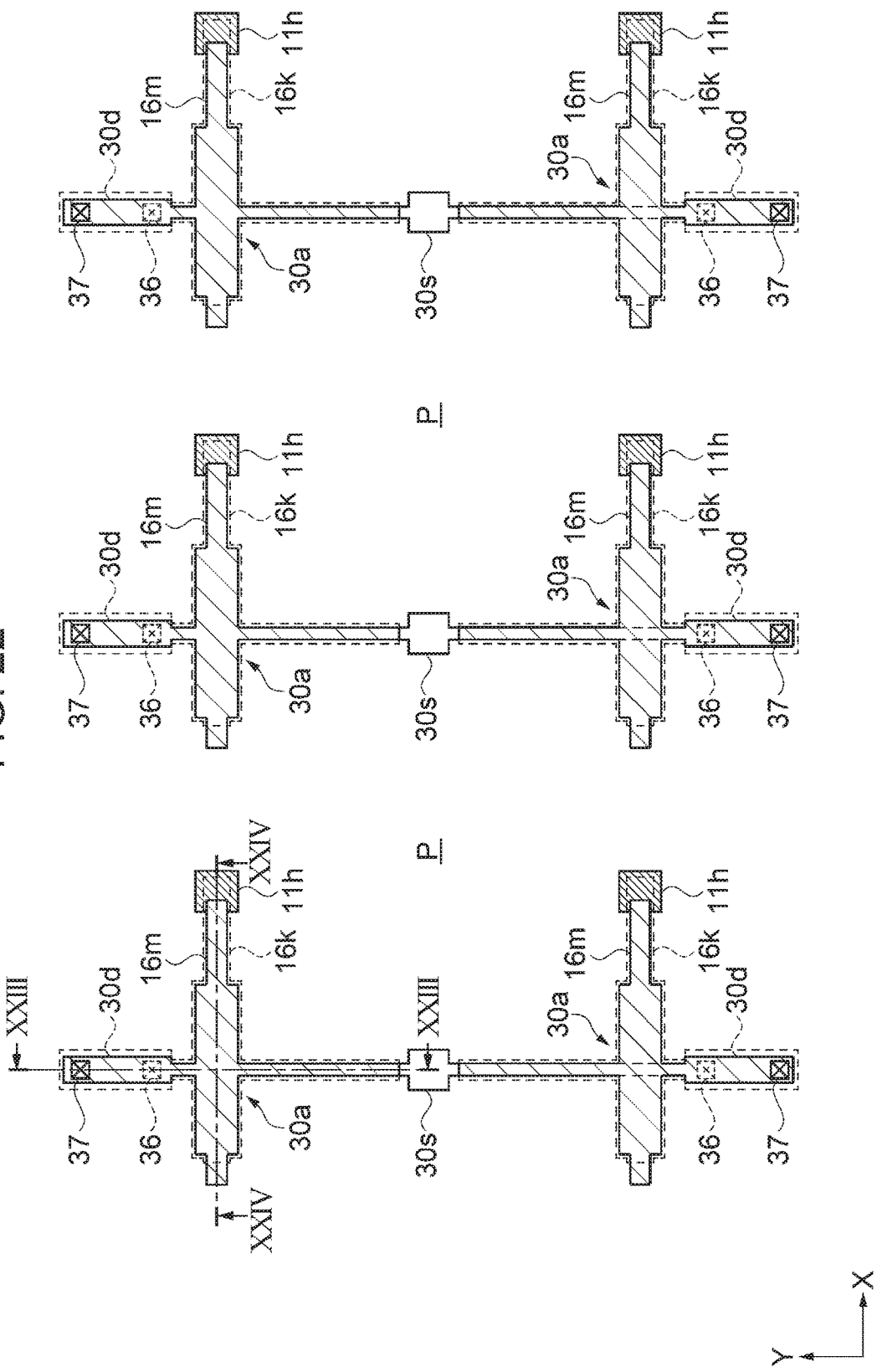
FIG. 22 is a schematic plan view illustrating a method of forming a fifth capacitance electrode.
Figure 23:
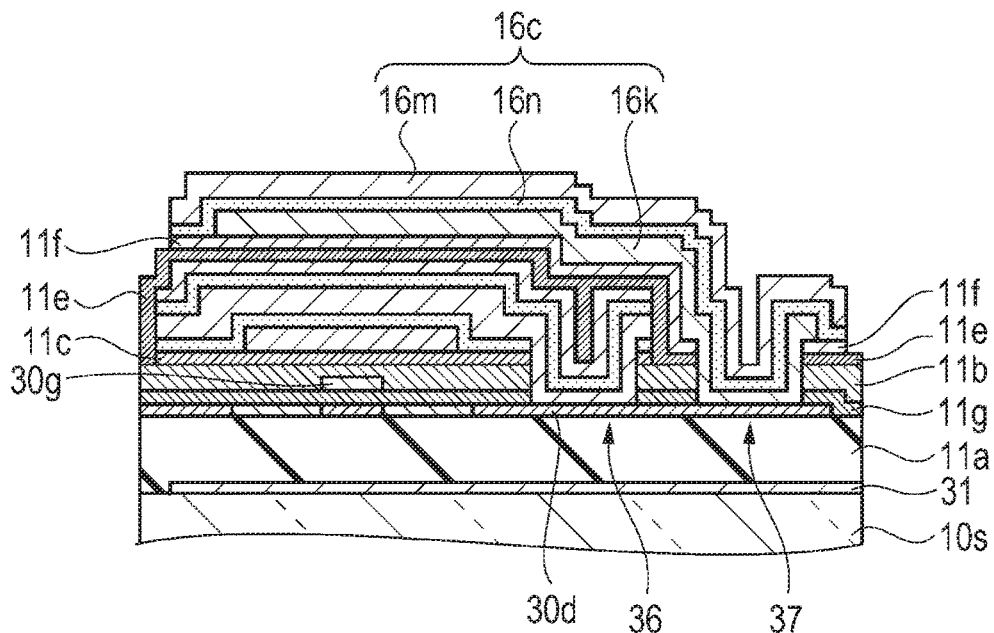
FIG. 23 is a schematic sectional view illustrating a method of forming a third dielectric film and the fifth capacitance electrode taken along the line XXIII-XXIII.
Figure 24:
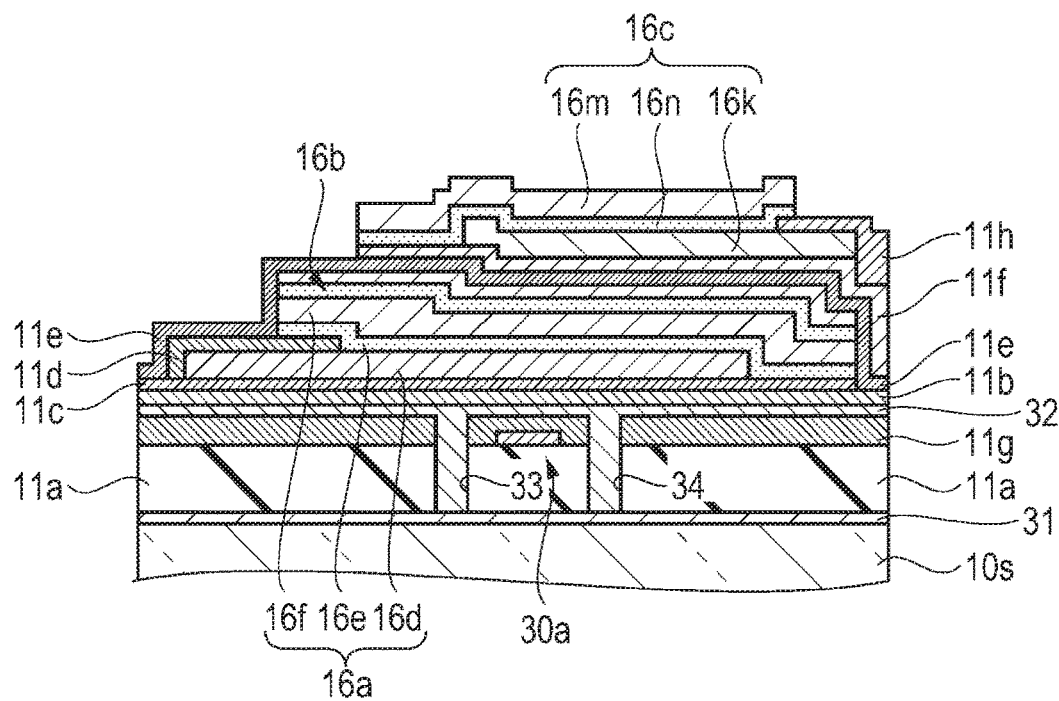
FIG. 24 is a schematic sectional view illustrating the method of forming the third dielectric film and the fifth capacitance electrode taken along the line XXIV-XXIV.

FIG. 22 is a schematic plan view illustrating a method of forming the fifth capacitance electrode. FIG. 23 is a schematic sectional view illustrating a method of forming the third dielectric film and the fifth capacitance electrode taken along the line XXIII-XXIII. FIG. 24 is a schematic sectional view illustrating the method of forming the third dielectric film and the fifth capacitance electrode taken along the line XXIV-XXIV.

As illustrated in FIG. 22, the fifth capacitance electrode 16m is also formed in a cross shape so as to overlap the semiconductor layer 30a in a planar view, at the intersection (refer to FIG. 4) of the non-opening region illustrated in the previous figure. In addition, the fifth capacitance electrode 16m is formed to face the fourth capacitance electrode 16k. One end portion (upper end portion in the figure) of a portion extending in the Y direction of the fifth capacitance electrode 16m extends to a position which overlaps the contact hole 37 in a planar view. The other end portion (lower end portion in the figure) of a portion extending in the Y direction of the fifth capacitance electrode 16m is located at the front of a portion in which the source region 30s is expanded. The fifth capacitance electrode is different from the fourth capacitance electrode 16k in that a length of a portion protruding on the left side in the X direction from an intersection of the fifth capacitance electrode 16m is great. In addition, a length of a portion protruding on the right side in the X direction from the intersection of the fifth capacitance electrode 16m is small, and an end portion thereof slightly extends over the fourth protection film 11h.

A third dielectric film 16n can have the same film configuration as the second dielectric film 16g. In the present embodiment, the third dielectric film 16n with a thickness of, for example, 10 nm to 30 nm is formed by stacking a silicon oxide film and a silicon nitride film. In addition, as illustrated in FIG. 23, the third dielectric film 16n is formed to cover a surface including an end surface of the fourth capacitance electrode 16k which coats an inner side of the contact hole 37. In addition, as illustrated in FIG. 24, the third dielectric film 16n is formed in a state where an end portion thereof rides on the fourth protection film 11h.

The fifth capacitance electrode 16m can be formed by using a conductive film such as, a conductive polysilicon film, a metal silicide film, a metal film, or a metal compound film. In the present embodiment, the fifth capacitance electrode 16m of the five capacitance electrodes is located at an uppermost layer, and thus, the fifth capacitance electrode 16m with a thickness of, for example, 100 nm to 300 nm is formed by using a tungsten silicide film (WSi film) by taking into account light shielding properties of light which is incident from the counter substrate 20 side. In addition, as illustrated in FIG. 23, the fifth capacitance electrode 16m is formed to cover the third dielectric film 16n in the contact hole 37. In addition, as illustrated in FIG. 24, the fifth capacitance electrode 16m is formed in a state where an end portion thereof rides on the fourth protection film 11h. A method of forming the third dielectric film 16n and the fifth capacitance electrode 16m can use a method of forming, for example, a silicon oxide film, a silicon nitride film, and a WSi film, collectively patterning the silicon oxide film, the silicon nitride film, and the WSi film, by using dry-etching, and thereby, forming the third dielectric film 16n and the fifth capacitance electrode 16m. Thereby, the third storage capacitor 16c which is configured by the fourth capacitance electrode 16k and the fifth capacitance electrode 16m that have the third dielectric film 16n interposed therebetween and face each other is formed on an upper layer of the second storage capacitor 16b. In addition, end portions of the third dielectric film 16n and end portions of the fifth capacitance electrode 16m are aligned. In the present embodiment, the third protection film 11f is also collectively patterned simultaneously with the third dielectric film 16n and the fifth capacitance electrode 16m. Hence, there is a portion (end portion on the left side in FIG. 24) in which an end portion of the third protection film 11f is aligned with an end portion of the third dielectric film 16n and the fifth capacitance electrode 16m.

If a thickness of, for example, the third dielectric film 16n, among the first dielectric film 16e, the second dielectric film 16g, and the third dielectric film 16n is greater than the other dielectric films, it is possible to increase an actual area affecting a capacitance value of the fifth capacitance electrode 16m which is formed on the third dielectric film 16n.

Step of Forming Contact Hole Relating to Capacitance Electrode

Figure 25:
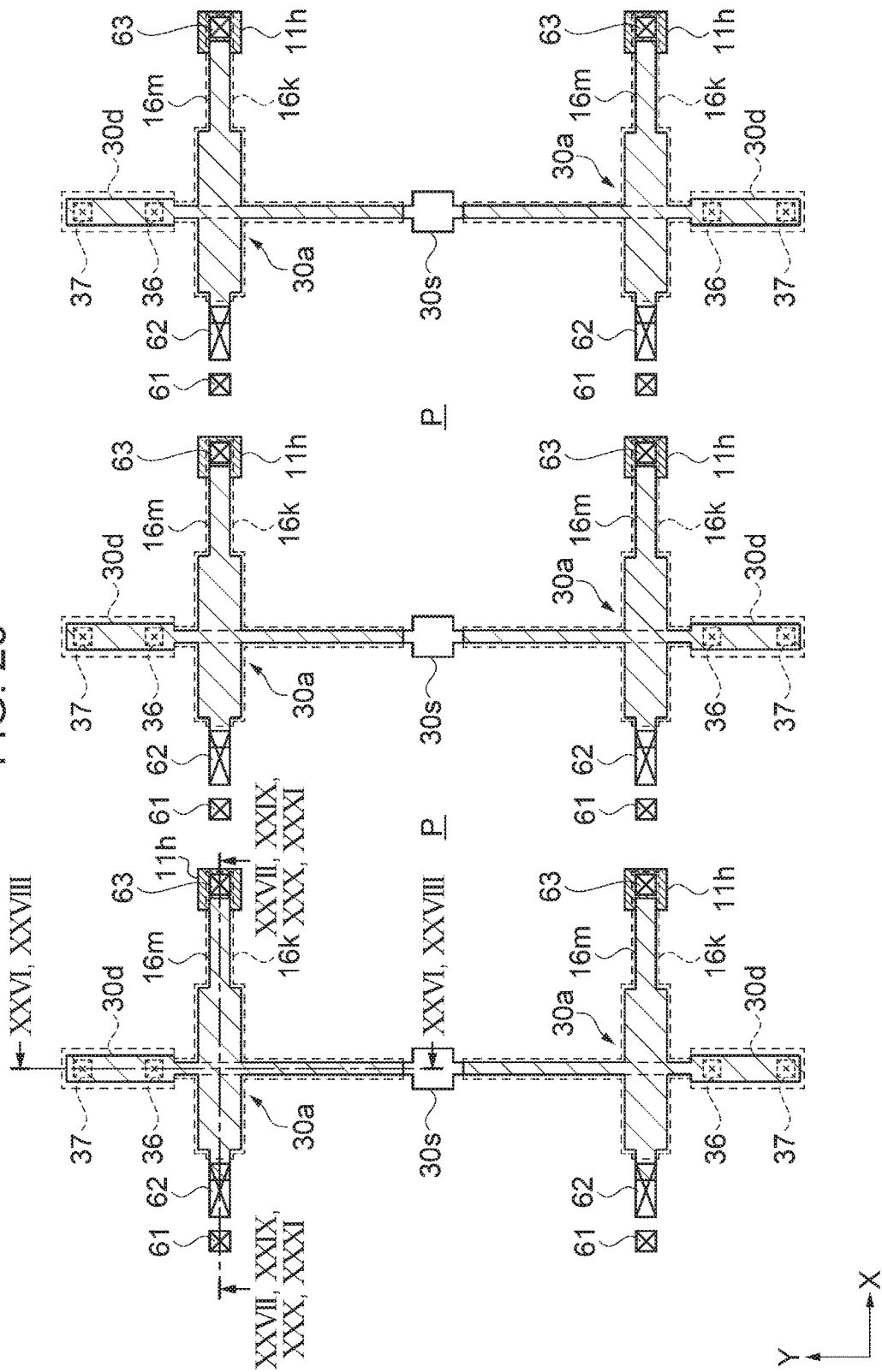
FIG. 25 is a schematic plan view illustrating a method of forming contact holes relating to the capacitance electrodes.
Figure 26:
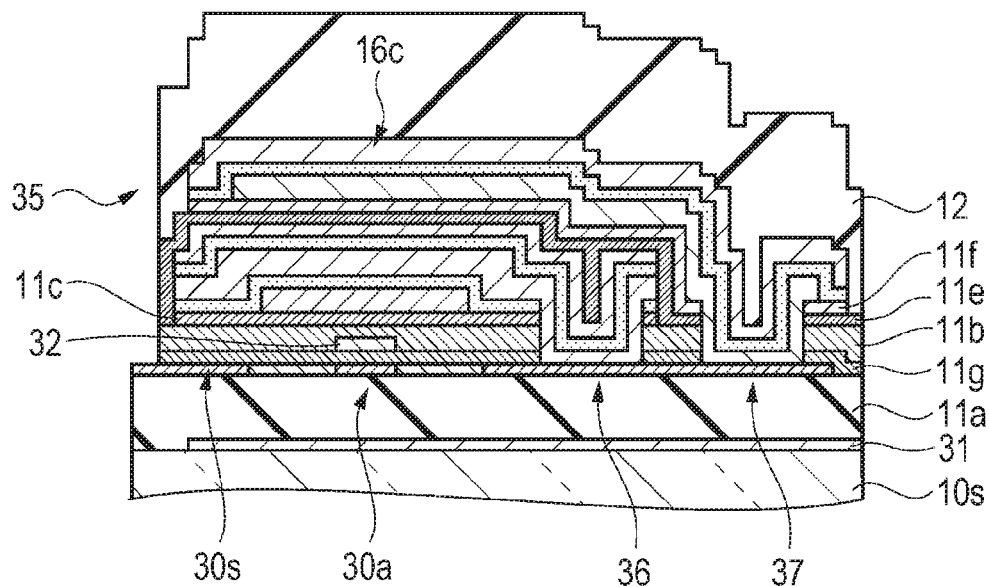
FIG. 26 is a schematic sectional view illustrating a method of forming a fourth interlayer insulating film taken along the line XXVI-XXVI.
Figure 27:
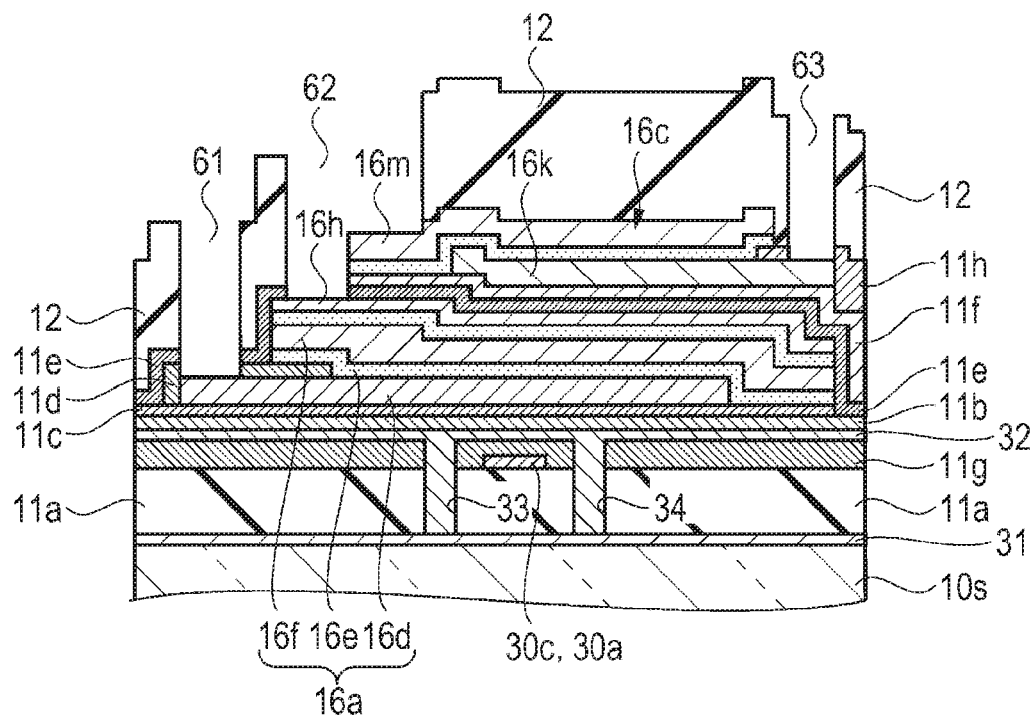
FIG. 27 is a schematic sectional view illustrating the method of forming the contact holes relating to the capacitance electrodes taken along the line XXVII-XXVII.

FIG. 25 is a schematic plan view illustrating a method of forming contact holes relating to the capacitance electrodes. FIG. 26 is a schematic sectional view illustrating a method of forming the fourth interlayer insulating film taken along the line XXVI-XXVI. FIG. 27 is a schematic sectional view illustrating the method of forming the contact holes relating to the capacitance electrodes taken along the line XXVII-XXVII.

As illustrated in FIG. 25, the three contact holes 61, 62, and 63 relating to a capacitance electrode stacked on the base member 10s of the element substrate 10 are formed in a position along the X direction from an intersection of the aforementioned non-opening region. Specifically, in the figure, the contact hole 62 is formed in a position overlapping an end portion on the left side in the X direction of the fifth capacitance electrode 16m, with respect to the fifth capacitance electrode 16m which is formed in a cross shape. In addition, the contact hole 63 is formed in a position overlapping the fourth protection film 11h in front of an end portion on the right side of the fifth capacitance electrode 16m in the X direction. The contact hole 61 is formed between the contact hole 62 in the X direction and the contact hole 63. The contact hole 62 is formed longer than other contact holes 61 and 63, in the X direction.

As illustrated in FIG. 26, the fourth interlayer insulating film 12 is formed to cover the third storage capacitor 16c. The fourth interlayer insulating film 12 can have the same film configuration as the third interlayer insulating film 11e. In the present embodiment, the fourth interlayer insulating film 12 with a thickness of, for example, 300 nm to 800 nm is formed by using the NSG film.

As illustrated in FIG. 26, the contact hole 35 reaching the source region 30s of the semiconductor layer 30a by penetrating the fourth interlayer insulating film 12, the third interlayer insulating film 11e, the second interlayer insulating film 11b, and the gate insulating film 11g is formed.

In addition, as illustrated in FIG. 27, the contact hole 61 reaching the first capacitance electrode 16d by penetrating the fourth interlayer insulating film 12, the third interlayer insulating film 11e, and the second protection film 11d is formed. In addition, the contact hole 62, which reaches the fifth capacitance electrode 16m by penetrating the fourth interlayer insulating film 12 and reaches the third capacitance electrode 16h by penetrating the fourth interlayer insulating film 12 and the third interlayer insulating film 11e, is formed. In addition, the contact hole 63 reaching the fourth capacitance electrode 16k by penetrating the fourth interlayer insulating film 12 and the fourth protection film 11h is formed.

The contact hole 35 and the contact holes 61, 62, and 63 are formed by dry-etching a silicon oxide film and a silicon nitride film. The contact hole 62 is dry-etched such that an end portion of the third capacitance electrode 16h and an end portion of the fifth capacitance electrode 16m are exposed, and an inner wall on one side in the X direction along the line XXVII-XXVII is formed in a stepwise manner.

If the contact hole 62 which is a common contact hole is formed by dry-etching, the fifth capacitance electrode 16m is formed such that, when the dry-etching is performed until the third capacitance electrode 16h is exposed, an end portion of the exposed fifth capacitance electrode 16m reliably remains in the inside of the contact hole 62 and a thickness of the fifth capacitance electrode 16m is greater than a thickness of the third capacitance electrode 16h. Alternatively, the respective capacitance electrodes are configured by different materials such that etching selectivity of the fifth capacitance electrode 16m with respect to the third capacitance electrode 16h is obtained.

Figure 28:
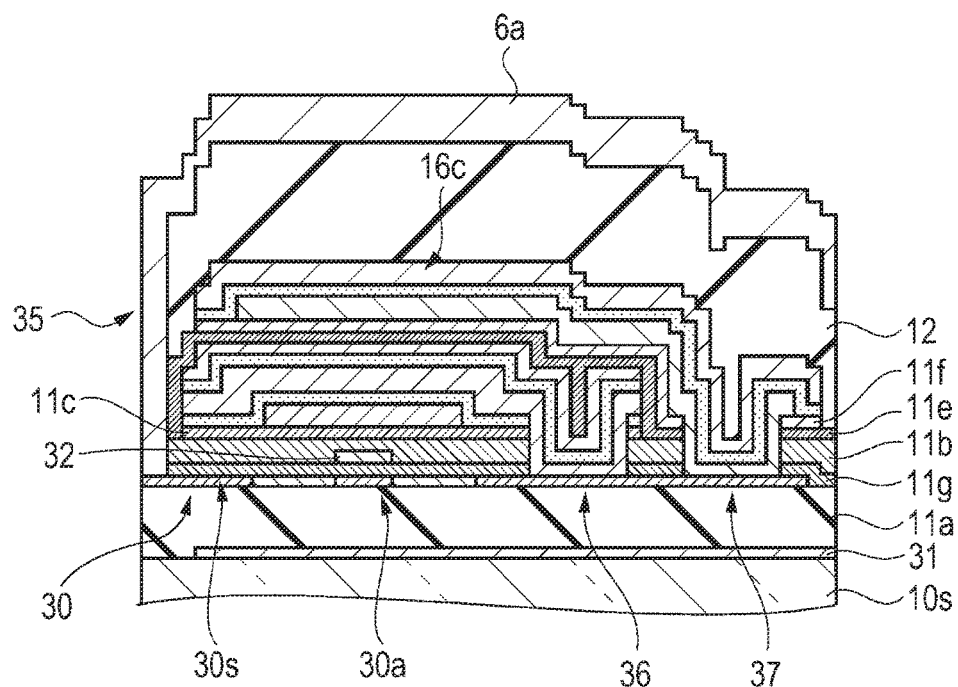
FIG. 28 is a schematic sectional view illustrating the method of forming the data lines taken along the line XXVIII-XXVIII.
Figure 29:
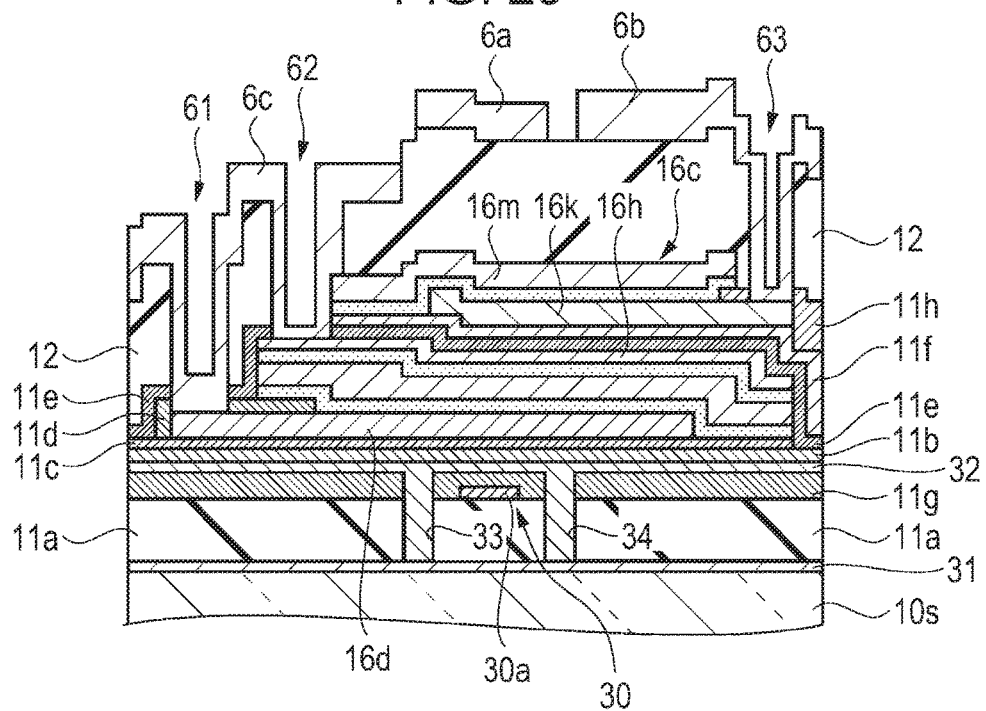
FIG. 29 is a schematic sectional view illustrating a method of forming the data lines and a relay layer taken along the line XXIX-XXIX.

FIG. 28 is a schematic sectional view illustrating the method of forming the data lines taken along the line XXVIII-XXVIII. FIG. 29 is a schematic sectional view illustrating a method of forming the data lines and a relay layer taken along the line XXIX-XXIX.

As illustrated in FIG. 28 and FIG. 29, a conductive film covering the fourth interlayer insulating film 12 is formed, and the data lines 6a, the relay layer 6b, and the relay layer 6c are formed by patterning the conductive film. An aluminum alloy film, and a film in which an aluminum film and a titanium nitride film are stacked in two layers or four layers can be used as the conductive film. In the present embodiment, a conductive film with a thickness of 200 nm to 500 nm is formed by stacking the aluminum film and the titanium nitride film in two layers. Since the conductive film is formed by coating an inner side of the contact hole 35 with the conductive film as illustrated in FIG. 28, the data line 6a is connected to the source region 30s through the contact hole 35. In addition, as illustrated in FIG. 29, the conductive film is formed such that inner sides of the contact holes 61, 62, and 63 are coated with the conductive film, and thus, the relay layer 6b is connected to the fourth capacitance electrode 16k through the contact hole 63, the relay layer 6c is connected to the first capacitance electrode 16d through the contact hole 61, and in the same manner, the relay layer 6c is connected to the third capacitance electrode 16h and the fifth capacitance electrode 16m through the contact hole 62.

Figure 30:
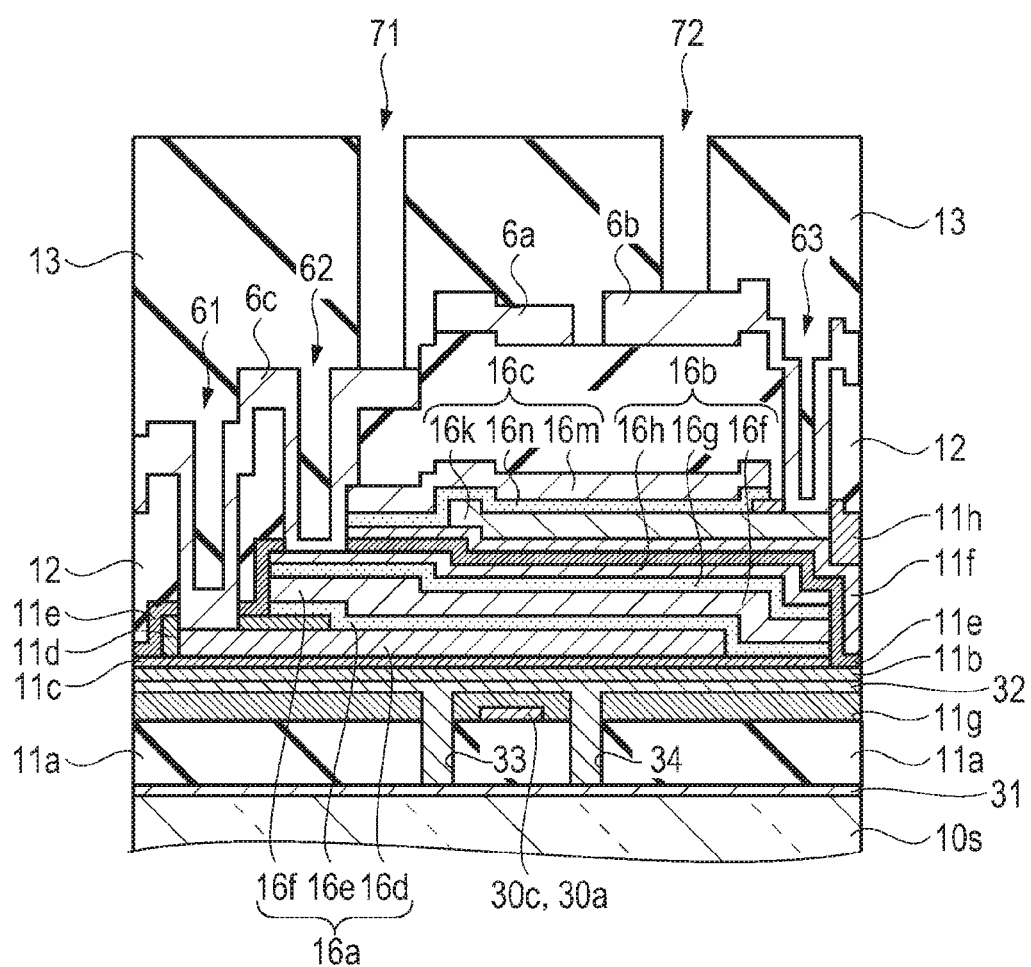
FIG. 30 is a schematic sectional view illustrating a method of forming the data lines and contact holes relating to the relay layer in the same layer as the data lines taken along the line XXX-XXX.
Figure 31:
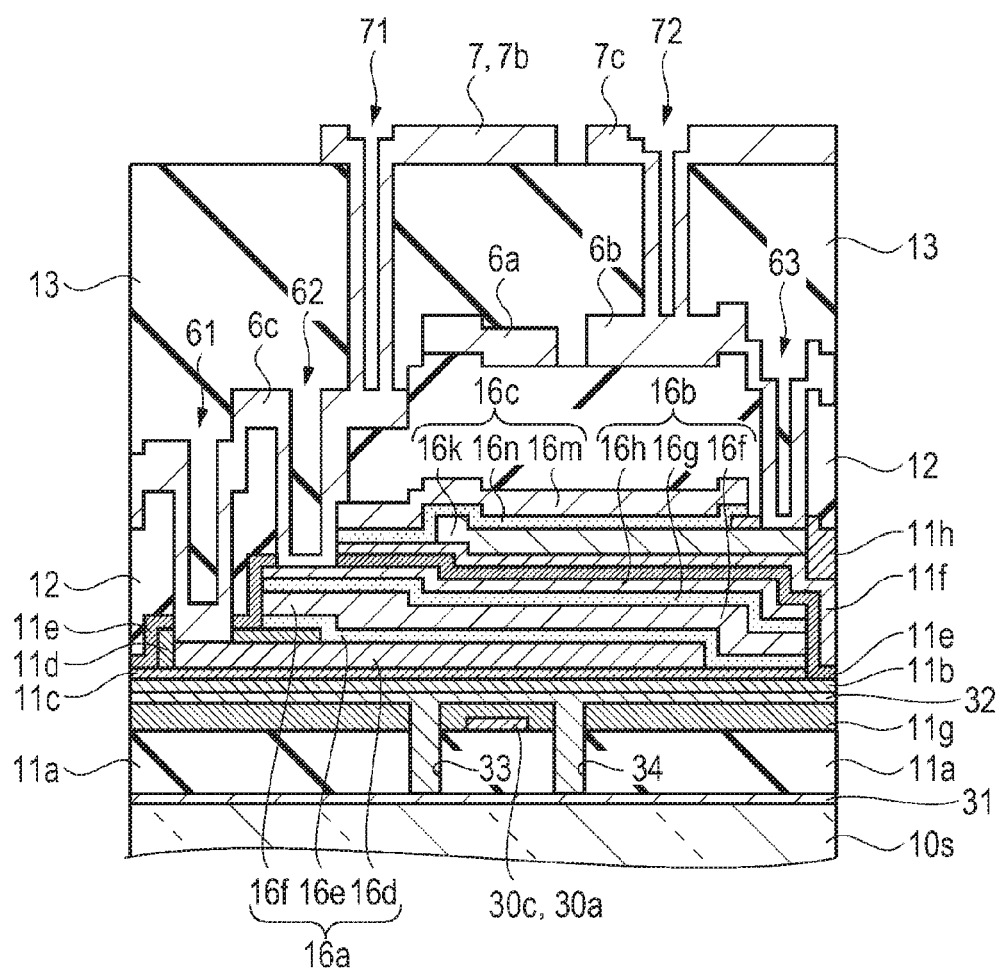
FIG. 31 is a schematic sectional view illustrating a method of forming capacitance lines and the relay layer in the same layer as the capacitance lines taken along the line XXXI-XXXI.

FIG. 30 is a schematic sectional view illustrating a method of forming the data lines and contact holes relating to the relay layer in the same layer as the data lines taken along the line XXX-XXX. FIG. 31 is a schematic sectional view illustrating a method of forming the capacitance lines and the relay layer in the same layer as the capacitance lines taken along the line XXXI-XXXI.

As illustrated in FIG. 30, the fifth interlayer insulating film 13 covering the data lines 6a, the relay layer 6b, and the relay layer 6c is formed. The fifth interlayer insulating film 13 can have the same film configuration as the fourth interlayer insulating film 12, and in the present embodiment, the fifth interlayer insulating film 13 with a thickness of, for example, 300 nm to 800 nm is formed by using the NSG film. Since the fifth interlayer insulating film 13 covers the data lines 6a, the relay layer 6b, and the relay layer 6c whose surfaces are rough due to a wiring structure of a lower layer, the fifth interlayer insulating film has a surface to which roughness is reflected. In order to prevent the pixel electrodes 15 which are formed thereafter from being affected by the roughness, planarizing processing such as CMP processing is performed. In addition, the contact hole 71 reaching the relay layer 6c by penetrating the planarized fifth interlayer insulating film 13, and the contact hole 72 reaching the relay layer 6b by penetrating the planarized fifth interlayer insulating film 13 are formed by dry-etching.

In addition, as illustrated in FIG. 31, a conductive film covering the fifth interlayer insulating film 13 is formed, and the capacitance lines 7 and the relay layer 7c are formed by patterning the conductive film. The conductive film can have the same film configuration as the data lines 6a, and in the present embodiment, the conductive film with a thickness of, for example, 200 nm to 500 nm is formed by stacking an aluminum film and a titanium nitride film in two layers. As illustrated in FIG. 31, the conductive film is formed such that inner sides of the contact holes 71 and 72 are coated with the conductive film, and thus, the capacitance line 7 is connected to the relay layer 6c through the contact hole 71. The relay layer 7c is connected to the relay layer 6b through the contact hole 72. That is, the capacitance line 7 is electrically connected to the first capacitance electrode 16d, the third capacitance electrode 16h, and the fifth capacitance electrode 16m through the contact hole 71, the relay layer 6c, and contact holes 61 and 62. In addition, the relay layer 7c is electrically connected to the fourth capacitance electrode 16k through the contact hole 72, the relay layer 6b, and the contact hole 63.

Hereinafter, as illustrated in FIG. 9, the sixth interlayer insulating film 14 covering the capacitance line 7 and the relay layer 7c is formed. The sixth interlayer insulating film 14 can have the same film configuration as the fourth interlayer insulating film 12, and in the present embodiment, the sixth interlayer insulating film 14 with a thickness of, for example, 300 nm to 800 nm is formed by using the NSG film. In addition, the contact hole 81 reaching the relay layer 7c by penetrating the sixth interlayer insulating film 14 is formed. Furthermore, the pixel electrodes 15 are formed by forming and patterning a transparent conductive film, which covers the sixth interlayer insulating film 14, such as an ITO film. Since an inner side of the contact hole 81 is formed in a state of being coated with the transparent conductive film, the pixel electrodes 15 is connected to the relay layer 7c through the contact hole 81.

By performing the above steps, the element substrate 10 including three storage capacitors 16a, 16b, and 16c which are formed on an upper layer of the TFT 30, the data lines 6a, the capacitance line 7, and the pixel electrode 15 is completely manufactured on the base member 10s. In addition, the first capacitance electrode 16d, the third capacitance electrode 16h, and the fifth capacitance electrode 16m which are respectively stacked on odd-numbered layers in a place configuring the three storage capacitors 16a, 16b, and 16c, are electrically connected to the capacitance line 7 through the contact holes 61, 62, and 71. In addition, the second capacitance electrode 16f and the fourth capacitance electrode 16k which are stacked on even-numbered layers are electrically connected to the drain region 30d of the semiconductor layer 30a through the contact holes 36 and 37, and are electrically connected to the pixel electrodes 15 through the contact hole 63, the relay layer 6b, the contact hole 72, and the contact hole 81. That is, each of the three storage capacitors 16a, 16b, and 16c is connected in parallel between the capacitance line 7, and the drain region 30d of the TFT 30 and the pixel electrode 15.

According to the method of forming the liquid crystal device 100 and the pixel capacitor 16 according to the first embodiment, the following effects are obtained.

(1) The five capacitance electrodes 16d, 16f, 16h, 16k, and 16m are stacked in a state where dielectric films are interposed therebetween, and thereby three storage capacitors 16a, 16b, and 16c are configured on the base member 10s of the element substrate 10. Hence, an area of each of the capacitance electrodes 16d, 16f, 16h, 16k, and 16m can be easily secured, compared to a case where a plurality of storage capacitors are configured at different positions in a planar view without being stacked. In addition, since the third capacitance electrode 16h and the fifth capacitance electrode 16m are electrically connected to the capacitance line 7 through the contact hole 62 which is a common contact hole, the pixel structure on the base member 10s is simplified, compared to a case where contact holes for connection to the capacitance line 7 are respectively provided corresponding to the three storage capacitors 16a, 16b, and 16c. Hence, even if a high definition pixel P is used, it is possible to provide the liquid crystal device 100 which can realize excellent display quality by securing a capacitance value of the pixel capacitor 16, since the pixel capacitor 16 includes the three storage capacitors 16a, 16b, and 16c.

(2) The second capacitance electrode 16f and the third capacitance electrode 16h which configure the second storage capacitor 16b are formed by collectively patterning the first electrode film 41 and the second electrode film 42 which have the second dielectric film 16g interposed therebetween and are stacked, using dry-etching. Hence, a patterning step of the capacitance electrode is simplified. In addition, by collectively patterning, end portions of the second capacitance electrode 16f and the third capacitance electrode 16h are aligned. That is, it is possible to prevent a position of the third capacitance electrode 16h from being shifted, compared to a case where the second capacitance electrode 16f is patterned and thereafter the third capacitance electrode 16h is patterned by using the second capacitance electrode 16f as a reference. Accordingly, it is possible to maximize actual areas of the second capacitance electrode 16f and the third capacitance electrode 16h which have the second dielectric film 16g interposed therebetween and face each other. Hence, it is possible to increase a capacitance value of the second storage capacitor 16b, compared to a case where the second capacitance electrode 16f and the third capacitance electrode 16h are independently patterned.

(3) A thickness of the first capacitance electrode 16d which functions as a lower capacitance electrode under the first dielectric film 16e is greater than that of the first dielectric film 16e. The second capacitance electrode 16f which functions as an upper capacitance electrode on the first dielectric film 16e is disposed to face a surface including an end surface of the first capacitance electrode 16d through the first dielectric film 16e. Hence, it is possible to increase a capacitance value of the first storage capacitor 16a, compared to a case where the first capacitance electrode 16d and the second capacitance electrode 16f which have the first dielectric film 16e interposed therebetween are disposed in a flat state. The configuration is also employed to the second storage capacitor 16b, and a thickness of the second capacitance electrode 16f which functions as a lower capacitance electrode under the second dielectric film 16g is greater than that of the second dielectric film 16g. In addition, the second storage capacitor 16b is formed in a region including an inner side portion of the contact hole 36 in the drain region 30d, and thus, it is possible to increase a capacitance value of the second storage capacitor 16b.

(4) The third storage capacitor 16c, which includes the fourth capacitance electrode 16k and the fifth capacitance electrode 16m that have the third dielectric film 16n interposed therebetween and face each other, is stacked on the third protection film 11f coating the third interlayer insulating film lie whose surface covers the second storage capacitor 16b and has roughness. In addition, the third storage capacitor 16c is formed in the drain region 30d and a region including an inner side of the contact hole 37. That is, the third storage capacitor 16c is tridimensionally formed by using the roughness or the contact hole 37, compared to a case where the fourth capacitance electrode 16k and the fifth capacitance electrode 16m which have the third dielectric film 16n interposed therebetween are disposed in a plan state, and thus, it is possible to increase a capacitance value of the third storage capacitor 16c.

Second Embodiment

Electro-Optical Device

Figure 32:
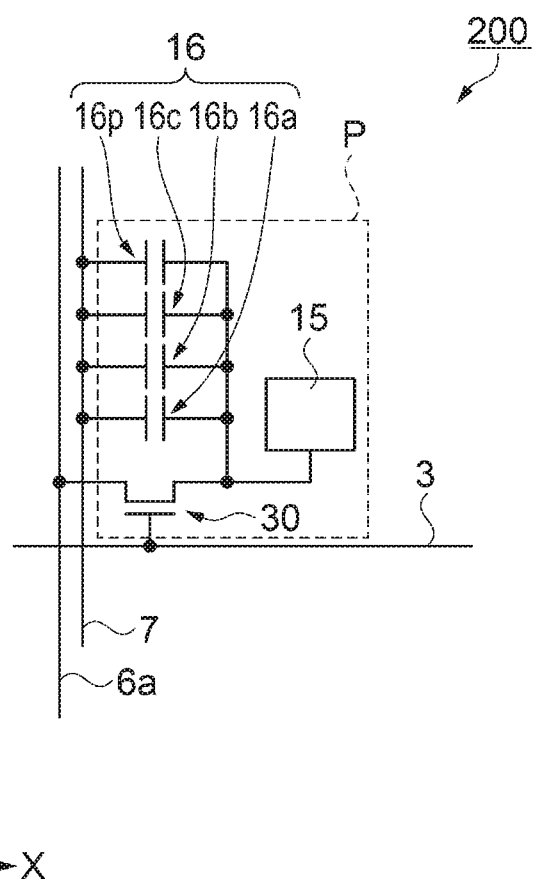
FIG. 32 is a pixel circuit diagram of a liquid crystal device according to a second embodiment.
Figure 33:
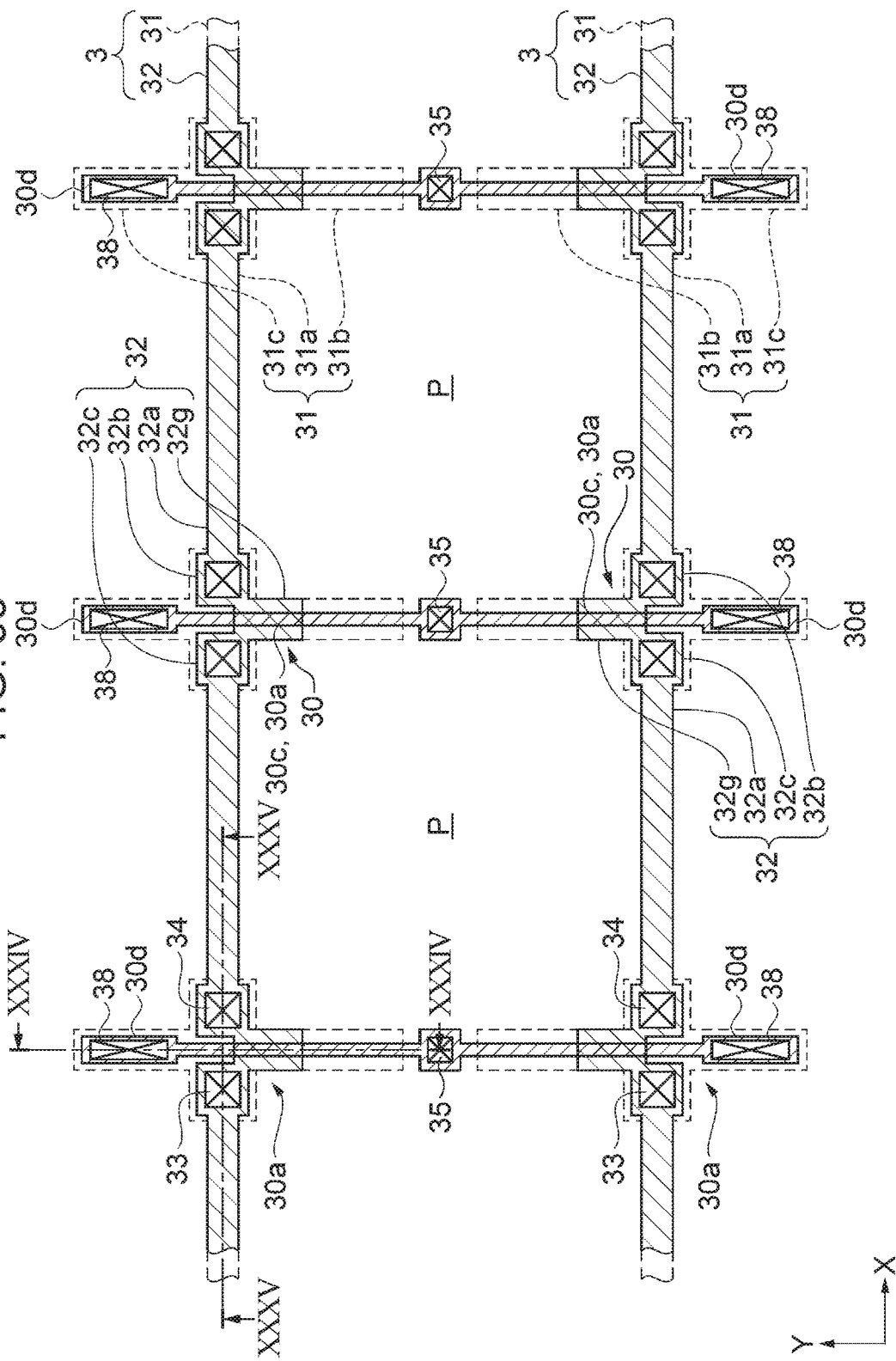
FIG. 33 is a schematic plan view illustrating disposition of transistors and scan lines in an element substrate of the liquid crystal device according to the second embodiment.
Figure 34:
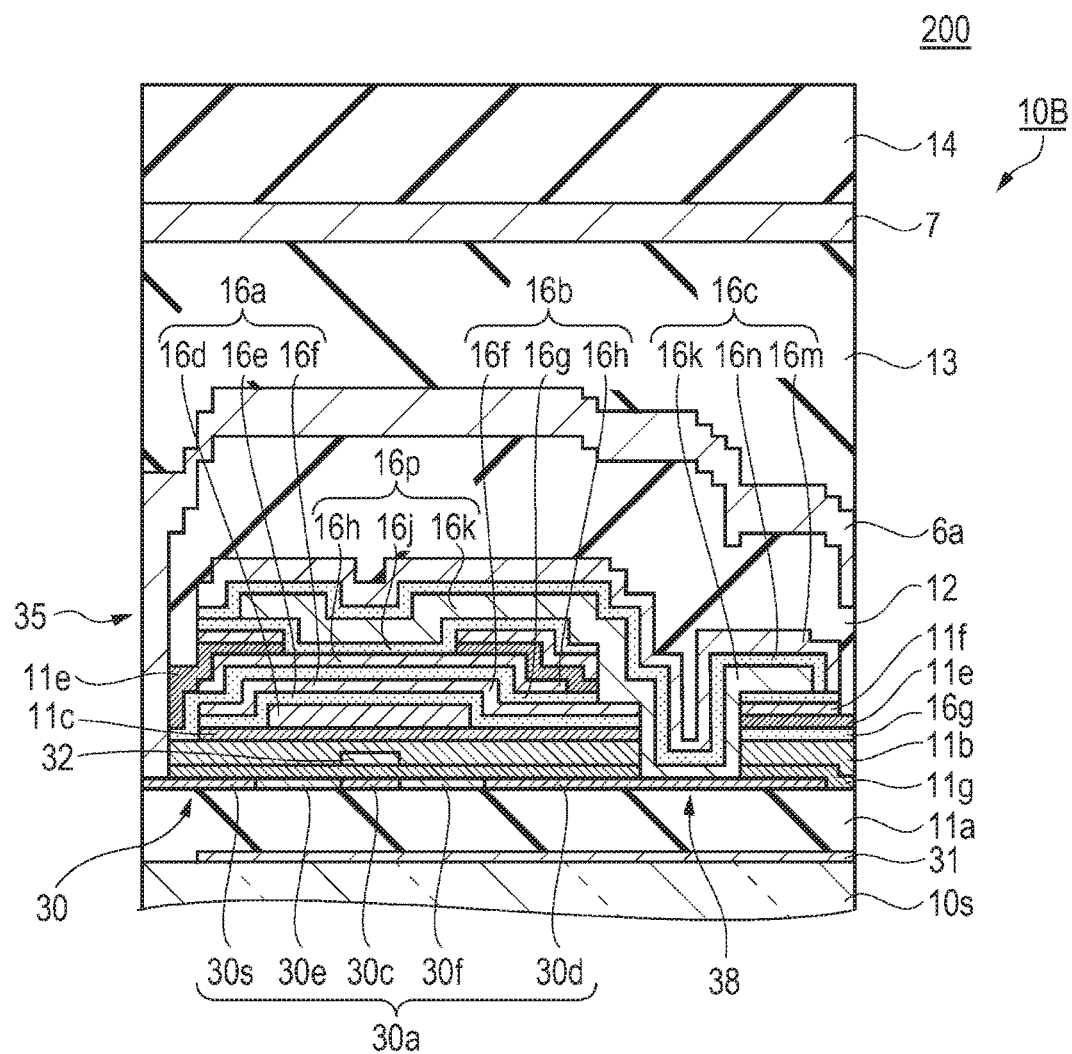
FIG. 34 is a schematic sectional view illustrating a structure of the element substrate taken along the line XXXIV-XXXIV of FIG. 33.
Figure 35:
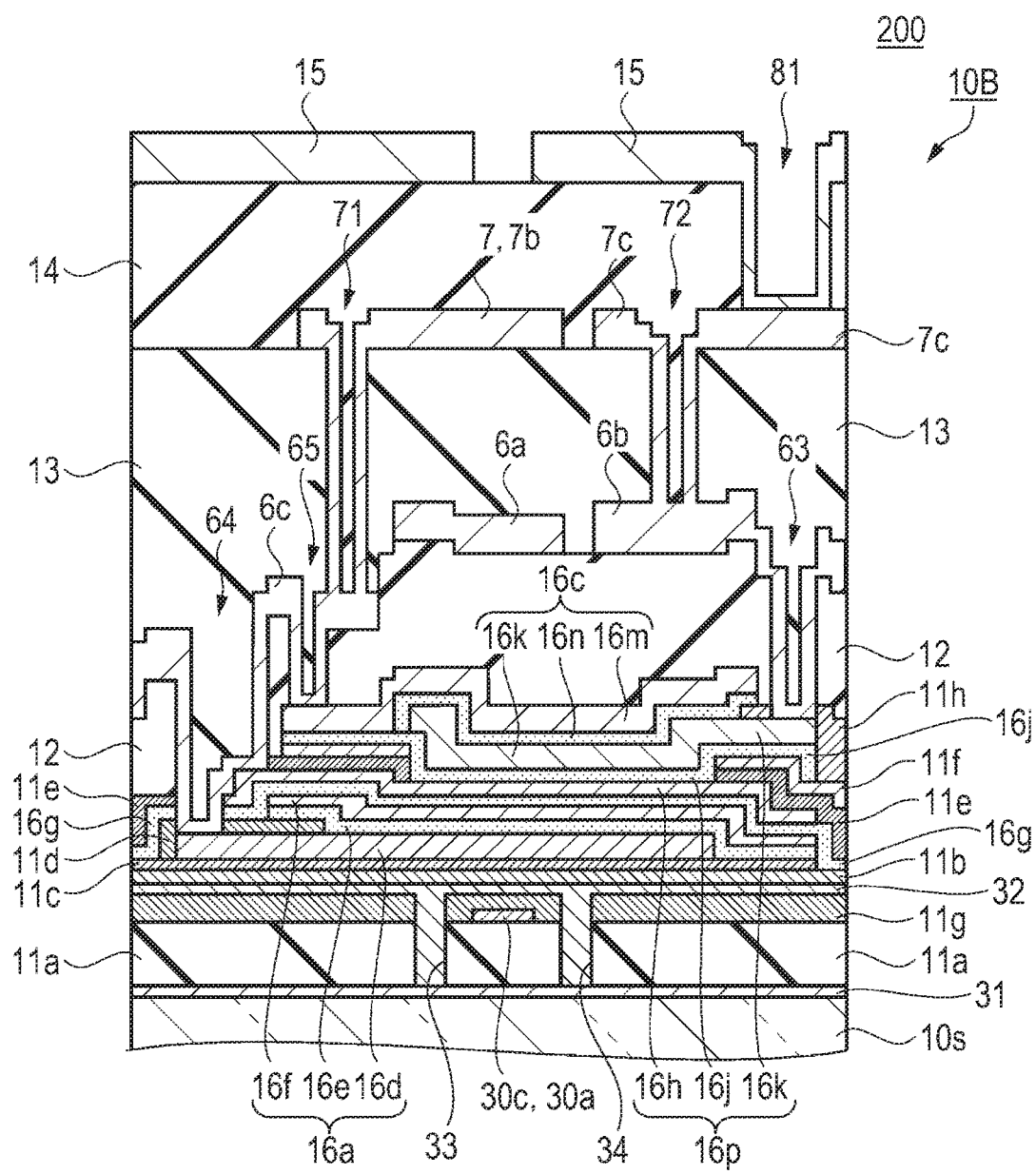
FIG. 35 is a schematic sectional view illustrating the structure of the element substrate taken along the line XXXV-XXXV of FIG. 33.

Next, an electro-optical device according to a second embodiment will be described by using a liquid crystal device as an example in the same manner as in the first embodiment, with reference to FIG. 32 to FIG. 35. FIG. 32 is a pixel circuit diagram of the liquid crystal device according to a second embodiment. FIG. 33 is a schematic plan view illustrating disposition of transistors and scan lines in an element substrate of the liquid crystal device according to the second embodiment. FIG. 34 is a schematic sectional view illustrating a structure of the element substrate taken along the line XXXIV-XXXIV of FIG. 33. FIG. 35 is a schematic sectional view illustrating the structure of the element substrate taken along the line XXXV-XXXV of FIG. 33.

An liquid crystal device 200 which is used as an electro-optical device according to the second embodiment is different from the liquid crystal device 100 according to the first embodiment in a configuration of the pixel capacitor 16 in the element substrate 10. Hence, the same symbols or reference numerals will be attached to the same configuration as the liquid crystal device 100, and detailed description thereof will be omitted.

As illustrated in FIG. 32, the liquid crystal device 200 according to the present embodiment is a pixel circuit of the pixel P, and includes the pixel electrodes 15, the TFT 30, the pixel capacitor 16. An electrical configuration of the liquid crystal device 200 is different from that of the liquid crystal device 100 according to the first embodiment in that the pixel capacitor 16 includes four storage capacitors 16a, 16b, 16c, and 16p. The four storage capacitors 16a, 16b, 16c, and 16p are connected in parallel between the capacitance line 7, and a drain of the TFT 30 and the pixel electrodes 15.

As illustrated in FIG. 33, the scan line 3 is configured to include the first scan line 31 extending in the X direction over the pixels P adjacent to each other in the X direction and the second scan line 32 which is disposed to overlap the first scan line 31 in a planar view and extends in the X direction in the same manner as the first scan line 31.

The first scan line 31 includes two protrusion portions 31b and 31c which protrude in the Y direction from the main line portion 31a extending in the X direction. The semiconductor layer 30a of the TFT 30 provided in each pixel P is disposed in a position overlapping the protrusion portions 31b and 31c of the first scan line 31 on an upper left corner of the pixel P. In addition, the semiconductor layers 30a of the TFTs 30 in the pixels P adjacent to each other in the Y direction are disposed to face each other in the Y direction so as to share one contact hole 35 connected to the source region 30s. Hence, the protrusion portion 31b of the first scan line 31 is also disposed to face each other in the Y direction, and the contact hole 35 is disposed between the protrusion portions 31b facing each other. One contact hole 38 for connection the second capacitance electrode 16f to the fourth capacitance electrode 16k is disposed in the drain region 30d of the semiconductor layer 30a. A detailed connection of the drain region 30d, the second capacitance electrode 16f, and the fourth capacitance electrode 16k will be described below.

The second scan line 32 includes a main line portion 32a extending in the X direction, two expansion portions 32b and 32c which are provided with an interval in the X direction, and a protrusion portion 32g which is disposed to connect the two expansion portions 32b and 32c and protrudes in the Y direction. In addition, the protrusion portion 32g is disposed to overlap the channel region 30c of the semiconductor layer 30a. The contact holes 33 and 34 for electrically connecting the first scan line 31 to the second scan line 32 are provided in the two expansion portions 32b and 32c. The protrusion portion 32g, which is disposed to overlap the channel region 30c of the semiconductor layer 30a, in the scan line 3 functions as a gate electrode of the TFT 30.

With respect to the element substrate 10 of the liquid crystal device 100 according to the first embodiment, a component of an element substrate of the liquid crystal device 200 according to the present embodiment is marked with 10B so as to differentiate from each other.

In structures of each configuration of the element substrate 10B, FIG. 34 to FIG. 57 which are used for the following description illustrate the lines reaching the contact hole 38 along the semiconductor layer 30a from the contact hole 35, as XXXIV-XXXIV, XXXVII-XXXVII, XLIII-XLIII, XLV-XLV, XLVII-XLVII, L-L, LIII-LIII, and LVI-LVI. In addition, the lines crossing the contact hole 33, the semiconductor layer 30a, and the contact hole 34 are denoted by XXXV-XXXV, XXXVIII-XXXVIII, XL-XL, XLI-XLI, XLIV-XLIV, XLVIII-XLVIII, LI-LI, LIV-LIV, and LVII-LVII. There is a case where positions of start points and end points of the lines XXXV-XXXV, XXXVIII-XXXVIII, XL-XL, XLI-XLI, XLIV-XLIV, XLVIII-XLVIII, LI-LI, LIV-LIV, and LVII-LVII are different from each other in FIG. 34 to FIG. 57, for the sake of convenience of description.

As illustrated in FIG. 34 and FIG. 35, the first scan line 31, the first interlayer insulating film 11a, the semiconductor layer 30a, the gate insulating film 11g, the second scan line 32, the second interlayer insulating film 11b, and the first protection film 11c are sequentially formed on the base member 10s of the element substrate 10B. Configurations of the first scan line 31 to the first protection film 11c are the same as those of the element substrate 10 according to the first embodiment. Hence, in the following description, each configuration of wiring layers higher than the first protection film 11c and a method thereof will be described.

As illustrated in FIG. 34 and FIG. 35, the first storage capacitor 16a which is configured with the first capacitance electrode 16d and the second capacitance electrode 16f that have the first dielectric film 16e interposed therebetween and face each other, and the second storage capacitor 16b which is configured with the second capacitance electrode 16f and the third capacitance electrode 16h that have the second dielectric film 16g interposed therebetween and face each other are formed on the first protection film 11c. In addition, the third storage capacitor 16p which is configured with the third capacitance electrode 16h and the fourth capacitance electrode 16k that have the third dielectric film 16j interposed therebetween and face each other, and the fourth storage capacitor 16c which is configured with the fourth capacitance electrode 16k and the fifth capacitance electrode 16m that have the fourth dielectric film 16n interposed therebetween and face each other are formed.

A configuration of a capacitance electrode and a dielectric film of the fourth storage capacitor 16c according to the present embodiment is the same as the configuration of the capacitance electrode and the dielectric film of the third storage capacitor according to the first embodiment, and thus, the symbols or the reference numerals of the third storage capacitor according to the first embodiment will be used as they are.

There are a region where the third interlayer insulating film lie and the third protection film 11f are formed, and a region where the third interlayer insulating film and the third protection film are not formed, between the third capacitance electrode 16h and the third dielectric film 16j. The third storage capacitor 16p including the fourth capacitance electrodes 16k which have the third dielectric film 16j interposed therebetween and faces each other is configured in the region where the third interlayer insulating film lie and the third protection film 11f are not formed, on the third capacitance electrode 16h. That is, the five capacitance electrodes 16d, 16f, 16h, 16k, and 16m in portions configuring the four storage capacitors 16a, 16b, 16c, and 16p have dielectric films interposed therebetween and are sequentially stacked in an ascending order on the base member 10s.

As illustrated in FIG. 34, the fourth storage capacitor 16c including the fourth capacitance electrode 16k is formed in a region including the contact hole 38. The contact hole 38 reaching the drain region 30d by penetrating the third interlayer insulating film 11e and the third protection film 11f which cover a portion other than the third capacitance electrode 16h, the first protection film 11c, the second interlayer insulating film 11b, and the gate insulating film 11g, are formed in a stepwise manner. An end portion of the second capacitance electrode 16f is located at an inner side of the contact hole 38 formed in a stepwise manner, and the fourth capacitance electrode 16k is formed so as to coat the end portion and the inner side of the contact hole 38. Thereby, the second capacitance electrode 16f and the fourth capacitance electrode 16k are connected to each other in the contact hole 38, and are connected to the drain region 30d.

The fourth interlayer insulating film 12 covering the fourth storage capacitor 16c is formed. In addition, as illustrated in FIG. 34, the contact hole 35 reaching the source region 30s by penetrating the fourth interlayer insulating film 12, the second interlayer insulating film 11b, and the gate insulating film 11g is formed. A conductive film is formed to coat an inner side of the contact hole 35, and the data line 6a is formed on the fourth interlayer insulating film 12 by patterning the conductive film. Thereby, the source region 30s of the semiconductor layer 30a is connected to the data lines 6a through the contact hole 35.

In the same manner, as illustrated in FIG. 35, a contact hole 64 which functions as a common contact hole reaching the first capacitance electrode 16d and the third capacitance electrode 16h by penetrating the fourth interlayer insulating film 12, the third interlayer insulating film 11e, the first dielectric film 16e, and the second protection film 11d is formed in a stepwise manner. In addition, a contact hole 65 reaching the fifth capacitance electrode 16m by penetrating the fourth interlayer insulating film 12 is formed. Furthermore, the contact hole 63 reaching the fourth capacitance electrode 16k by penetrating the fourth interlayer insulating film 12 and the fourth protection film 11h is formed. A conductive film is formed to coat inner sides of the contact holes 63, 64, and 65, and the data line 6a, the relay layer 6b, and the relay layer 6c are formed on the fourth interlayer insulating film 12 by patterning the conductive film. The relay layer 6b is connected to the fourth capacitance electrode 16k through the contact hole 63, and the relay layer 6c is connected to the first capacitance electrode 16d, the third capacitance electrode 16h, and the fifth capacitance electrode 16m through the contact holes 64 and 65.

The fifth interlayer insulating film 13 covering the data lines 6a and the relay layers 6b and 6c are formed. A contact hole 71 reaching the relay layer 6c by penetrating the planarized fifth interlayer insulating film 13, and a contact hole 72 reaching the relay layer 6b by penetrating the planarized fifth interlayer insulating film 13 are formed. In addition, a conductive film is formed to coat inner sides of the contact holes 71 and 72, and the capacitance line 7 (protrusion portion 7b) and the relay layer 7c are formed on the fifth interlayer insulating film 13 by patterning the conductive film. The capacitance line 7 is connected to the relay layer 6c of a lower layer through the contact hole 71. The relay layer 7c is connected to the relay layer 6b of a lower layer through the contact hole 72.

The sixth interlayer insulating film 14 covering the capacitance line 7 and the relay layer 7c is formed. In addition, the contact hole 81 reaching the relay layer 7c by penetrating the sixth interlayer insulating film 14 is formed. In addition, a transparent conductive film is formed to coat an inner side of the contact hole 81, and the pixel electrode 15 is formed on the sixth interlayer insulating film 14 by patterning the transparent conductive film. The pixel electrode 15 is connected to the relay layer 7c through the contact hole 81. That is, the pixel electrode 15 is connected to the drain region 30d of the semiconductor layer 30a through the contact hole 81, the relay layer 7c, the relay layer 6b, the contact hole 63, and the fourth capacitance electrode 16k.

Method of Manufacturing Electro-Optical Device

Next, a method of forming the pixel capacitor 16 relating to a method of manufacturing an electro-optical device according to a second embodiment will be described with reference to FIG. 36 to FIG. 57.

The method of forming the pixel capacitor 16 according to the second embodiment includes a step of forming the first capacitance electrode 16d on the base member 10s, a step of forming the second capacitance electrode 16f through the first dielectric film 16e in the first capacitance electrode 16d, a step of forming the third capacitance electrode 16h through the second dielectric film 16g in the second capacitance electrode 16f, a step of forming the fourth capacitance electrode 16k through the third dielectric film 16j in the third capacitance electrode 16h, a step of forming the fifth capacitance electrode 16m through the fourth dielectric film 16n in the fourth capacitance electrode 16k, a step of forming the contact hole 64 which is a common contact hole for electrically connecting the first capacitance electrode 16d and the third capacitance electrode 16h to the capacitance line 7, and a step of forming one contact hole 38 for electrically connecting the second capacitance electrode 16f and the fourth capacitance electrode 16k to the drain region of the semiconductor layer 30a.

That is, the method of forming the pixel capacitor 16 according to the second embodiment is different from that according to the first embodiment in a method of forming four storage capacitors 16a, 16b, 16p, and 16c, and forming contact holes between the storage capacitors 16a, 16b, 16p, and 16c, and the capacitance line 7 and the drain region 30d. In the following description, the same steps as in the first embodiment will not be described in detail, and different steps will be specifically described.

Step of Forming First Storage Capacitor

Figure 36:
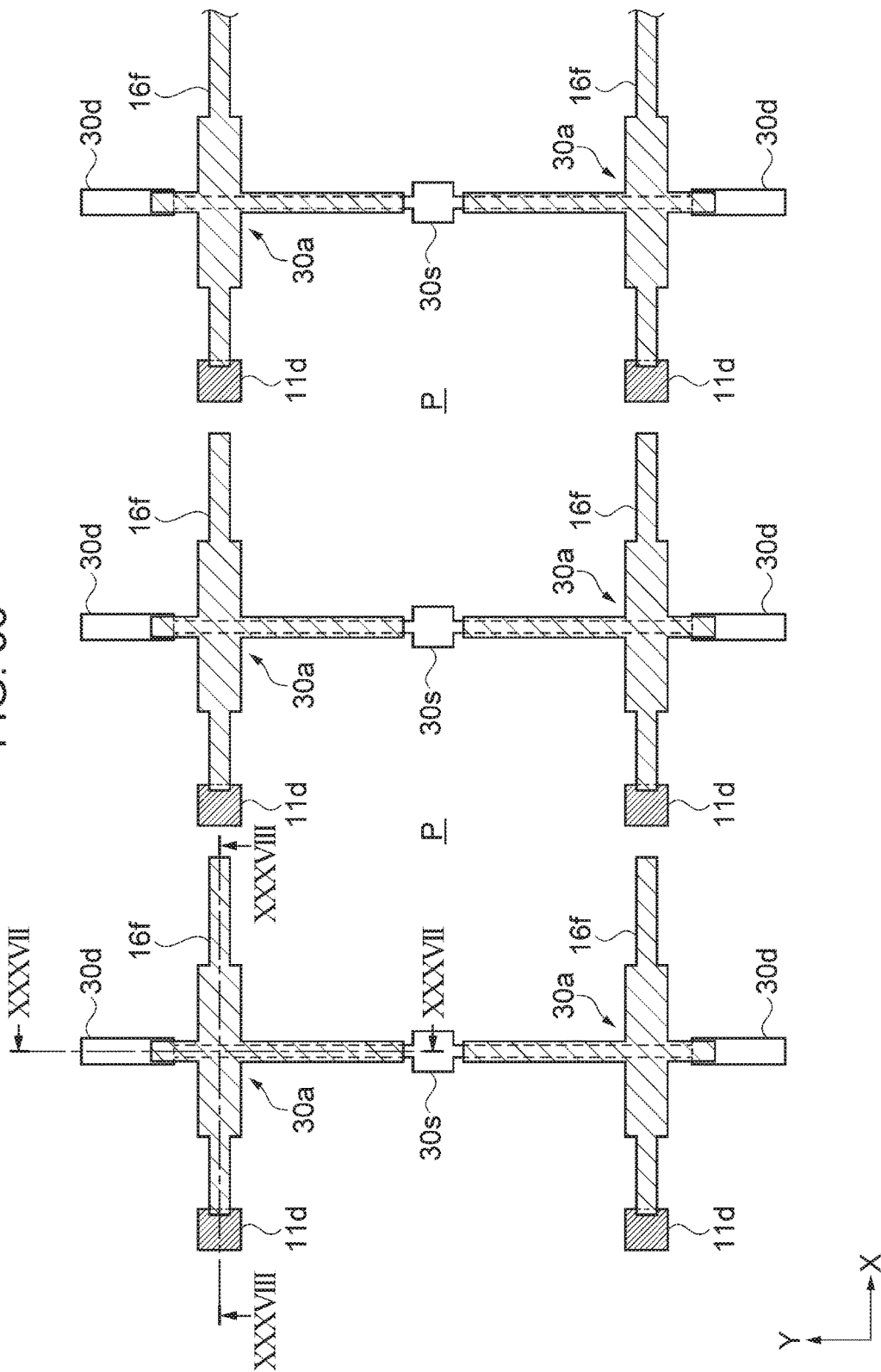
FIG. 36 is a schematic plan view illustrating the method of forming the second capacitance electrode.
Figure 37:
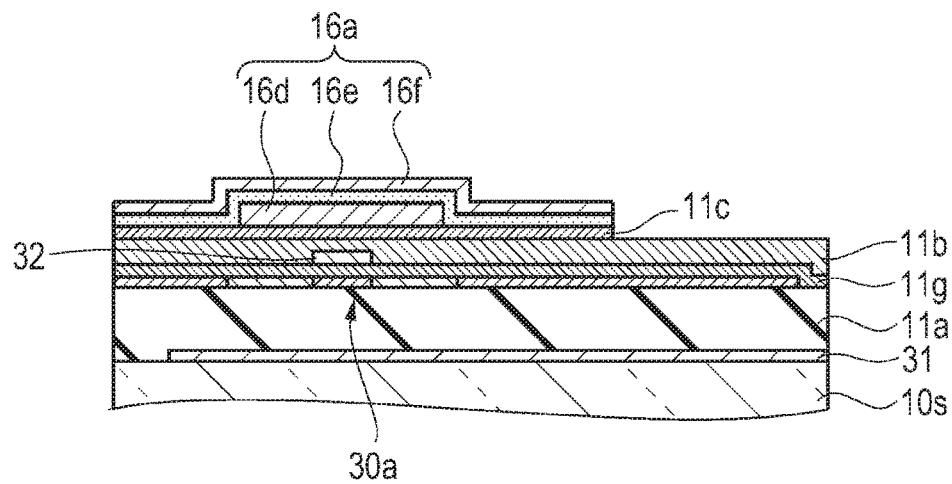
FIG. 37 is a schematic sectional view illustrating a method of forming a first storage capacitor taken along the line XXXVII-XXXVII.
Figure 38:
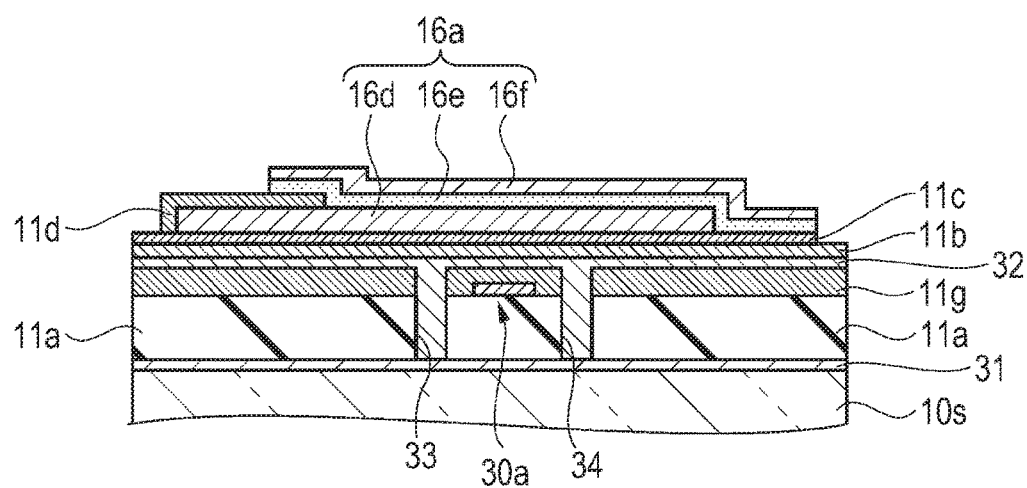
FIG. 38 is a schematic sectional view illustrating the method of forming the first storage capacitor taken along the line XXXVIII-XXXVIII.

FIG. 36 is a schematic plan view illustrating the method of forming the second capacitance electrode. FIG. 37 is a schematic sectional view illustrating a method of forming the first storage capacitor taken along the line XXXVII-XXXVII. FIG. 38 is a schematic sectional view illustrating the method of forming the first storage capacitor taken along the line XXXVIII-XXXVIII.

A step of forming the first storage capacitor 16a according to the present embodiment includes a step of forming the first capacitance electrode 16d, a step of forming the second protection film 11d, a step of forming the first dielectric film 16e, a step of forming the second capacitance electrode 16f. Among these, the step of forming the first capacitance electrode 16d, a step of forming the second protection film 11d, and a step of forming the first dielectric film 16e are the same as those in the first embodiment.

As illustrated in FIG. 36, in a step of forming the second capacitance electrode 16f, the second capacitance electrode 16f is formed in a cross shape so as to overlap the semiconductor layer 30a in a planar view, corresponding to the intersection (refer to FIG. 4) of the non-opening region illustrated in the previous figure. The second capacitance electrode 16f includes a first portion extending in the Y direction and a second portion which intersects with the first portion and extends in the X direction. The first portion is formed to partially overlap an expansion portion of the drain region 30d without overlapping an expansion portion of the source region 30s of the semiconductor layer 30a. One end portion (left end portion in FIG. 36) of the second portion of the second capacitance electrode 16f is formed to extend over the second protection film 11d which overlaps an end portion of the first capacitance electrode 16d in a planar view and is provided in an island shape.

Specifically, as illustrated in FIGS. 37 and 38, after, for example, a silicon oxide film and a silicon nitride film are formed to cover the first capacitance electrode 16d and the second protection film 11*d* which are formed by patterning, and subsequently, a conductive polysilicon film is formed. Then, the first dielectric film 16*e* in which a silicon oxide film and a silicon nitride film are stacked, and the second capacitance electrode 16*f* which is configured with conductive polysilicon film are formed by patterning the films including the first protection film 11*c* that is a lower layer of the first capacitance electrode 16*d*. Thereby, as illustrated in FIG. 37, in the Y direction along the line XXXVII-XXXVII, the second capacitance electrode 16*f* is formed to have the first dielectric film 16*e* interposed between the second capacitance electrode and the first capacitance electrode and to face an end portion and a surface of the first capacitance electrode 16*d*. In addition, end portions of the first protection film 11*c*, the first dielectric film 16*e*, and the second capacitance electrode 16*f* are formed to be aligned. Meanwhile, as illustrated in FIG. 38, in the X direction along the line XXXVIII-XXXVIII, one end portion of the first dielectric film 16*e* and the second capacitance electrode 16*f* rides on the second protection film 11*d*, and the other end portion passes the first capacitance electrode 16*d*, and thus, the end portions are formed in a state of being aligned with an end portion of the first protection film 11*c*. A thickness of the first capacitance electrode 16*d* is greater than that of the first dielectric film 16*e* in the same manner as in the first embodiment. Hence, it is possible to effectively use an end surface of the first capacitance electrode 16*d* as a part of a capacitance electrode.

Step of Forming Second Storage Capacitor

Figure 39:
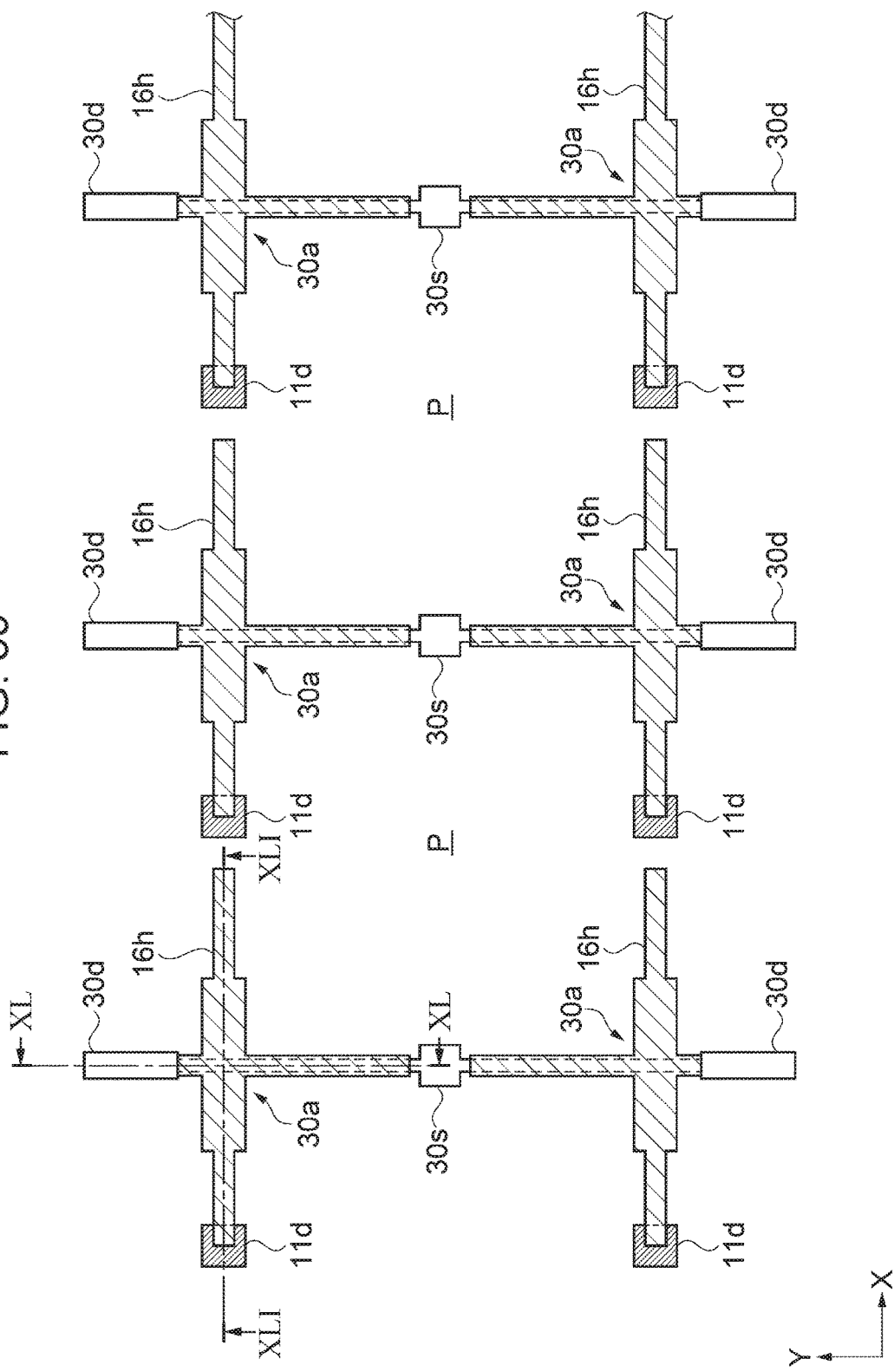
FIG. 39 is a schematic plan view illustrating the method of forming the third capacitance electrode.
Figure 40:
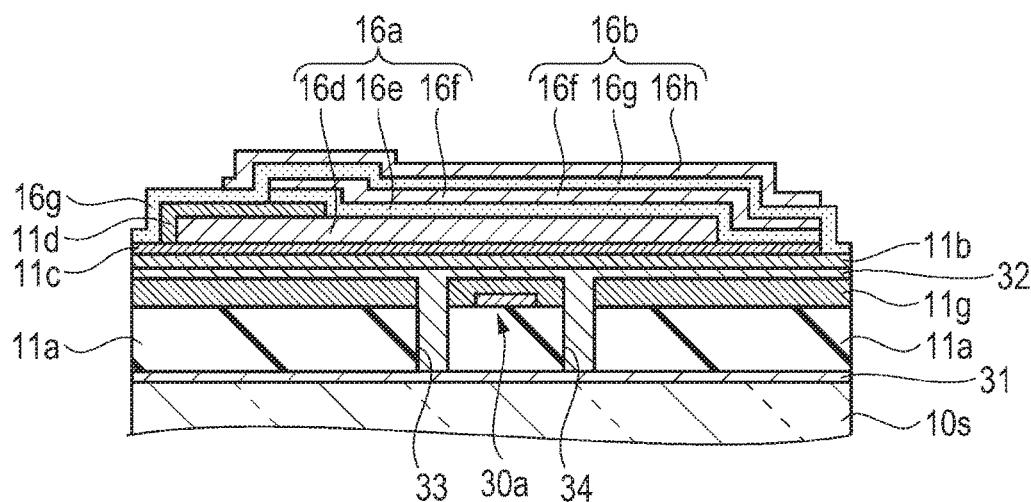
FIG. 40 is a schematic sectional view illustrating a method of forming a second storage capacitor taken along the line XL-XL.
Figure 41:
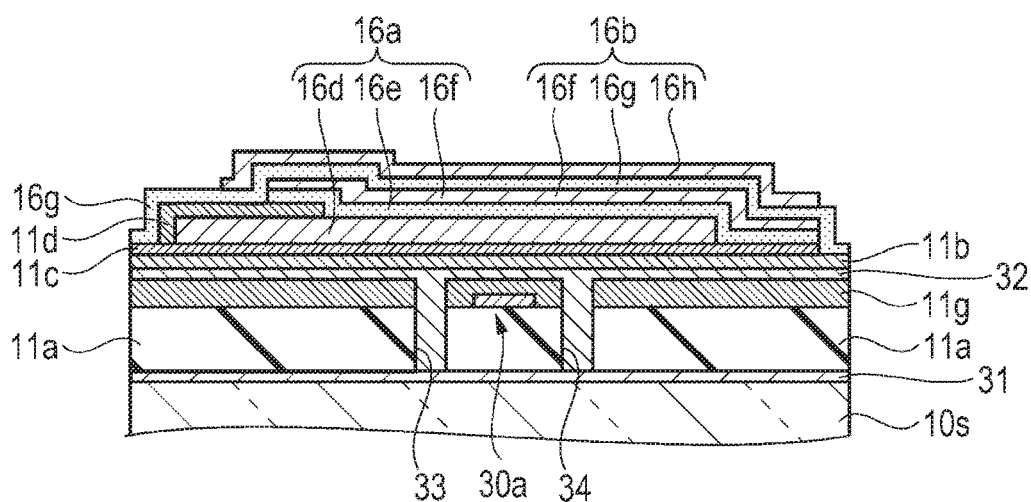
FIG. 41 is a schematic sectional view illustrating the method of forming the second storage capacitor taken along the line XLI-XLI.

FIG. 39 is a schematic plan view illustrating the method of forming the third capacitance electrode. FIG. 40 is a schematic sectional view illustrating a method of forming the second storage capacitor taken along the line XL-XL. FIG. 41 is a schematic sectional view illustrating the method of forming the second storage capacitor taken along the line XLI-XLI.

A step of forming the second storage capacitor 16*b* according to the present embodiment includes a step of forming the second dielectric film 16*g* and a step of forming the third capacitance electrode 16*h*.

As illustrated in FIG. 39, in the step of forming the third capacitance electrode 16*h*, the third capacitance electrode 16*h* is also formed in a cross shape so as to overlap the semiconductor layer 30*a* in a planar view, corresponding to the intersection (refer to FIG. 4) of the non-opening region illustrated in the previous figure, in the same manner as the second capacitance electrode 16*f*. The third capacitance electrode 16*h* includes a first portion extending in the Y direction and a second portion which intersects with the first portion and extends in the X direction. The first portion is formed not to overlap the expansion portion of the source region 30*s* of the semiconductor layer 30*a* and the expansion portion of the drain region 30*d*. One end portion (left end portion in FIG. 39) of the second portion of the third capacitance electrode 16*h* is formed to overlap the end portion of the first capacitance electrode 16*d* in a planar view and to extend over the second protection film 11*d* provided in an island shape.

Specifically, as illustrated in FIG. 40 and FIG. 41, in the step of forming the second dielectric film 16*g*, the second dielectric film 16*g* covering the second capacitance electrode 16*f* is formed. The second dielectric film 16*g* is also configured by stacking, for example, a silicon oxide film and a silicon nitride film. The second dielectric film 16*g* is formed over at least the display region E. The third capacitance electrode 16*h* is formed by forming, for example, a conductive polysilicon film on the second dielectric film 16*g* and patterning the polysilicon film.

As illustrated in FIG. 40, the second capacitance electrode 16*f* and the third capacitance electrode 16*h* which have the second dielectric film 16*g* interposed therebetween face each other. One end portion (left side in the figure) in the Y direction along the line XL-XL of the third capacitance electrode 16*h* is located at approximately the same end portion as the second capacitance electrode 16*f*, but the other end portion (right side in the figure) in the Y direction along the line XL-XL of the third capacitance electrode 16*h* is located at the first capacitance electrode 16*d* side rather than the end portion of the second capacitance electrode 16*f*. That is, there is a portion which does not face the second capacitance electrode 16*f* and the third capacitance electrode 16*h* that have the second dielectric film 16*g* interposed therebetween. This portion will connect the second capacitance electrode 16*f* to the fourth capacitance electrode 16*k* later.

In addition, as illustrated in FIG. 41, one end portion (left side in the figure) in the X direction along the line XLI-XLI of the third capacitance electrode 16*h* is located at a position which passes the end portion of the second capacitance electrode 16*f* on the second protection film 11*d*. Meanwhile, the other end portion (right side in the figure) in the X direction along XLI-XLI of the third capacitance electrode 16*h* is located at approximately the same end portion as the second capacitance electrode 16*f*. In other words, the third capacitance electrode 16*h* is patterned such that the end portions in the X direction and the Y direction are located at the aforementioned position.

Step of Forming Third Storage Capacitor

Figure 42:
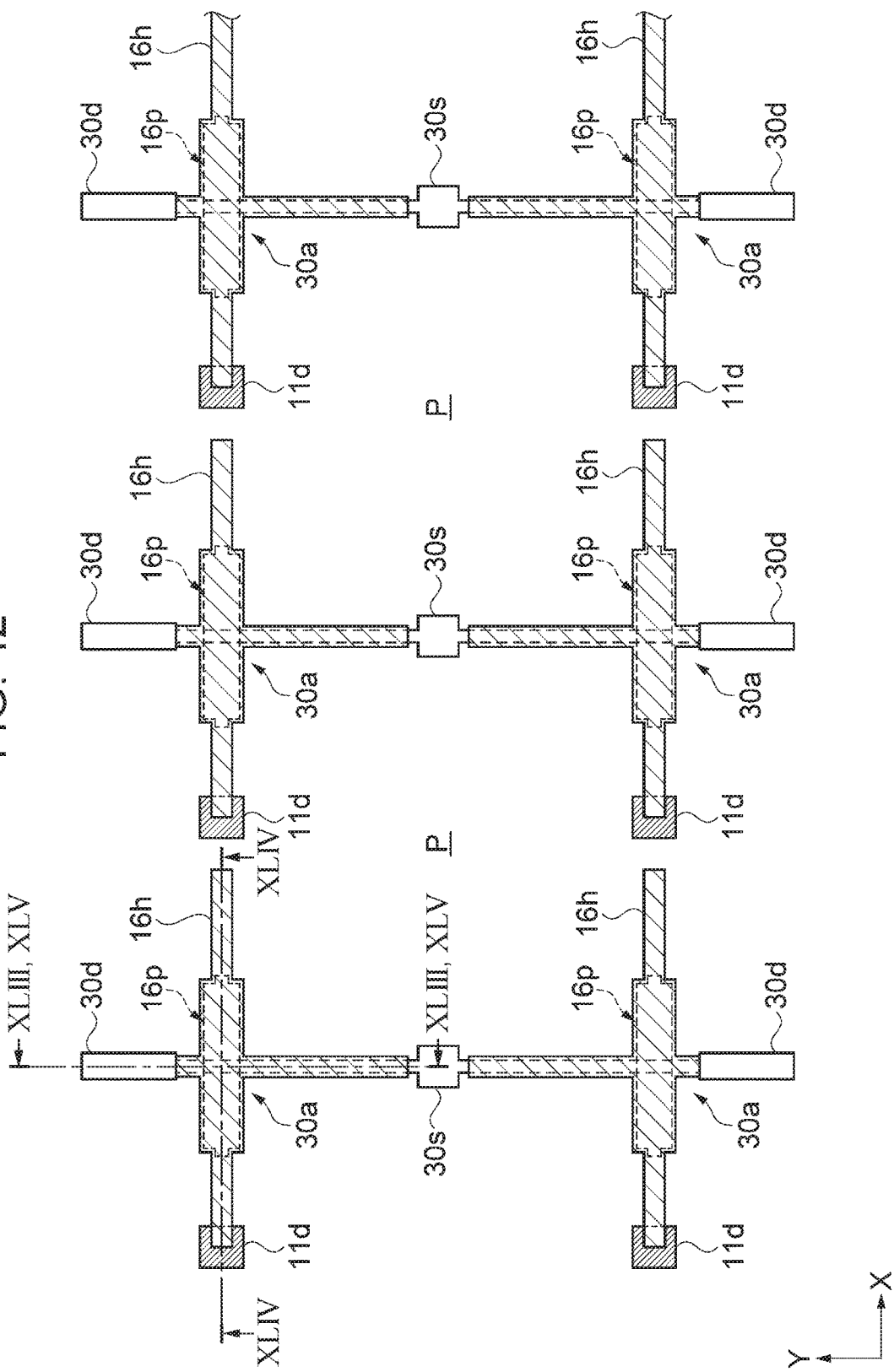
FIG. 42 is a schematic plan view illustrating a method of forming a third storage capacitor.
Figure 43:
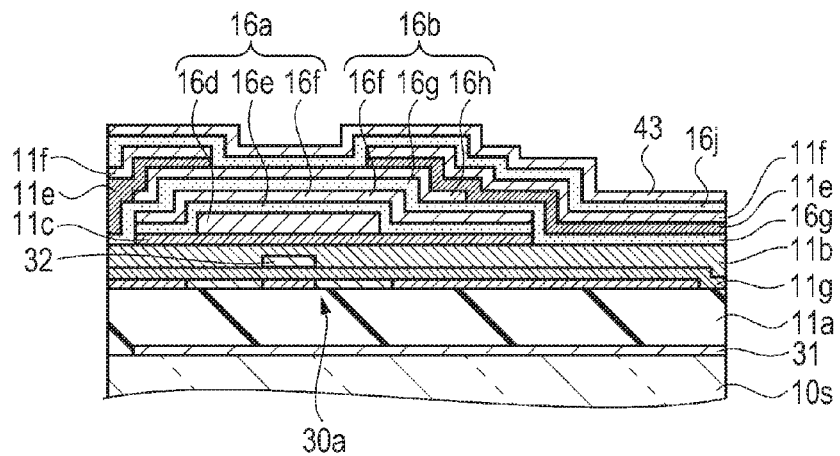
FIG. 43 is a schematic sectional view illustrating a method of forming the third interlayer insulating film, the third protection layer, the third dielectric film, and a fourth capacitance electrode, taken along the line XLIII-XLIII.
Figure 44:
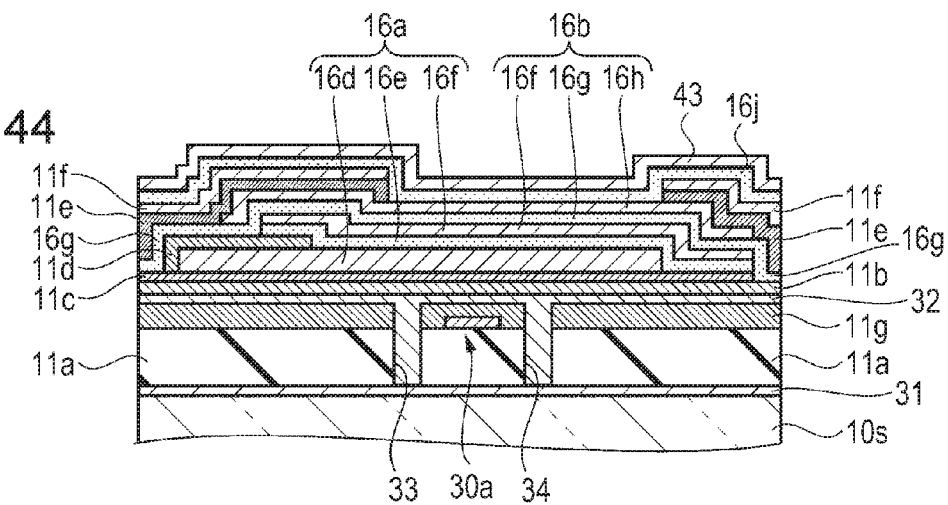
FIG. 44 is a schematic sectional view illustrating the method of forming the third interlayer insulating film, the third protection layer, the third dielectric film, and the fourth capacitance electrode, taken along the line XLIV-XLIV.
Figure 45:
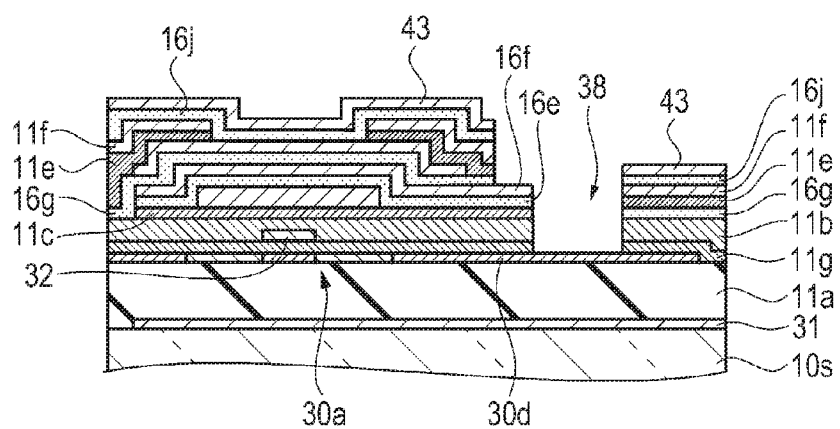
FIG. 45 is a schematic sectional view illustrating a method of forming the second capacitance electrode and contact holes electrically connecting the fourth capacitance electrode to a drain region, taken along the line XLV-XLV.
Figure 46:
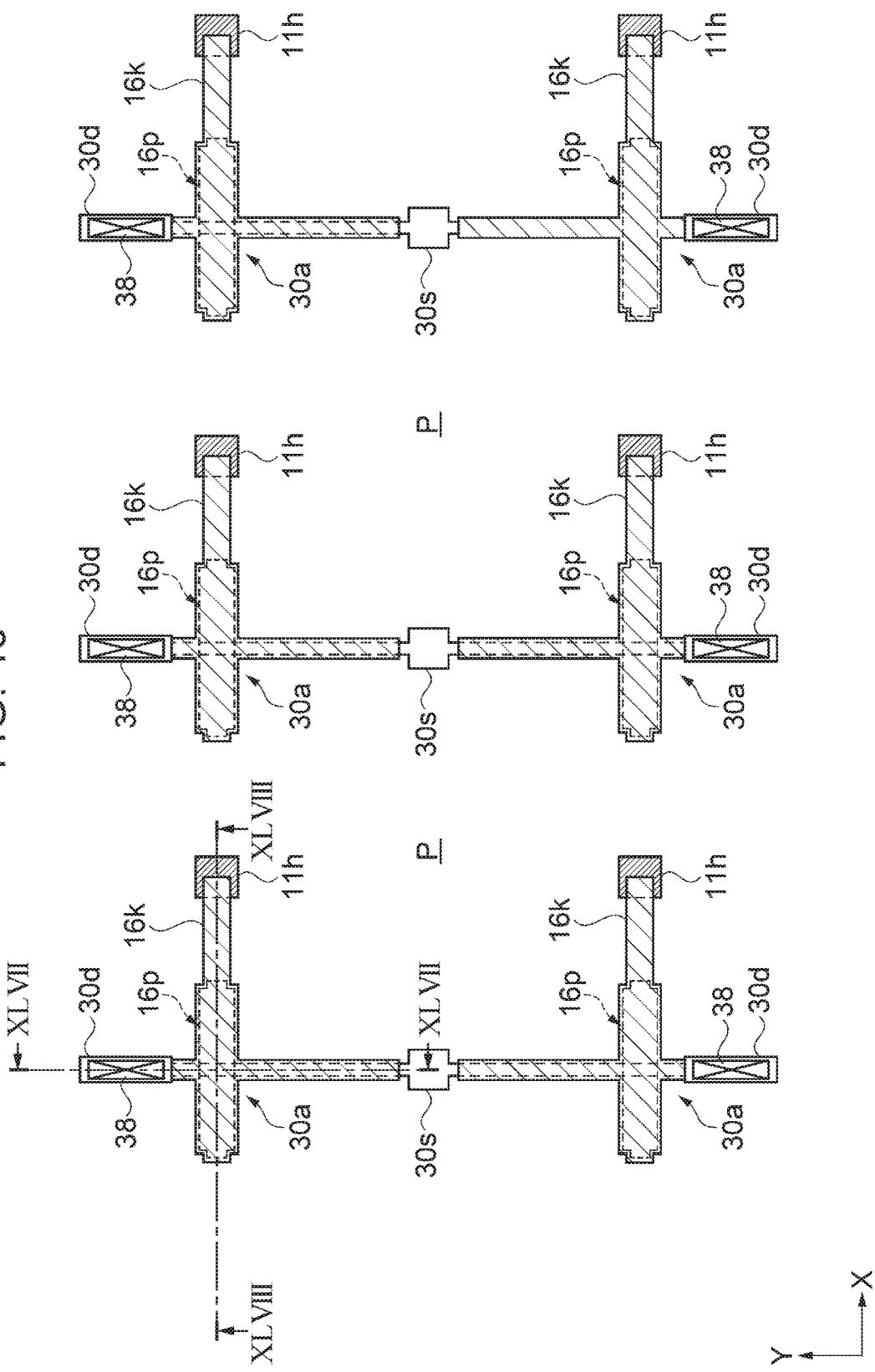
FIG. 46 is a schematic plan view illustrating the method of forming the fourth capacitance electrode.
Figure 47:
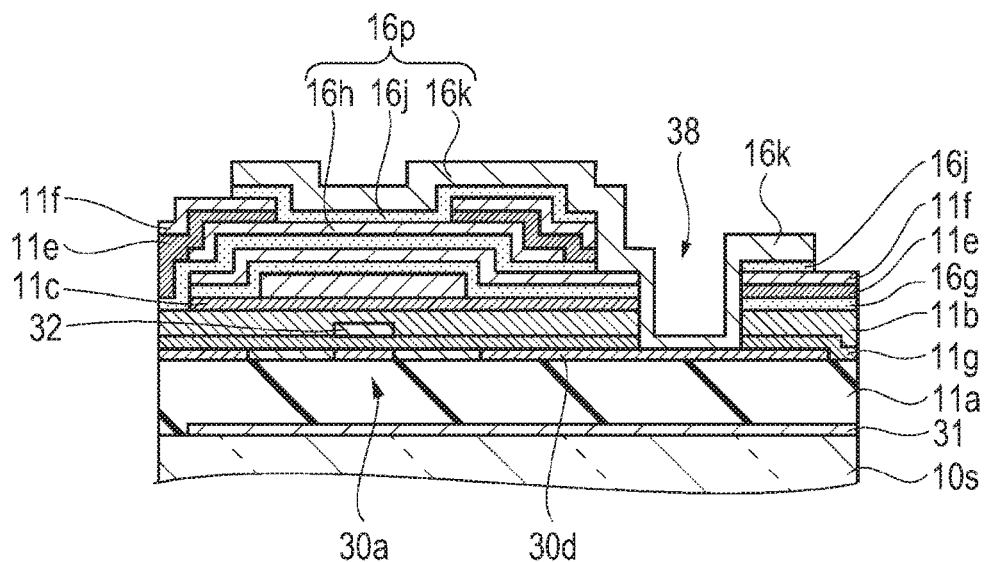
FIG. 47 is a schematic sectional view illustrating the method of forming the fourth capacitance electrode taken along the line XLVII-XLVII.
Figure 48:
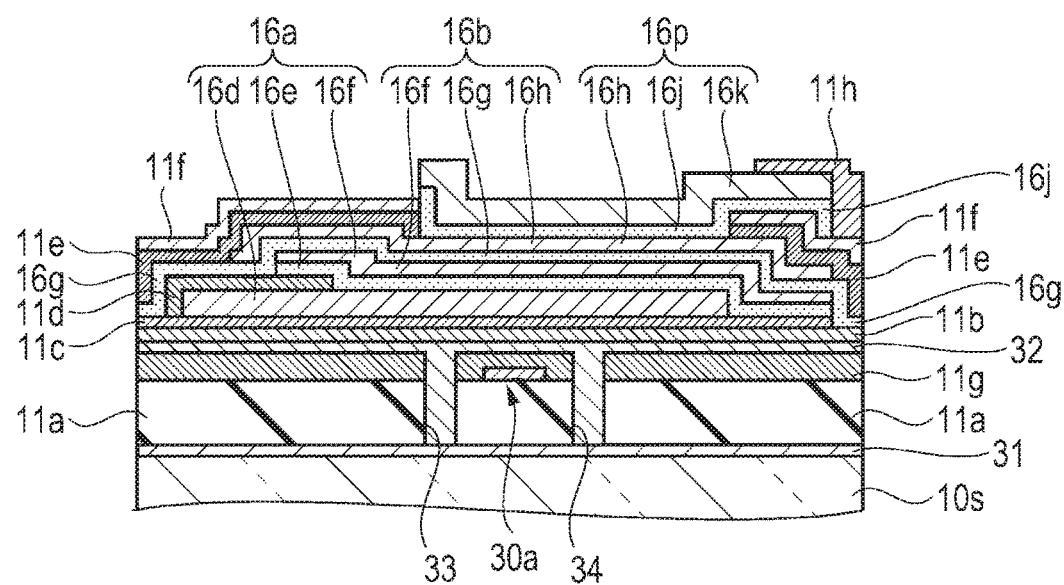
FIG. 48 is a schematic sectional view illustrating the method of forming the fourth capacitance electrode taken along the line XLVIII-XLVIII.

FIG. 42 is a schematic plan view illustrating a method of forming the third storage capacitor. FIG. 43 is a schematic sectional view illustrating a method of forming the third interlayer insulating film, the third protection layer, the third dielectric film, and the fourth capacitance electrode, taken along the line XLIII-XLIII. FIG. 44 is a schematic sectional view illustrating the method of forming the third interlayer insulating film, the third protection layer, the third dielectric film, and the fourth capacitance electrode, taken along the line XLIV-XLIV. FIG. 45 is a schematic sectional view illustrating a method of forming the second capacitance electrode and contact holes electrically connecting the fourth capacitance electrode to a drain region, taken along the line XLV-XLV. FIG. 46 is a schematic plan view illustrating the method of forming the fourth capacitance electrode. FIG. 47 is a schematic sectional view illustrating the method of forming the fourth capacitance electrode taken along the line XLVII-XLVII. FIG. 48 is a schematic sectional view illustrating the method of forming the fourth capacitance electrode taken along the line XLVIII-XLVIII.

A step of forming the third storage capacitor according to the present embodiment includes a step of forming the third interlayer insulating film lie and the third protection film 11*f*, a step of patterning the third interlayer insulating film lie and the third protection film 11*f*, a step of forming the third dielectric film 16*j*, a step of forming the electrode film, a step of forming the contact hole 38, and a step of forming the fourth capacitance electrode 16*k*.

In the present embodiment, as illustrated in FIG. 42, the third storage capacitor 16*p* is formed to extend in the X direction, in an intersection (expansion portion) of the third capacitance electrode 16*h* formed in a cross shape in a planar view. Specifically, the third interlayer insulating film lie and the third protection film 11*f* are first formed in a stacked state so as to cover the third capacitance electrode 16*h*. Subsequently, as illustrated in FIG. 42, the third interlayer insulating film lie and the third protection film 11*f* of the portion (denoted by a dashed line in FIG. 42) overlapped with an intersection (expansion portion) of the third capacitance electrode 16*h* in a planar view are removed by dry-etching. Then, as illustrated in FIG. 43 and FIG. 44, the third dielectric film 16*j*, which coats a portion of the third capacitance electrode 16*h* that is exposed by removing the third interlayer insulating film lie and the third protection film 11*f* and covers the third protection film 11*f*, is formed. The third dielectric film 16*j* can be formed by using a silicon compound material such as a silicon oxide film or a silicon nitride film. In addition, the third dielectric film may be formed by using a dielectric film with high permittivity, such as, an aluminum oxide film, a titanium oxide film, a tantalum oxide film, a niobium oxide film, a hafnium oxide film, a lanthanum oxide film, or a zirconium oxide film. In the present embodiment, in the same manner as the first dielectric film 16*e* or the second dielectric film 16*g*, the third dielectric film 16*j* with a thickness of, for example, 10 nm to 30 nm is formed by stacking a silicon oxide film and a silicon nitride film. Subsequently, a conductive film 43 covering the third dielectric film 16*j* is formed. The conductive film 43 can be formed by using a conductive film such as, a conductive polysilicon film, a metal silicide film, a metal, or a metal compound film. In the present embodiment, the conductive film 43 with a thickness of, for example, 50 nm to 100 nm is formed by using the conductive polysilicon film.

Next, as illustrated in FIG. 45, the contact hole 38 reaching the drain region 30*d* of the semiconductor layer 30*a* by penetrating the conductive film 43, the third protection film 11*f*, the third interlayer insulating film lie, the second dielectric film 16*g*, the first dielectric film 16*e*, the first protection film 11*c*, the second interlayer insulating film 11*b*, and the gate insulating film 11*g* is formed by dry-etching. At this time, an inner wall on one side in the Y direction along the line XLV-XLV of the contact hole 38 is formed in a stepwise shape, and a part of the second capacitance electrode 16*f* is exposed in the inside of the contact hole 38. In other words, the contact hole 38 is formed in a stepwise shape such that a part of the second capacitance electrode 16*f* is exposed in the inside of the contact hole 38.

As illustrated in FIG. 46, in the step of forming the fourth capacitance electrode 16*k*, the fourth capacitance electrode 16*k* is also formed in a cross shape so as to overlap the semiconductor layer 30*a* in a planar view, corresponding to the intersection (refer to FIG. 4) of the non-opening region illustrated in the previous figure. The fourth capacitance electrode 16*k* also includes a first portion extending in the Y direction and a second portion which intersects with the first portion and extends in the X direction. The first portion is formed to overlap the expansion portion of the drain region 30*d* without overlapping the expansion portion of the source region 30*s* of the semiconductor layer 30*a*. The fourth protection film 11*h* is formed in an island shape in one end portion (end portion on the right side in FIG. 46) of the second portion of the fourth capacitance electrode 16*k*.

Specifically, a conductive film which coats the inside of the contact hole 38 illustrated in FIG. 45 and covers the conductive film 43 is formed. The conductive film is configured with the same material as the conductive film 43, and in the present embodiment, a conductive film with a thickness of, for example, 50 nm to 100 nm is formed by using a conductive polysilicon film. Subsequently, the fourth capacitance electrode 16*k* is formed by dry-etching and patterning the polysilicon film and the third dielectric film 16*j*, as illustrated in FIG. 47. At this time, the third protection film 11*f* configured with a silicon nitride film functions as an etching control film (etching stopper film). By additional formation of a polysilicon film, a thickness of the fourth capacitance electrode 16*k* configured with a polysilicon film becomes approximately 100 nm to 150 nm. In addition, as the conductive polysilicon film formed late coats the inside of the contact hole 38, the fourth capacitance electrode 16*k* is connected to the drain region 30*d* through the contact hole 38 and connected to a part of the second capacitance electrode 16*f* exposed in the inside of the contact hole 38. Furthermore, in a portion in which the third interlayer insulating film lie and the third protection film 11*f* are removed on the third capacitance electrode 16*h*, the fourth capacitance electrode 16*k* faces the third capacitance electrode 16*h* and the third dielectric film 16*j* is interposed between the fourth capacitance electrode and the third capacitance electrode. Thereby, the third storage capacitor 16*p* including the third capacitance electrode 16*h* and the fourth capacitance electrode 16*k* which have the third dielectric film 16*j* interposed therebetween and face each other is formed on the base member 10*s*.

Subsequently, as illustrated in FIG. 48, by forming and patterning, for example, an NSG film covering the fourth capacitance electrode 16*k*, the fourth protection film 11*h* covering an end portion (end portion on the right side in the figure) on one side in the X direction along XLVIII-XLVIII of the fourth capacitance electrode 16*k* is formed. A thickness of the fourth protection film 11*h* is, for example, 100 nm to 300 nm.

Step of Forming Fourth Storage Capacitor

Figure 49:
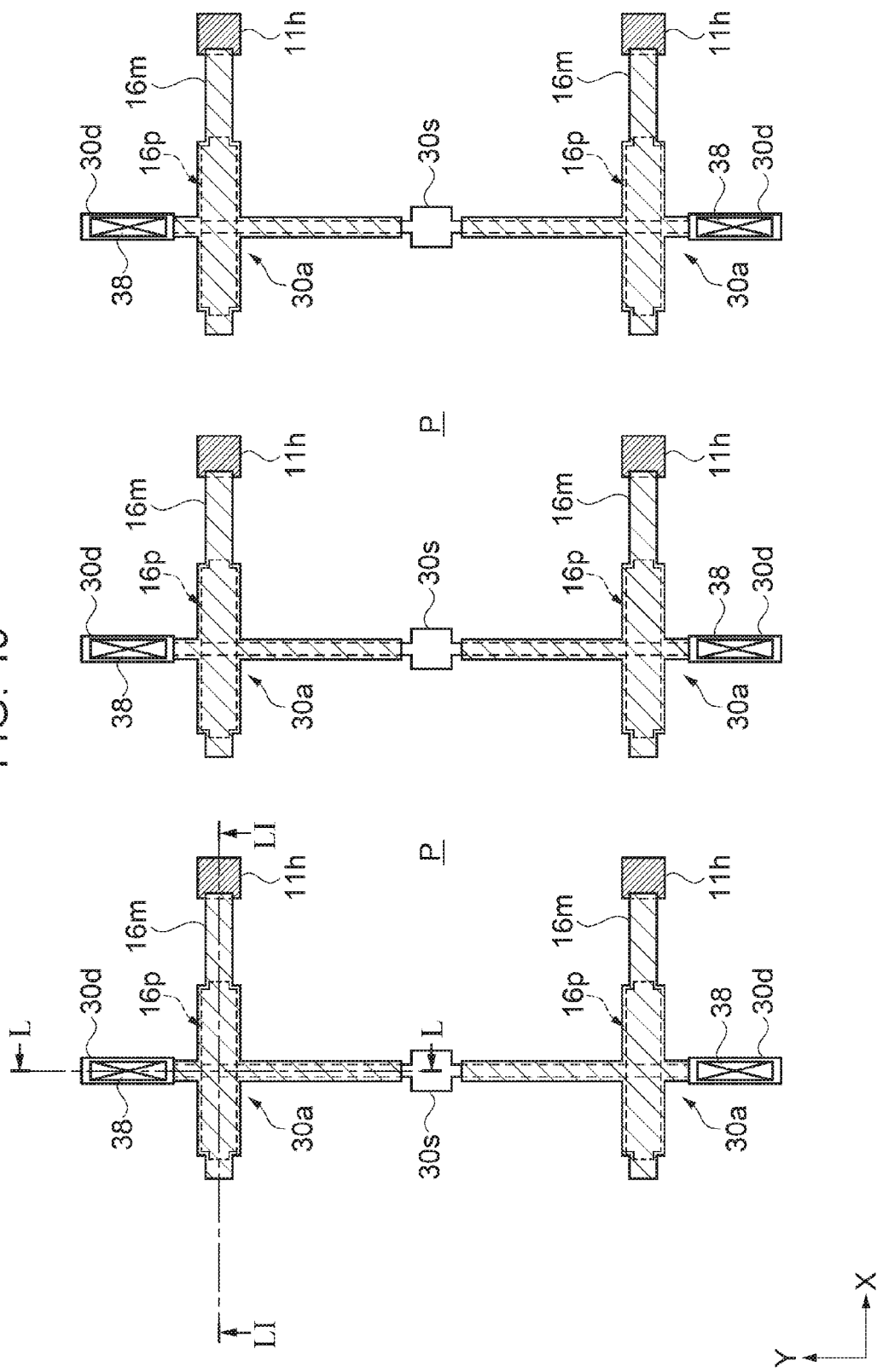
FIG. 49 is a schematic plan view illustrating the method of forming the fifth capacitance electrode.
Figure 50:
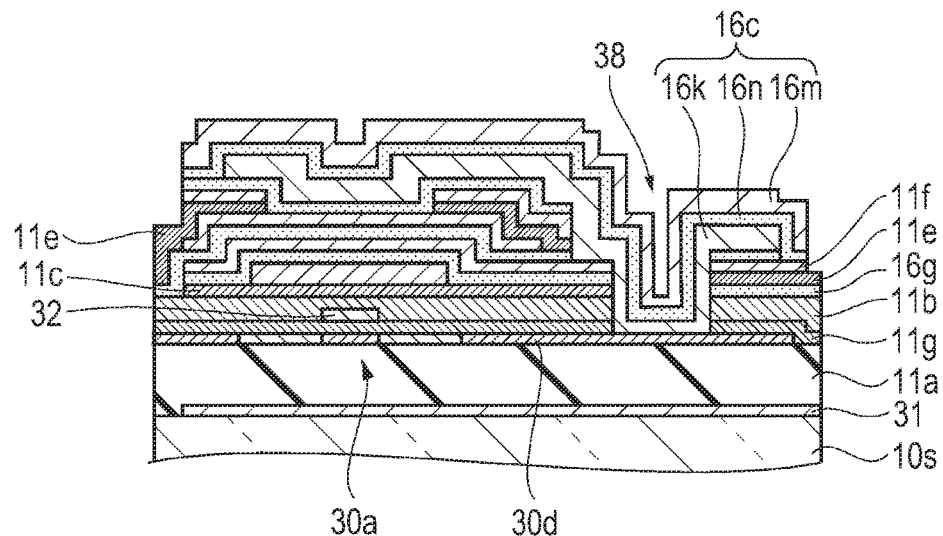
FIG. 50 is a schematic sectional view illustrating the method of forming the fifth capacitance electrode taken along the line L-L.
Figure 51:
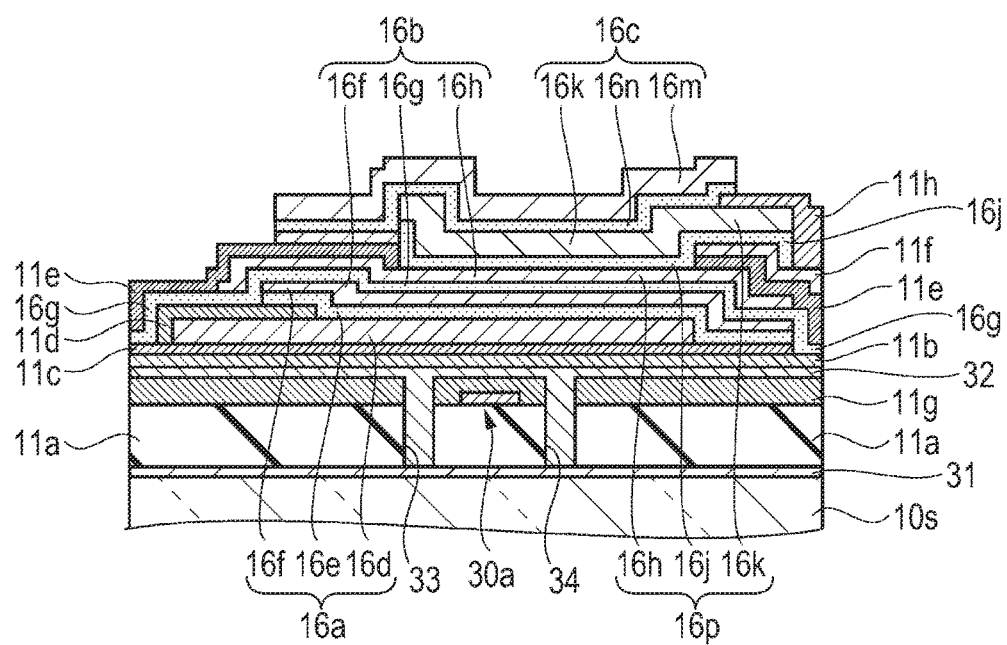
FIG. 51 is a schematic sectional view illustrating the method of forming the fifth capacitance electrode taken along the line LI-LI.

FIG. 49 is a schematic plan view illustrating the method of forming the fifth capacitance electrode. FIG. 50 is a schematic sectional view illustrating the method of forming the fifth capacitance electrode taken along the line L-L. FIG. 51 is a schematic sectional view illustrating the method of forming the fifth capacitance electrode taken along the line LI-LI.

A step of forming the fourth storage capacitor according to the present embodiment includes a step of forming the fourth dielectric film 16*n* and a step of forming the fifth capacitance electrode 16*m*.

As illustrated in FIG. 49, in the step of forming the fifth capacitance electrode 16*m*, the fifth capacitance electrode 16*m* is formed in a cross shape so as to overlap the semiconductor layer 30*a* in a planar view, corresponding to the intersection (refer to FIG. 4) of the non-opening region illustrated in the previous figure. The fifth capacitance electrode 16*m* also includes a first portion extending in the Y direction and a second portion which intersects with the first portion and extends in the X direction. The first portion is formed to overlap the expansion portion of the drain region 30*d* without overlapping the expansion portion of the source region 30*s* of the semiconductor layer 30*a*. One end portion (end portion on the left side in FIG. 49) of the second portion of the fifth capacitance electrode 16*m* is slightly longer than the fourth capacitance electrode 16*k*, and the other end portion (end portion on the right side in FIG. 49) of the second portion of the fifth capacitance electrode 16*m* is slightly shorter than the fourth capacitance electrode 16*k* and is formed to slightly extend over the fourth protection film 11*h* of an island shape.

Specifically, as illustrated in FIG. 50, the fourth dielectric film 16*n* is formed to include the inside of the contact hole 38 and to coat a surface and an end portion of the fourth capacitance electrode 16*k*. The fourth dielectric film 16*n* is configured with a stack film in which, for example, a silicon oxide film and a silicon nitride film are stacked, and has a thickness of, for example, 10 nm to 30 nm, as described in the first embodiment. Subsequently, a conductive film such as a conductive polysilicon film, a metal silicide film, a metal film, or a metal compound film is formed to cover the fourth dielectric film 16n, and by patterning the conductive film, the fifth capacitance electrode 16m is formed. In the present embodiment, the fifth capacitance electrode 16m with a thickness of, for example, 100 nm to 300 nm by using a tungsten silicide film (WSi film) by taking into account light shielding properties of light which is incident from the counter substrate 20 side, in the same manner as in the first embodiment.

In addition, as illustrated in FIG. 51, an end portion (end portion on the left side in the figure) on one side in the X direction along the line LI-LI of the fifth capacitance electrode 16m is formed to extend to a position overlapping the third capacitance electrode 16h. An end portion (end portion on the right side in the figure) on the other side in the X direction along the line LI-LI of the fifth capacitance electrode 16m is formed to slightly ride on the fourth protection film 11h. Thereafter, the contact hole 63 for electrical connection to the pixel electrode 15 is formed in a region in which the fifth capacitance electrode 16m is not formed on the fourth protection film 11h.

By doing so, the fourth storage capacitor 16c including the fourth capacitance electrode 16k and the fifth capacitance electrode 16m which have the fourth dielectric film 16n interposed therebetween and face each other, is formed. Since a thickness of the fourth capacitance electrode 16k is greater than that of the fourth dielectric film 16n, it is possible to effectively use a surface including the end surface of the fourth capacitance electrode 16k as a capacitance electrode.

Step of Forming Contact Hole Relating to Capacitance Electrode

Figure 52:
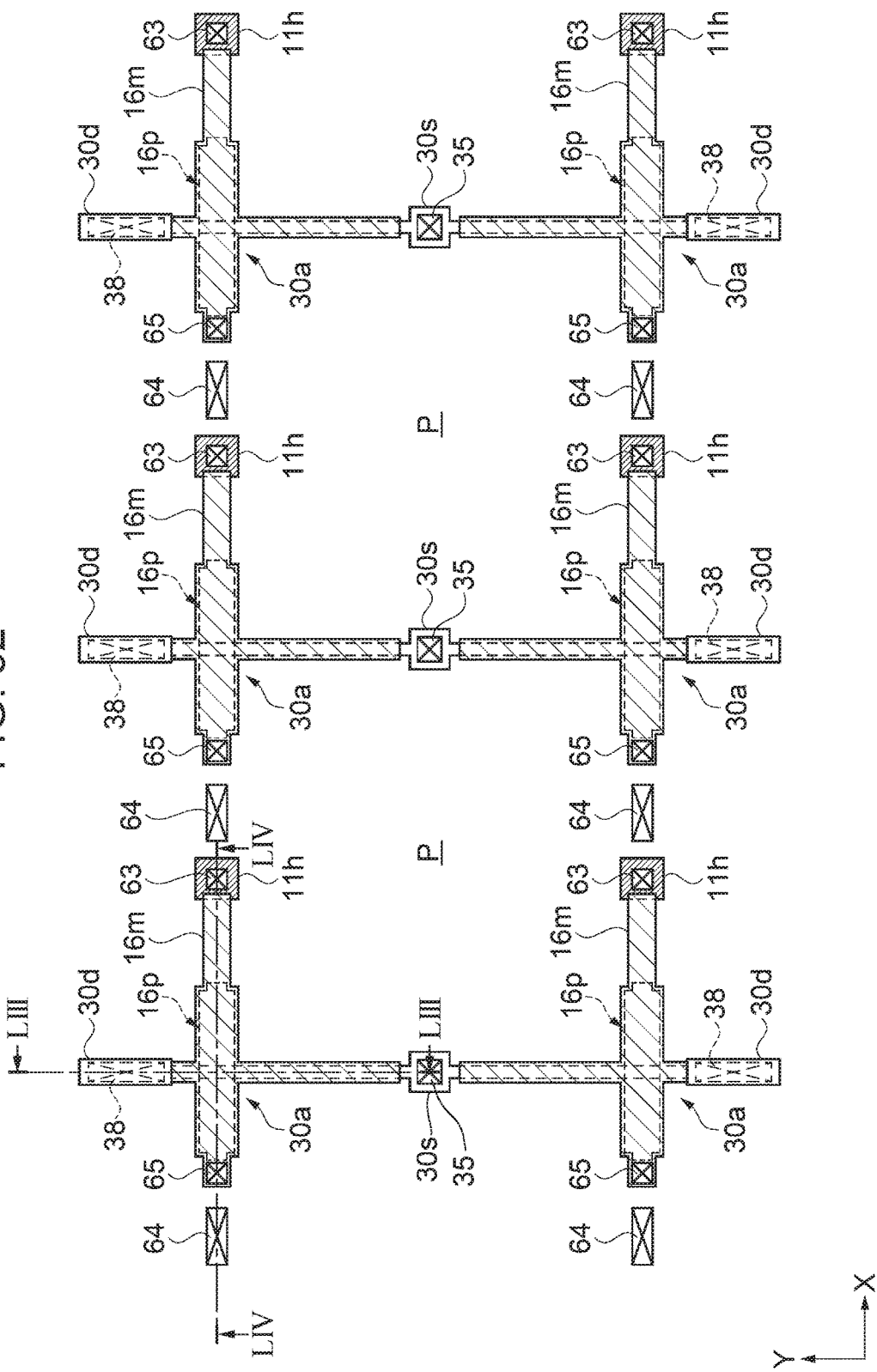
FIG. 52 is a schematic plan view illustrating the method of forming the contact holes relating to the capacitance electrodes.
Figure 53:
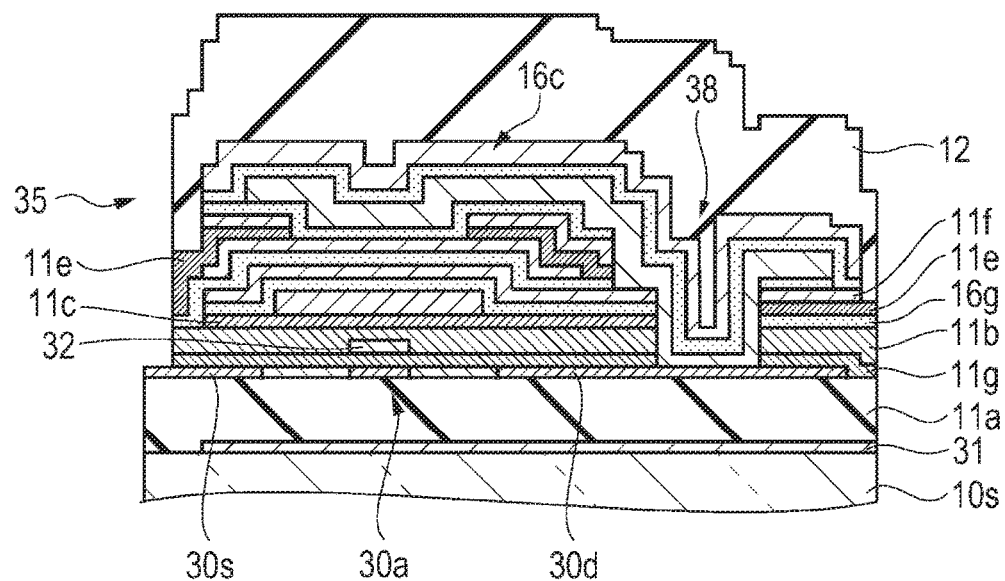
FIG. 53 is a schematic sectional view illustrating the method of forming the fourth interlayer insulating film taken along the line LIII-LIII.
Figure 54:
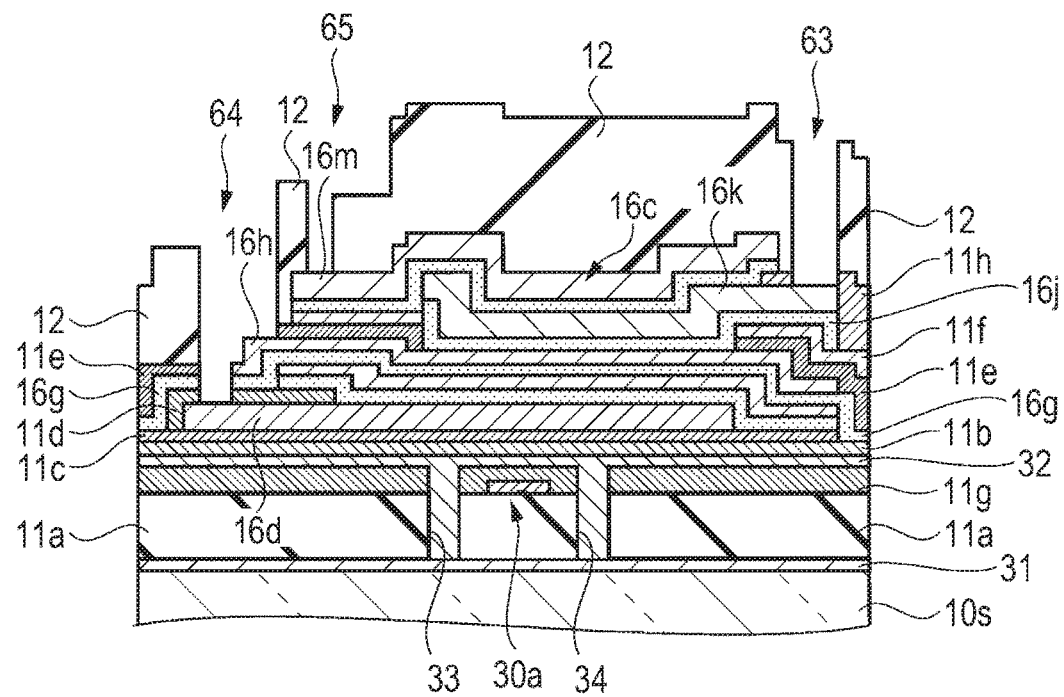
FIG. 54 is a schematic sectional view illustrating the method of forming the contact holes relating to the capacitance electrodes taken along the line LIV-LIV.

FIG. 52 is a schematic plan view illustrating the method of forming the contact holes relating to the capacitance electrodes. FIG. 53 is a schematic sectional view illustrating the method of forming the fourth interlayer insulating film taken along the line LIII-LIII. FIG. 54 is a schematic sectional view illustrating the method of forming the contact holes relating to the capacitance electrodes taken along the line LIV-LIV.

As illustrated in FIG. 52, three contact holes 63, 64, and 65 relating to the capacitance electrodes stacked on the base member 10s are formed in a position along the X direction from an intersection of the non-opening region previously described. Specifically, the contact hole 65 is formed in a position overlapping the end portion on the left side in the X direction of the fifth capacitance electrode 16m, in the figure, with respect to the fifth capacitance electrode 16m formed in a cross shape. In addition, the contact hole 63 is formed in a position overlapping the fourth protection film 11h in front of the end portion on the right side in the X direction of the fifth capacitance electrode 16m. The contact hole 64 is formed between the contact hole 63 and the contact hole 65 in the X direction. The contact hole 64 is formed longer than the other contact holes 63 and 65 in the X direction in a planar view.

As illustrated in FIG. 53, the fourth interlayer insulating film 12 is formed to cover the fourth storage capacitor 16c. In the present embodiment, the fourth interlayer insulating film 12 with a thickness of, for example, 300 nm to 800 nm is formed by using an NSG film, in the same manner as in the first embodiment.

As illustrated in FIG. 53, the contact hole 35 reaching the source region 30s of the semiconductor layer 30a by penetrating the fourth interlayer insulating film 12, the third interlayer insulating film lie, the second dielectric film 16g, the second interlayer insulating film 11b, and the gate insulating film 11g is formed.

In addition, as illustrated in FIG. 54, the contact hole 64 reaching the first capacitance electrode 16d and the third capacitance electrode 16h by penetrating the fourth interlayer insulating film 12, the third interlayer insulating film lie, the second dielectric film 16g, and the second protection film 11d is formed in a stepwise shape. In addition, the contact hole 65 reaching the fifth capacitance electrode 16m by penetrating the fourth interlayer insulating film 12 is formed. In addition, the contact hole 63 reaching the fourth capacitance electrode 16k by penetrating the fourth interlayer insulating film 12 and the fourth protection film 11h is formed.

The contact hole 35 and the contact holes 63, 64, and 65 are formed by dry-etching the silicon oxide film and the silicon nitride film.

Figure 55:
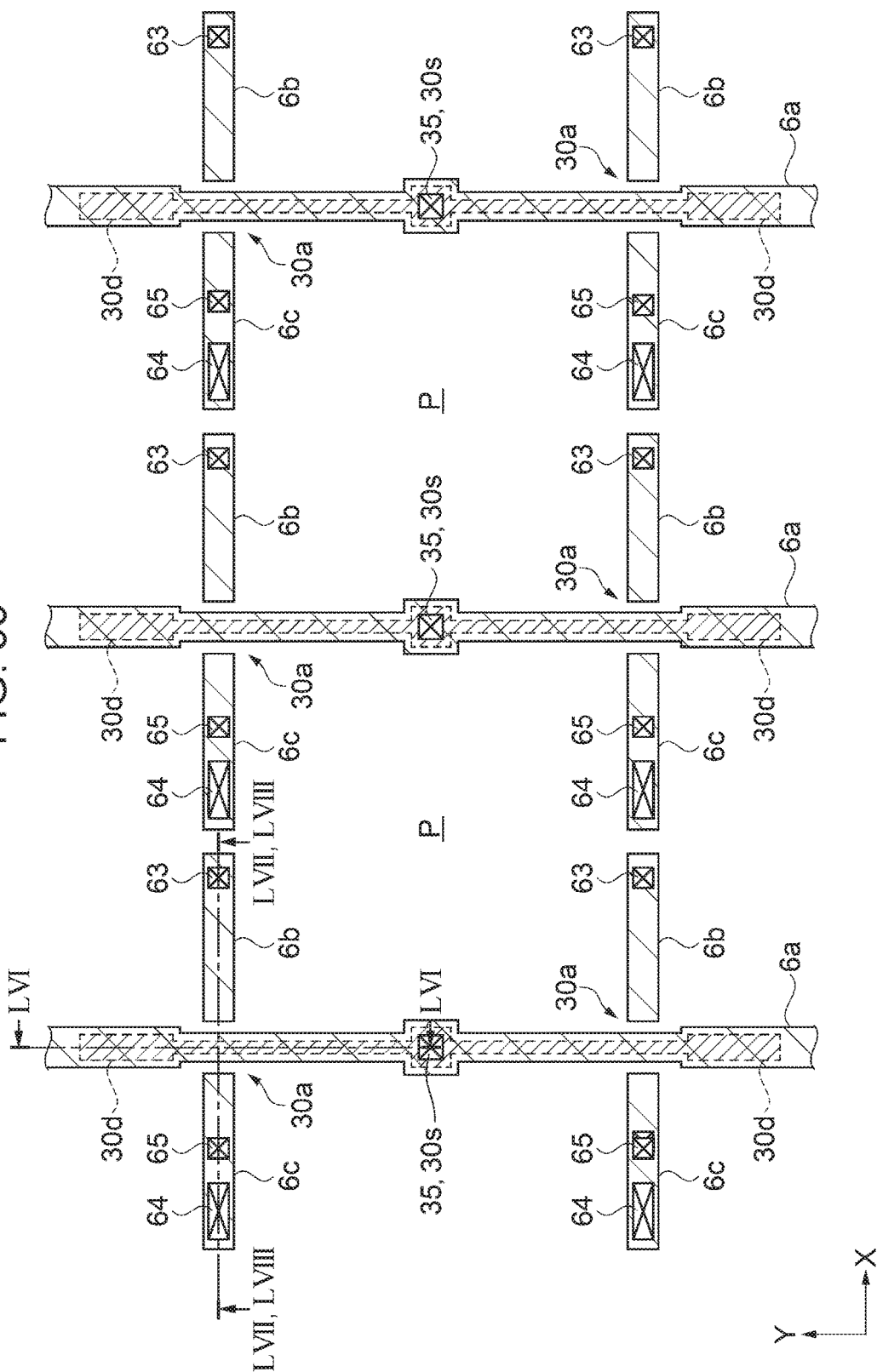
FIG. 55 is a schematic plan view illustrating the method of forming the data lines.
Figure 56:
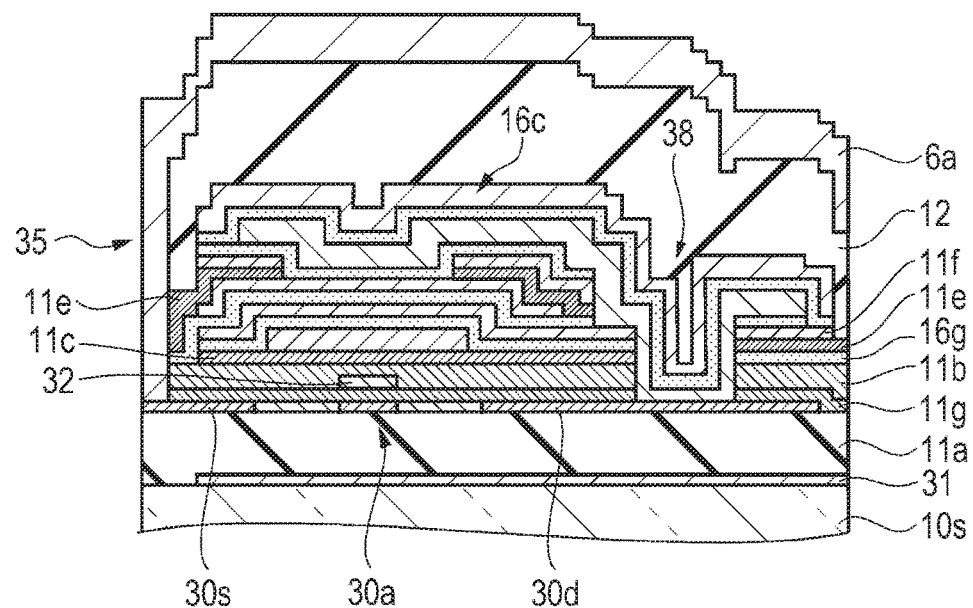
FIG. 56 is a schematic sectional view illustrating the method of forming the data lines taken along the line LVI-LVI.
Figure 57:
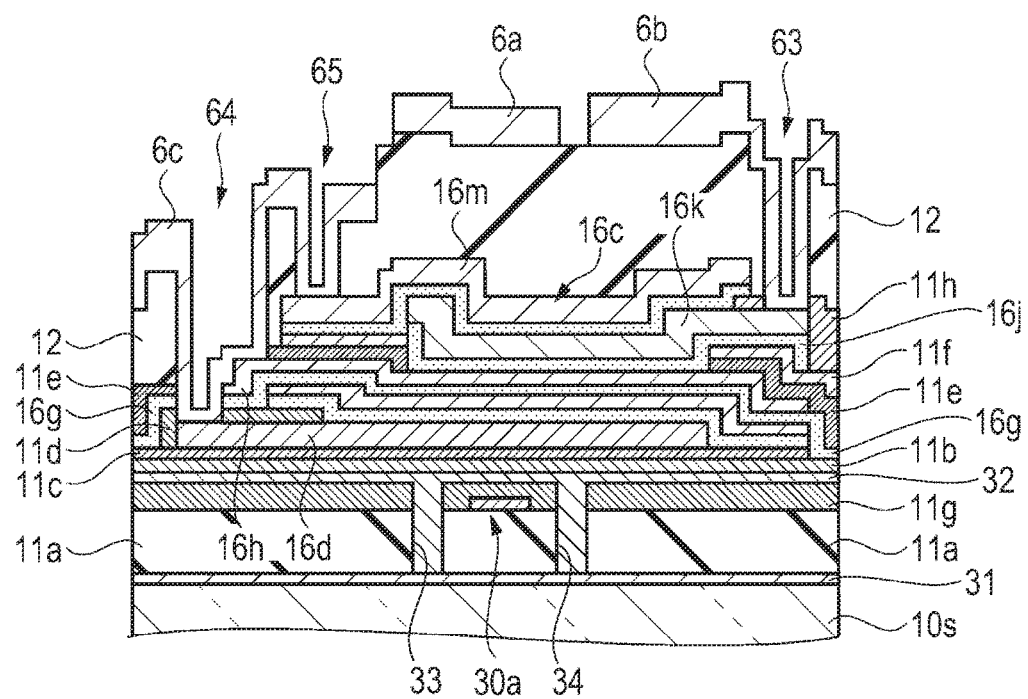
FIG. 57 is a schematic sectional view illustrating a method of forming the data lines and a relay layer taken along the line LVII-LVII.

FIG. 55 is a schematic plan view illustrating the method of forming the data lines. FIG. 56 is a schematic sectional view illustrating the method of forming the data lines taken along the line LVI-LVI. FIG. 57 is a schematic sectional view illustrating a method of forming the data lines and the relay layer taken along the line LVII-LVII.

As illustrated in FIG. 55, the data lines 6a extend in the Y direction, and are disposed in parallel with an interval in the X direction, based on a pitch between the pixels P. Widths of the data lines 6a in a portion overlapping the expansion portion of the drain region 30d and a portion overlapping the contact hole 35 are greater than those in other portions. In addition, two relay layers 6b and 6c in parallel along the X direction are provided between the data lines 6a adjacent to each other in the X direction. The contact holes 63, 64, and 65 for connection to the capacitance electrodes 16d, 16h, and 16m stacked on the base member 10s are provided in the two relay layers 6b and 6c. Specifically, the contact hole 63 is provided in the relay layer 6b, and the two contact holes 64 and 65 are provided in the relay layer 6c. The contact hole 64 is longer than the contact hole 65, in the X direction, and the contact hole 64 is an example of a common contact hole, in the invention.

As illustrated in FIG. 56 and FIG. 57, a conductive film covering the fourth interlayer insulating film 12 is formed, and by patterning the conductive film, the data line 6a, the relay layer 6b, and the relay layer 6c are formed. An aluminum alloy film, and a film in which an aluminum film and a titanium nitride film are stacked in two layers or four layers can be used as the conductive film. In the present embodiment, a conductive film with a thickness of 200 nm to 500 nm is formed by stacking the aluminum film and the titanium nitride film in two layers, in the same manner as in the first embodiment. Since the conductive film is formed by coating an inner side of the contact hole 35 with the conductive film as illustrated in FIG. 56, the data lines 6a is connected to the source region 30s through the contact hole 35. In addition, as illustrated in FIG. 57, the conductive film is formed such that inner sides of the contact holes 63, 64, and 65 are coated with the conductive film, and thus, the relay layer 6b is connected to the fourth capacitance electrode 16k through the contact hole 63, the relay layer 6c is connected to the first capacitance electrode 16d and the third capacitance electrode 16h through the contact hole 64, and in the same manner, the relay layer 6c is connected to the fifth capacitance electrode 16m through the contact hole 65.

Hereinafter, a step of forming the contact hole 71 for connecting the relay layer 6c to the capacitance line 7, a step of forming the contact hole 72 for connecting the relay layer 6b to the relay layer 7c, and a step of forming the contact hole 81 for connecting the relay layer 7c to the pixel electrode 15 are the same as in the first embodiment, and thus, detailed description thereof will be omitted.

By performing the above steps, the element substrate 10B including the four storage capacitors 16a, 16b, 16p, and 16c, the data line 6a, the capacitance line 7, and the pixel electrode 15 which are formed on an upper layer of the TFT 30 is completely manufactured on the base member 10s. In addition, the first capacitance electrode 16d, the third capacitance electrode 16h, and the fifth capacitance electrode 16m which are respectively stacked on odd-numbered layers in a place configuring the four storage capacitors 16a, 16b, 16p, and 16c, are electrically connected to the capacitance line 7 through the contact holes 64, 65, and 71. In addition, the second capacitance electrode 16f and the fourth capacitance electrode 16k which are stacked on even-numbered layers are electrically connected to the drain region 30d of the semiconductor layer 30a through the contact hole 38, and are electrically connected to the pixel electrodes 15 through the contact hole 63, the relay layer 6b, the contact hole 72, and the contact hole 81. That is, each of the four storage capacitors 16a, 16b, 16p, and 16c is connected in parallel between the capacitance line 7, and the drain region 30d of the TFT 30 and the pixel electrode 15.

According to the method of manufacturing the liquid crystal device 200 and the element substrate 10B according to the second embodiment, the following effects are obtained.

(1) The five capacitance electrodes 16d, 16f, 16h, 16k, and 16m are stacked in a state where dielectric films are interposed therebetween, and thereby four storage capacitors 16a, 16b, 16p, and 16c are configured on the base member 10s. Hence, an area of each of the capacitance electrodes 16d, 16f, 16h, 16k, and 16m can be easily secured, compared to a case where a plurality of storage capacitors are configured at different positions in a planar view without being stacked. In addition, since the first capacitance electrode 16d and the third capacitance electrode 16h are electrically connected to the capacitance line 7 through the contact hole 64 which is a common contact hole, the pixel structure on the base member 10s is simplified, compared to a case where contact holes for connection to the capacitance line 7 are respectively provided corresponding to the four storage capacitors 16a, 16b, 16p, and 16c. Hence, even if a high definition pixel P is used, it is possible to provide the liquid crystal device 200 which can realize excellent display quality by increasing a capacitance value of the pixel capacitor 16, compared to the liquid crystal device 100 according to the first embodiment, since the pixel capacitor 16 includes the four storage capacitors 16a, 16b, 16p, and 16c.

(2) The contact hole 38 for electrical connection to the second capacitance electrode 16f, the fourth capacitance electrode 16k, and the drain region 30d is largely formed over the expansion portion of the drain region 30d, compared to the contact hole 37 according to the first embodiment. Hence, it is possible to increase a capacitance value of the third storage capacitor 16c formed in a region including the inside of the contact hole 38, compared to a capacitance value of the fourth storage capacitor 16c according to the first embodiment.

(3) While the number of contact holes of the drain region 30d in the first embodiment is two (contact holes 36 and 37), the number of contact holes in the second embodiment is one (contact hole 38), and thus, a pixel structure is simplified.

Third Embodiment

Electro-Optical Device

Figure 58:
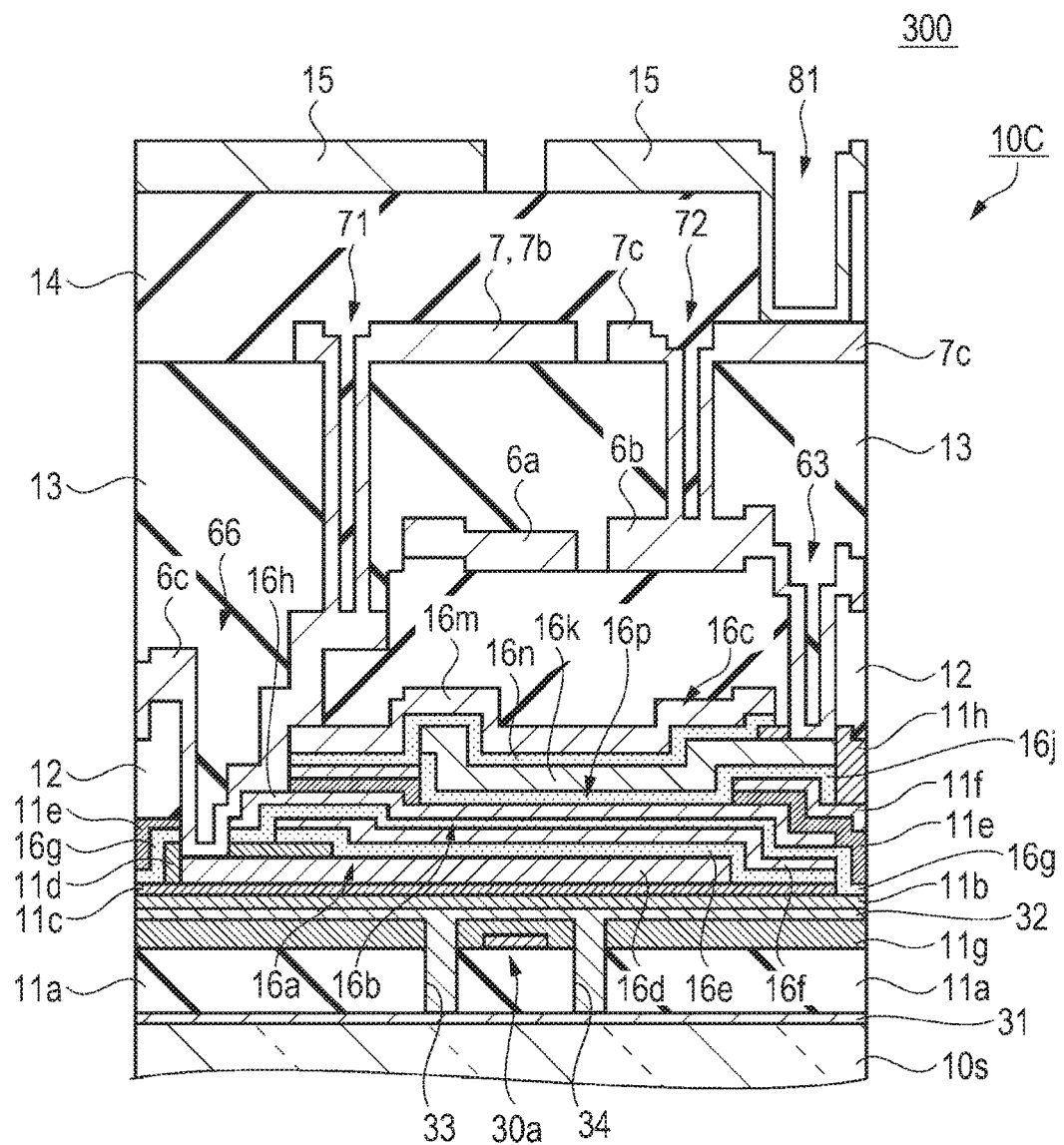
FIG. 58 is a schematic sectional view illustrating a structure of an element substrate in a liquid crystal device according to a third embodiment taken along the line LVIII-LVIII.

Next, in an electro-optical device according to a third embodiment, a liquid crystal device will be used as an example in the same manner as in the first and second embodiments, and will be described with reference to FIG. 58 and FIG. 64. FIG. 58 is a schematic sectional view illustrating a structure of an element substrate in the liquid crystal device according to the third embodiment taken along the line LVIII-LVIII.

As illustrated in FIG. 58, the liquid crystal device 300 which is used as an electro-optical device according to the third embodiment is different from the liquid crystal device 200 according to the second embodiment in a method of forming a contact hole for electrical connecting the capacitance electrodes 16d, 16h, and 16m which are stacked on odd-numbered layers in the element substrate 10B to the capacitance line 7. Hence, the same symbols or reference numerals will be attached to the same configuration as the liquid crystal device 200, and detailed description thereof will be omitted. In order to be differentiated from the element substrate 10B of the liquid crystal device 200, a reference numeral 10C is attached to the element substrate of the liquid crystal device 300 according to the third embodiment. The liquid crystal device 300 includes the liquid crystal layer 50 interposed between the element substrate 10C and the counter substrate 20, in the same manner as in the liquid crystal devices 100 and 200 according to the aforementioned embodiments.

As illustrated in FIG. 58, the element substrate 10C includes the first scan line 31, the semiconductor layer 30a, the second scan line 32, the pixel capacitor 16, the data line 6a, the capacitance line 7, and the pixel electrode 15 which are formed on the base member 10s. The pixel capacitor 16 is configured with the first storage capacitor 16a configured with the first capacitance electrode 16d and the second capacitance electrode 16f which have the first dielectric film 16e interposed therebetween and face each other, the second storage capacitor 16b configured with the second capacitance electrode 16f and the third capacitance electrode 16h which have the second dielectric film 16g interposed therebetween and face each other, the third storage capacitor 16p configured with the third capacitance electrode 16h and the fourth capacitance electrode 16k which have the third dielectric film 16j interposed therebetween and face each other, and the fourth storage capacitor 16c configured with the fourth capacitance electrode 16k and the fifth capacitance electrode 16m which have the fourth dielectric film 16n interposed therebetween and face each other. That is, the pixel capacitor 16 is configured with the four storage capacitors 16a, 16b, 16p, and 16c in which the five capacitance electrodes 16d, 16f, 16h, 16k, and 16m are sequentially stacked in an ascending order in a state where dielectric films are interposed therebetween.

The first capacitance electrode 16d, the third capacitance electrode 16h, and the fifth capacitance electrode 16m which are stacked on odd-numbered layers among the five capacitance electrodes 16d, 16f, 16h, 16k, and 16m are connected to each other by a contact hole 66 which is a common contact hole of the relay layer 6c formed in the same layer as the data line 6a. Furthermore, the relay layer 6c is connected to the capacitance line 7 by a contact hole 71 provided in the fifth interlayer insulating film 13.

The fourth capacitance electrode 16k among the second capacitance electrode 16f and the fourth capacitance electrode 16k which are stacked on even-numbered layers is electrically connected to the pixel electrode 15 by the contact hole 63 of another relay layer 6b formed on the same layer as the data line 6a, the contact hole 72 of the relay layer 7c formed on the same layer as the capacitance line 7, and the contact hole 81 of the pixel electrode 15. The second capacitance electrode 16f and the fourth capacitance electrode 16k are connected by the inside of the contact hole 38 in the drain region 30d of the semiconductor layer 30a (refer to FIG. 60). That is, the second capacitance electrode 16f and the fourth capacitance electrode 16k are connected to the pixel electrode 15 through the contact hole 63, the relay layer 6b, the contact hole 72, the relay layer 7c, and the contact hole 81, and are connected to the drain region 30d by the contact hole 38.

Hence, the element substrate 10C includes the four storage capacitors 16a, 16b, 16p, and 16c which are electrically connected in parallel between the capacitance line 7, and the drain region 30d and the pixel electrode 15, in each pixel P.

Method of Manufacturing Electro-Optical Device

Next, a method of forming the pixel capacitor 16 relating to the method of manufacturing the electro-optical device according to the third embodiment will be described with reference to FIG. 59 to FIG. 64.

A method of forming the pixel capacitor 16 according to the third embodiment includes a step of forming the first capacitance electrode 16d on the base member 10s, a step of forming the second capacitance electrode 16f on the first capacitance electrode 16d through the first dielectric film 16e, a step of forming the third capacitance electrode 16h on the second capacitance electrode 16f through the second dielectric film 16g, a step of forming the fourth capacitance electrode 16k on the third capacitance electrode 16h through the third dielectric film 16j, a step of forming the fifth capacitance electrode 16m on the fourth capacitance electrode 16k through the fourth dielectric film 16n, a step of forming the contact hole 66 which is a common contact hole for electrically connecting the first capacitance electrode 16d, the third capacitance electrode 16h, and the fifth capacitance electrode 16m to the capacitance line 7, and a step of forming one contact hole 38 for electrically connecting the second capacitance electrode 16f and the fourth capacitance electrode 16k to the drain region of the semiconductor layer 30a.

That is, the method of forming the pixel capacitor 16 according to the third embodiment is the same as that according to the second embodiment in a method of forming the four storage capacitors 16a, 16b, 16p, and 16c, but is different from that according to the second embodiment in a method of forming contact holes between the four storage capacitors 16a, 16b, 16p, and 16c and the capacitance line 7. In the following description, the same steps as in the first embodiment and the second embodiment will not be described in detail, and different steps will be specifically described.

Figure 59:
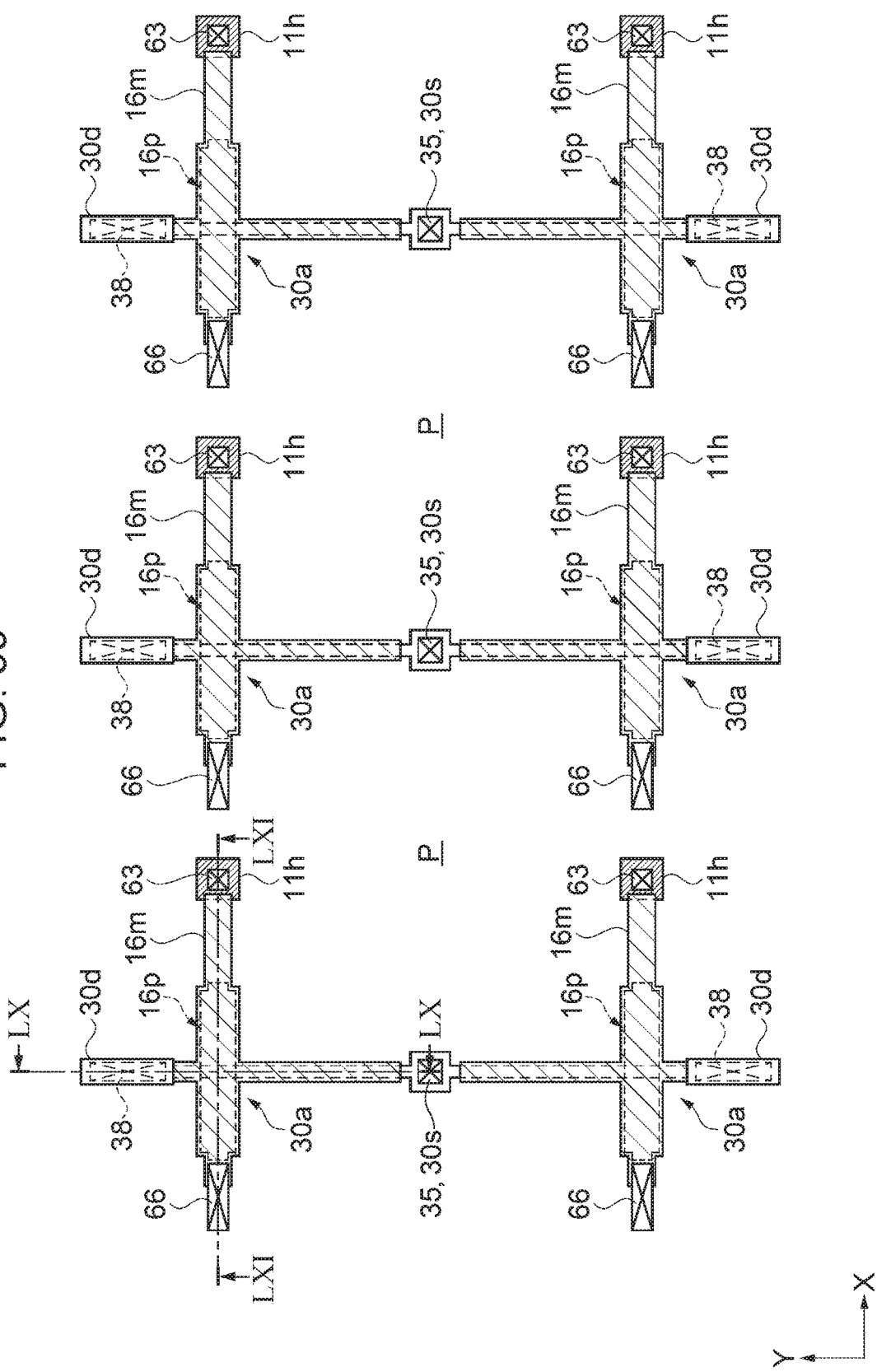
FIG. 59 is a schematic plan view illustrating the method of forming the contact holes relating to the capacitance electrodes.
Figure 60:
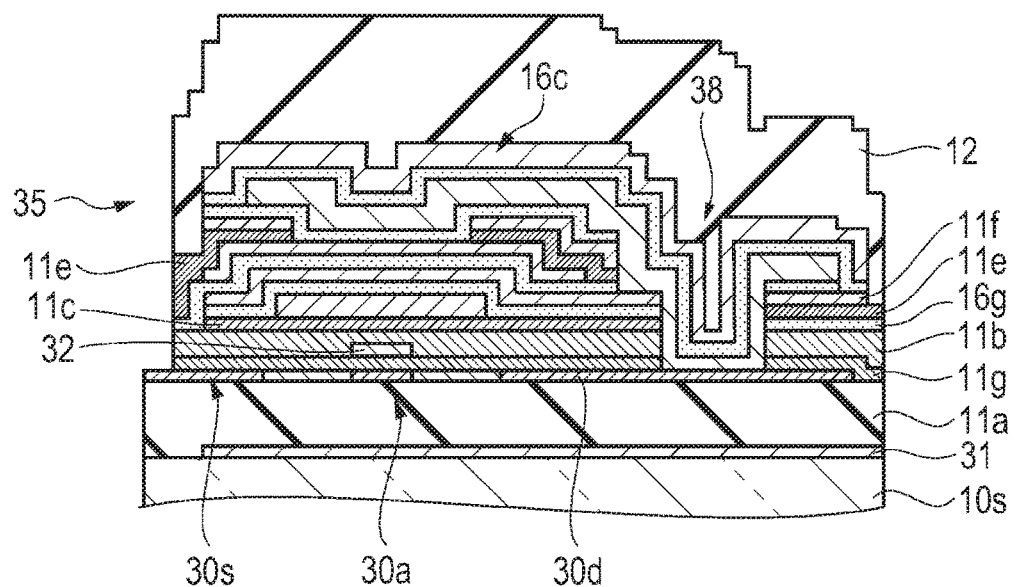
FIG. 60 is a schematic sectional view illustrating the method of forming the fourth interlayer insulating film taken along the line LX-LX.
Figure 61:
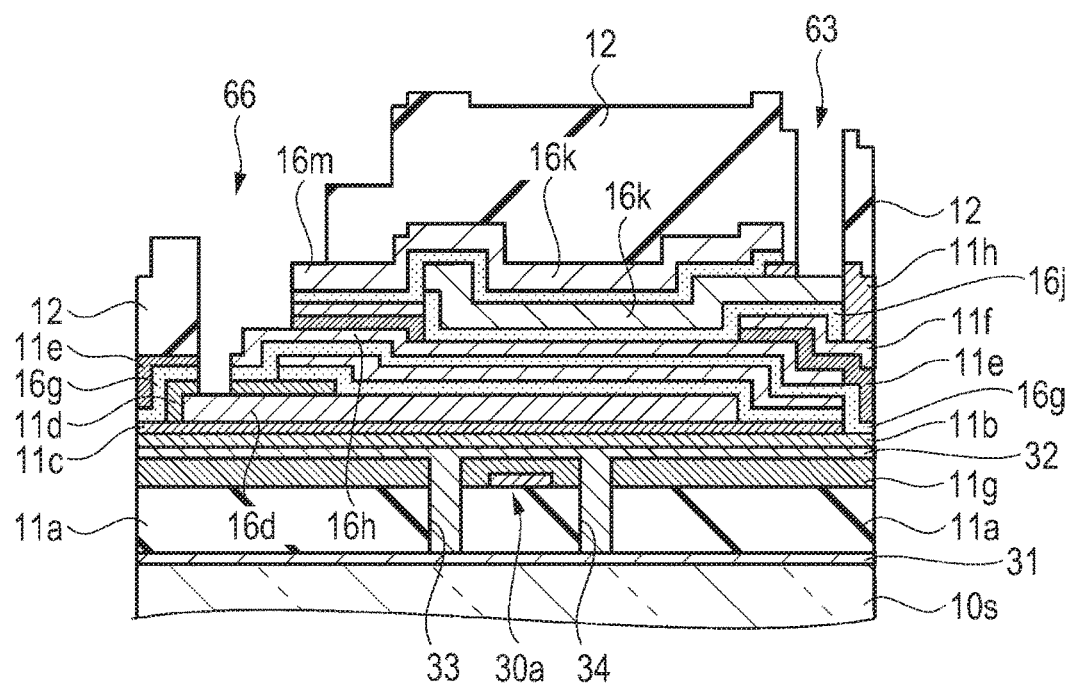
FIG. 61 is a schematic sectional view illustrating the method of forming the contact holes relating to the capacitance electrodes taken along the line LXI-LXI.

FIG. 59 is a schematic plan view illustrating the method of forming the contact holes relating to the capacitance electrodes. FIG. 60 is a schematic sectional view illustrating the method of forming the fourth interlayer insulating film taken along the line LX-LX. FIG. 61 is a schematic sectional view illustrating the method of forming the contact holes relating to the capacitance electrodes taken along the line LXI-LXI.

As illustrated in FIG. 59, the contact holes 63 and 66 relating to the capacitance electrode are formed in a position in the X direction from the intersection of the non-opening region described above. Specifically, the contact hole 66 is formed in a position overlapping an end portion on the left side in the X direction of the fifth capacitance electrode 16m in the figure, with respect to the fifth capacitance electrode 16m formed in a cross shape. In addition, the contact hole 63 is formed in a position overlapping the fourth protection film 11h in front of an end portion on the right side in the X direction of the fifth capacitance electrode 16m. The contact hole 66 is formed longer than the contact hole 63 in the X direction in a planar view.

As illustrated in FIG. 60, the fourth interlayer insulating film 12 is formed to cover the fourth storage capacitor 16c. In the present embodiment, the fourth interlayer insulating film 12 with a thickness of, for example, 300 nm to 800 nm is formed by using an NSG film, in the same manner as in the second embodiment.

The contact hole 35 reaching the source region 30s of the semiconductor layer 30a by penetrating the fourth interlayer insulating film 12, the third interlayer insulating film 11e, the second dielectric film 16g, the second interlayer insulating film 11b, and the gate insulating film 11g is formed.

In addition, as illustrated in FIG. 61, the contact hole 66 reaching the first capacitance electrode 16d, the third capacitance electrode 16h, and the fifth capacitance electrode 16m by penetrating the fourth interlayer insulating film 12, the third interlayer insulating film 11e, the second dielectric film 16g, and the second protection film 11d is formed in a stepwise manner. Furthermore, the contact hole 63 reaching the fourth capacitance electrode 16k by penetrating the fourth interlayer insulating film 12 and the fourth protection film 11h is formed.

The contact hole 35 and the contact holes 63 and 66 are formed by dry-etching a silicon oxide film and a silicon nitride film.

Figure 62:
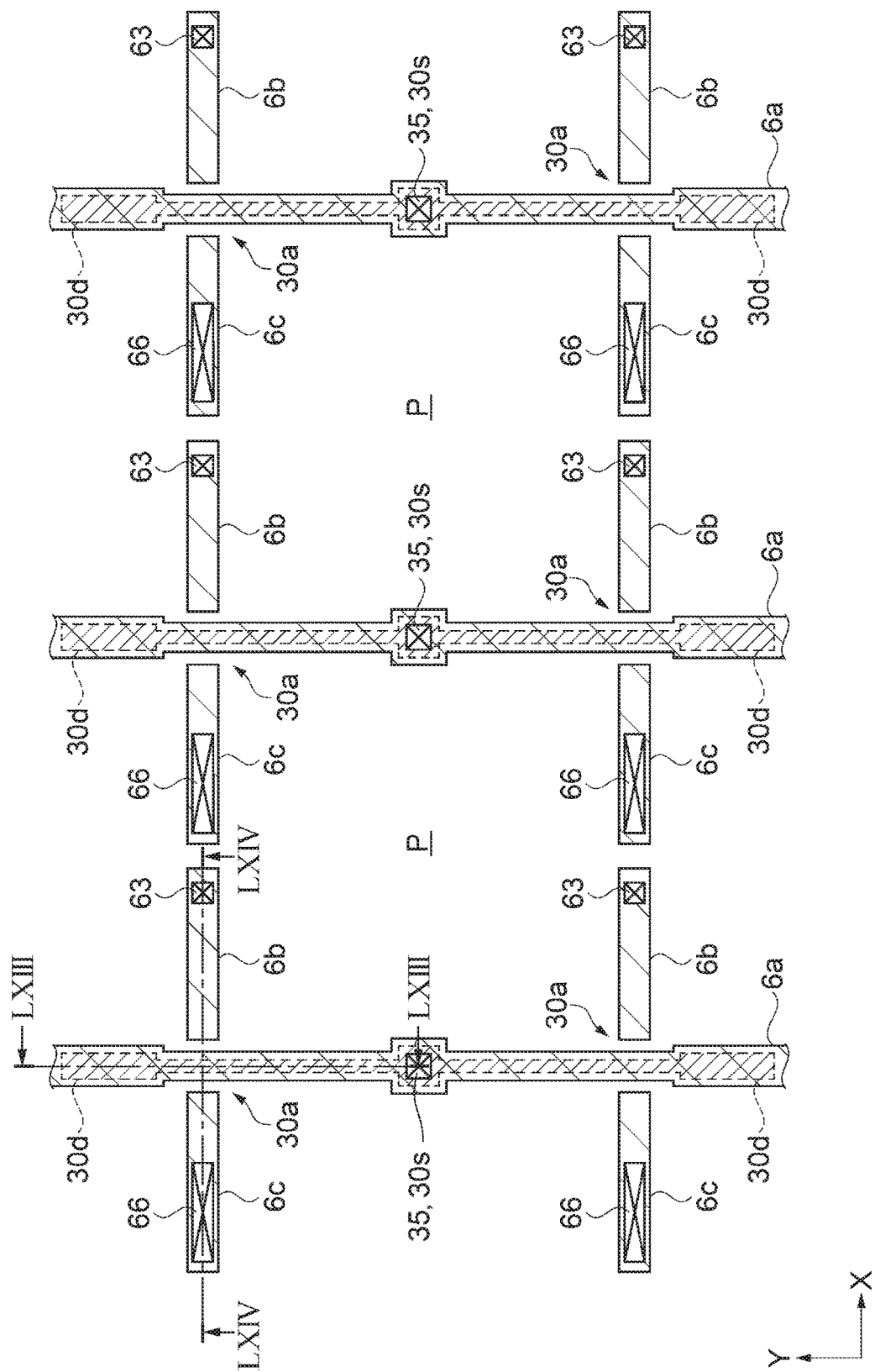
FIG. 62 is a schematic plan view illustrating the method of forming the data lines.
Figure 63:
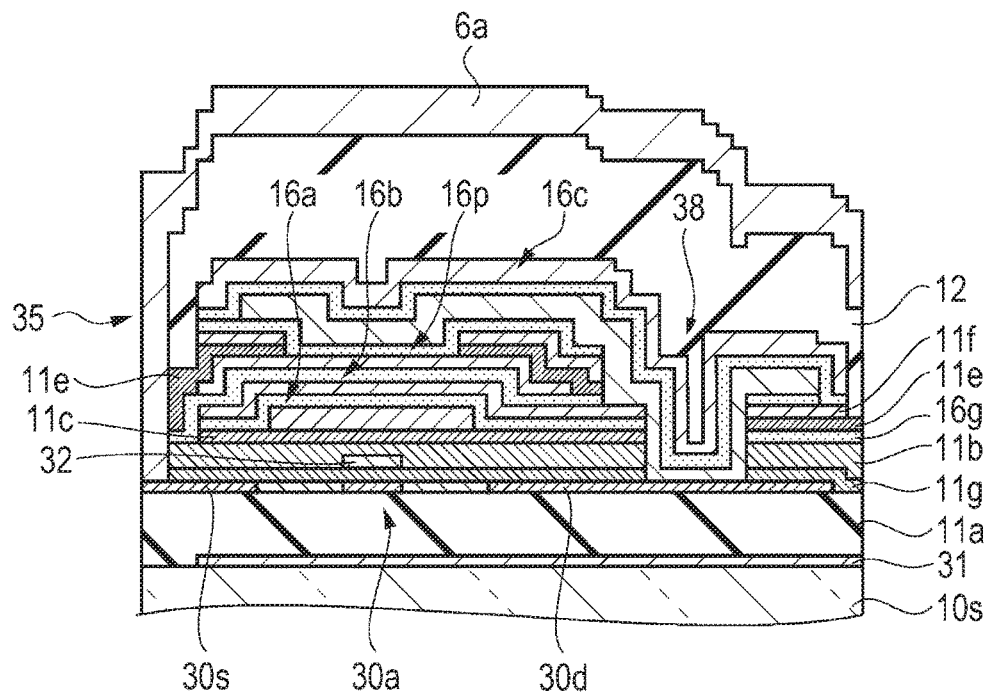
FIG. 63 is a schematic sectional view illustrating the method of forming the data lines taken along the line LXIII-LXIII.

FIG. 62 is a schematic plan view illustrating the method of forming the data lines. FIG. 63 is a schematic sectional view illustrating the method of forming the data lines taken along the line LXIII-LXIII. FIG. 64 is a schematic sectional view illustrating a method of forming the data lines and a relay layer taken along the line LXIV-LXIV.

As illustrated in FIG. 62, the data lines 6a extend in the Y direction, and are disposed in parallel with an interval in the X direction, based on a pitch between the pixels P. Widths of the data lines 6a in a portion overlapping the expansion portion of the drain region 30d and a portion overlapping the contact hole 35 are greater than those in other portions. In addition, two relay layers 6b and 6c in parallel along the X direction are provided between the data lines 6a adjacent to each other in the X direction. The two contact holes 63 and 66 for connection to the five capacitance electrodes 16d, 16f, 16h, 16k, and 16m stacked on the base member 10s are provided in the two relay layers 6b and 6c. Specifically, the contact hole 63 is provided in the relay layer 6b, and the contact hole 66 is provided in the relay layer 6c. The contact hole 66 is longer than the contact hole 63, in the X direction. The contact hole 66 is an example of a common contact hole, in the invention.

Figure 64:
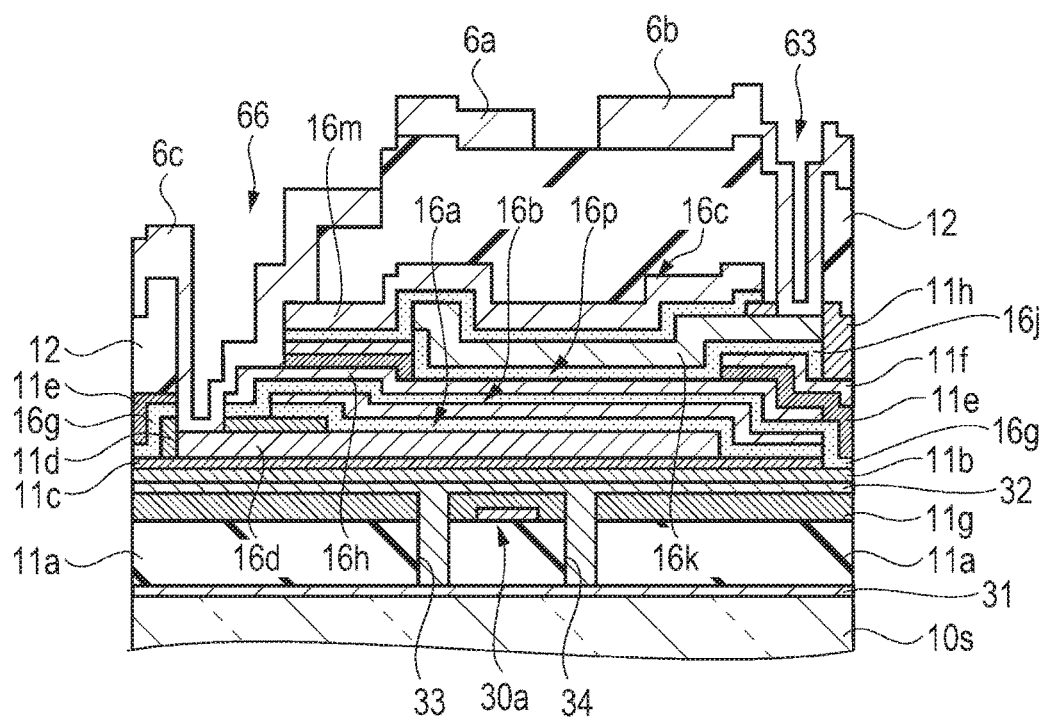
FIG. 64 is a schematic sectional view illustrating a method of forming the data lines and a relay layer taken along the line LXIV-LXIV.

As illustrated in FIG. 63 and FIG. 64, a conductive film covering the fourth interlayer insulating film 12 is formed, and the data line 6a, the relay layer 6b, and the relay layer 6c are formed by patterning the conductive film. An aluminum alloy film, and a film in which an aluminum film and a titanium nitride film are stacked in two layers or four layers can be used as the conductive film. In the present embodiment, a conductive film with a thickness of 200 nm to 500 nm is formed by stacking the aluminum film and the titanium nitride film in two layers, in the same manner as in the second embodiment. Since the conductive film is formed by coating an inner side of the contact hole 35 with the conductive film as illustrated in FIG. 63, the data line 6a is connected to the source region 30s through the contact hole 35. In addition, as illustrated in FIG. 64, the conductive film is formed such that inner sides of the contact holes 63 and 66 are coated with the conductive film, and thus, the relay layer 6b is connected to the fourth capacitance electrode 16k through the contact hole 63, and the relay layer 6c is connected to the first capacitance electrode 16d, the third capacitance electrode 16h, and the fifth capacitance electrode 16m through the contact hole 66.

Hereinafter, a step of forming the contact hole 71 for connecting the relay layer 6c to the capacitance line 7, a step of forming the contact hole 72 for connecting the relay layer 6b to the relay layer 7c, and a step of forming the contact hole 81 for connecting the relay layer 7c to the pixel electrode 15 are the same as in the first embodiment, and thus, detailed description thereof will be omitted.

By performing the above steps, the element substrate 10C including the four storage capacitors 16a, 16b, 16p, and 16c, the data line 6a, the capacitance line 7, and the pixel electrode 15 which are formed on an upper layer of the TFT 30 is completely manufactured on the base member 10s. In addition, the first capacitance electrode 16d, the third capacitance electrode 16h, and the fifth capacitance electrode 16m which are respectively stacked on odd-numbered layers in a place configuring the four storage capacitors 16a, 16b, 16p, and 16c, are electrically connected to the capacitance line 7 through one contact hole 66. In addition, the second capacitance electrode 16f and the fourth capacitance electrode 16k which are stacked on even-numbered layers are electrically connected to the drain region 30d of the semiconductor layer 30a through one contact hole 38, and are electrically connected to the pixel electrodes 15 through the contact hole 63, the relay layer 6b, the contact hole 72, and the contact hole 81. That is, each of the four storage capacitors 16a, 16b, 16p, and 16c is connected in parallel between the capacitance line 7, and the drain region 30d of the TFT 30 and the pixel electrode 15.

According to the method of forming the liquid crystal device 300 and the pixel capacitor 16 according to the third embodiment, the following effects are obtained in addition to the effects (2) and (3) according to the second embodiment.

(4) The four storage capacitors 16a, 16b, 16p, and 16c are formed by stacking the five capacitance electrodes 16d, 16f, 16h, 16k, and 16m on the base member 10s of the element substrate 10 in a state where dielectric films are interposed therebetween. Hence, an area of each of the capacitance electrodes 16d, 16f, 16h, 16k, and 16m can be easily secured, compared to a case where a plurality of storage capacitors are configured at different positions in a planar view without being stacked. In addition, since the first capacitance electrode 16d, the third capacitance electrode 16h, and the fifth capacitance electrode 16m are electrically connected to the capacitance line 7 through the contact hole 66 which is a common contact hole, the pixel structure on the base member 10s is simplified, compared to a case where contact holes for connection to the capacitance line 7 are respectively provided corresponding to the four storage capacitors 16a, 16b, 16p, and 16c. Hence, even if a high definition pixel P is used, it is possible to provide the liquid crystal device 300 which can realize excellent display quality by increasing a capacitance value of the pixel capacitor 16, compared to the liquid crystal device 100 according to the first embodiment, since the pixel capacitor 16 includes the four storage capacitors 16a, 16b, 16p, and 16c.

Fourth Embodiment

Figure 65:
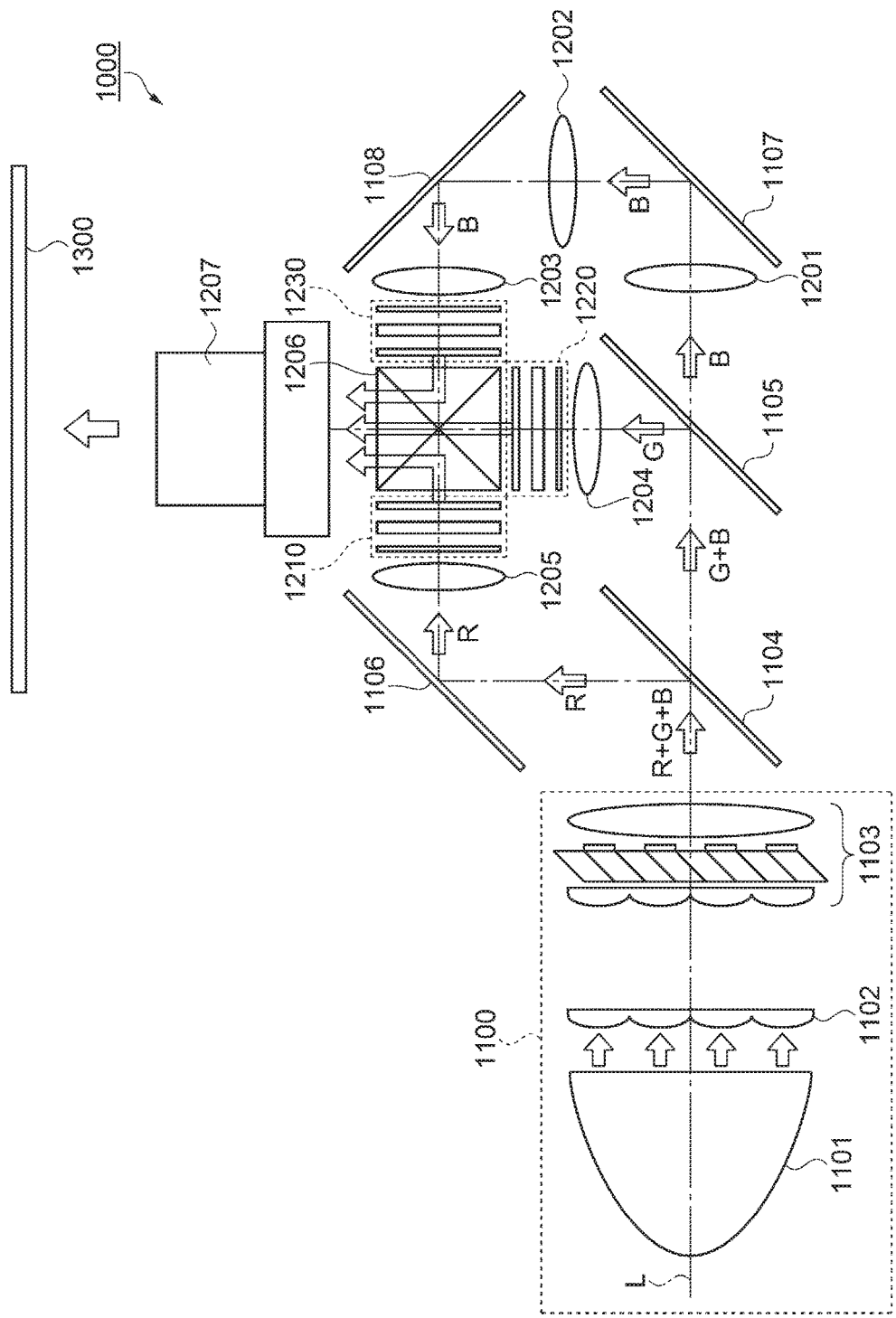
FIG. 65 is a schematic view illustrating a configuration of a projection type display device.

Next, a projection type display device (liquid crystal projector) will be described as an example of an electronic apparatus that can employ the liquid crystal device which is used as an electro-optical device according to the first to third embodiments. FIG. 65 is a schematic view illustrating a configuration of the projection type display device.

As illustrated in FIG. 65, the projection type display device 1000 that is used as an electronic apparatus according to the present embodiment includes a polarized light illumination device 1100 disposed along a system optical axis L and two dichroic mirrors 1104 and 1105 that is used as light separating elements. In addition, three reflection mirrors 1106, 1107, and 1108, and five relay lenses 1201, 1202, 1203, 1204, and 1205 are included in the projection type display device. Furthermore, transmission type liquid crystal light valves 1210, 1220, and 1230 that are used as three optical modulation units, a cross dichroic prism 1206 that is used as a photosynthesis element, and a projection lens 1207 are included in the projection type display device.

The polarized light illumination device 1100 is schematically configured by a lamp unit 1101 that is used as a light source configured with a white light source such as an ultrahigh pressure mercury lamp or halogen lamp, an integrator lens 1102, and a polarized light conversion element 1103.

The dichroic mirror 1104 reflects red light (R) and makes green light (G) and blue light (B) pass through, among polarized light flux that is emitted from the polarized light illumination device 1100. The other dichroic mirror 1105 reflects the green light (G) that passes through the dichroic mirror 1104, and makes the blue light (B) pass through.

The red light (R) that is reflected by the dichroic mirror 1104 is reflected by the reflection mirror 1106, and thereafter, is incident on the liquid crystal light valve 1210 through the relay lens 1205.

The green light (G) that is reflected by the dichroic mirror 1105 is incident on the liquid crystal light valve 1220 through the relay lens 1204.

The blue light (B) that passes through the dichroic mirror 1105 is incident on the liquid crystal light valve 1230 through a light guide system configured with the three relay lenses 1201, 1202, and 1203, and the two reflection mirrors 1107 and 1108.

The liquid crystal light valves 1210, 1220, and 1230 are respectively disposed to face the incident surfaces of each color light of the cross dichroic prism 1206. The colored light incident on the liquid crystal light valves 1210, 1220, and 1230 is modulated based on video information (video signal) and is emitted toward the cross dichroic prism 1206. The prism is configured with four rectangular prisms bonded to each other, and a dielectric multilayer that reflects red light and a dielectric multilayer that reflects blue light are formed in a cross shape in the inner surface of the prism. Three colored lights are synthesized by the dielectric multilayers, and lights that represent color images are synthesized. The synthesized light is projected onto a screen 1300 by the projection lens 1207 that is a projection optical system, and an image is enlarged to be displayed.

The liquid crystal light valve 1210 is a device in which the liquid crystal device 100 (refer to FIG. 1) according to the first embodiment is employed. A pair of polarization elements disposed in the cross Nicol are disposed with a gap on the incident side and the emission side of the color light of the liquid crystal device 100. The other liquid crystal light valves 1220 and 1230 are the same as the liquid crystal light valve 1210.

According to the projection type display device 1000, the liquid crystal device 100 according to the first embodiment is used as the liquid crystal light valves 1210, 1220, and 1230, and the pixel capacitor 16 of a pixel circuit is configured to include the three storage capacitors 16a, 16b, and 16c, and thus, the capacitance value of the pixel capacitor 16 is easily secured compared to the related art. That is, it is possible to provide the projection type display device 1000 that, even if small pixels P are disposed at a high density in the display region E so as to project a high definition image, can retain a potential which is supplied to the pixel electrode 15 for a predetermined time and can project an image with high quality. Even if the liquid crystal device 200 according to the second embodiment or the liquid crystal device 300 according to the third embodiment is employed as the liquid crystal light valves 1210, 1220, and 1230, the same effects are obtained.

An electronic apparatus employing any one of the liquid crystal devices 100, 200, and 300 according to the first to third embodiments is not limited to the projection type display device 1000. For example, the counter substrate 20 of the liquid crystal device 100 may include color filters corresponding to at least red (R), green (G), and blue (B), and the liquid crystal value may be configured with a single plate. In addition, it is possible to preferably use any one of the liquid crystal devices 100, 200, and 300 as a display unit of an information terminal apparatus such as, a projection type head-up display (HUD), a head mounted display (HMD), an electronic book, a personal computer, a digital still camera, a liquid crystal television, a video recorder of a view finder type or a monitor-direct-view type, a car navigation system, an electronic organizer, or a POS.

The invention is not intended to limit the embodiments described above, and may be appropriately modified within the scope that does not depart from the gist or spirit of the invention which is read from the claims and the entire specification. An electro-optical device, a method of manufacturing the electro-optical device, and an electronic apparatus which employs the electro-optical device, including the modifications are also included in the technical scope of the invention. In addition to the embodiments, various modification examples are considered. Hereinafter, modification examples will be described.

Modification Example 1

As described above, a common contact hole which electrically connects the capacitance electrodes 16d, 16h, and 16m that are stacked on odd-numbered layers to the capacitance line 7 may connect at least two of the capacitance electrodes 16d, 16h, and 16m to the capacitance line, on the base member 10s. In other words, the configuration in which the capacitance electrodes 16d, 16h, and 16m that are stacked on odd-numbered layers are connected by one contact hole 66 formed in a stepwise shape as described in the third embodiment, can also be employed in the first embodiment.

Modification Example 2

As described in the first embodiment, a method of collectively patterning the second capacitance electrode 16f, the second dielectric film 16g, and the third capacitance electrode 16h is not limited to be applied to a case where the three storage capacitors 16a, 16b, and 16c are stacked on the base member 10s. The method can also be applied to the second embodiment or the third embodiment in which the four storage capacitors 16a, 16b, 16p, and 16c are stacked on the base member 10s. In this case, the contact hole which connects the capacitance electrodes 16f and 16k stacked on the even-numbered layers to the drain region 30d may be configured with the two contact holes 36 and 37 as described in the first embodiment.

Modification Example 3

The number of storage capacitors stacked on the base member 10s is not limited to 3 or 4 as described in the aforementioned embodiments. Even in a case where five or more storage capacitors are stacked, a method of collectively patterning the common contact hole and the capacitance electrodes and forming the contact holes which are connected to the drain region 30d, according to the invention, can be applied.

Modification Example 4

An electro-optical device in which the structure of the pixel capacitor 16 according to the invention is employed in an element substrate including a transistor that is a switching element of the pixel P is not limited to a transmission type liquid crystal device, and may be employed in a reflection type liquid crystal device. In addition, the electro-optical device is not limited to a light receiving type liquid crystal device, and can also be employed in, for example, a self-luminous type electro-optical device having a light emitting element such as an organic electroluminescence (EL) element included in the pixel P.

The entire disclosure of Japanese Patent Application No. 2015-199981, filed Oct. 8, 2015 is expressly incorporated by reference herein.

What is claimed is:

1. An electro-optical device comprising:
   a substrate;
   a pixel electrode which is provided over the substrate;
   a transistor which is provided between the pixel electrode and the substrate; and
   a pixel capacitor which is provided between the pixel electrode and the transistor,
   wherein the pixel capacitor includes three storage capacitors which are electrically connected to the pixel electrode and a capacitance line to which a common potential is applied,
   wherein the three storage capacitors include five capacitance electrodes which are stacked in a state where dielectric films are interposed therebetween,
   wherein at least two capacitance electrodes, which correspond to odd-numbered layers among the five capacitance electrodes, are electrically connected to the capacitance line through a common contact hole, and
   wherein each of the at least two capacitance electrodes is in direct contact with a relay layer that is provided within the common contact hole and that extends to the capacitance line.

2. The electro-optical device according to claim 1, wherein the pixel capacitor includes a first storage capacitor which is configured with a first capacitance electrode and a second capacitance electrode that have a first dielectric film interposed therebetween, a second storage capacitor which is configured with the second capacitance electrode and a third capacitance electrode that have a second dielectric film interposed therebetween, and a third storage capacitor which is configured with a fourth capacitance electrode and a fifth capacitance electrode that have a third dielectric film interposed therebetween, and wherein at least two of the first capacitance electrode, the third capacitance electrode, and the fifth capacitance electrode are electrically connected to the capacitance line through the common contact hole.

3. The electro-optical device according to claim 2, wherein, in the second capacitance electrode and the third capacitance electrode, electrode end portions of the substrate are aligned in a planar view.

4. The electro-optical device according to claim 2, wherein the second capacitance electrode and the fourth capacitance electrode are electrically connected to the transistor through one contact hole.

5. The electro-optical device according to claim 1,
wherein the pixel capacitor includes a first storage capacitor which is configured with a first capacitance electrode and a second capacitance electrode that have a first dielectric film interposed therebetween, a second storage capacitor which is configured with the second capacitance electrode and a third capacitance electrode that have a second dielectric film interposed therebetween, a third storage capacitor which is configured with the third capacitance electrode and a fourth capacitance electrode that have a third dielectric film interposed therebetween, and a fourth storage capacitor which is configured with the fourth capacitance electrode and a fifth capacitance electrode that have a fourth dielectric film interposed therebetween, and wherein at least two of the first capacitance electrode, the third capacitance electrode, and the fifth capacitance electrode are electrically connected to the capacitance line through the common contact hole.

6. The electro-optical device according to claim 5,
wherein at least one dielectric film of the first dielectric film, the second dielectric film, the third dielectric film, and the fourth dielectric film covers at least a part of an end surface of a lower capacitance electrode under the at least one dielectric film, and wherein an upper capacitance electrode which is disposed through the at least one dielectric film with respect to the lower capacitance electrode has a portion which faces the at least a part of the end surface of the lower capacitance electrode.

7. The electro-optical device according to claim 6, wherein a thickness of the lower capacitance electrode is greater than a thickness of the at least one dielectric film.

8. The electro-optical device according to claim 6, wherein the at least one dielectric film has a greater thickness than other dielectric films.

9. The electro-optical device according to claim 6, wherein the at least one dielectric film is a silicon-based oxide film, and covers an area overlapping an opening of the pixel when viewed in a planar view.

10. The electro-optical device according to claim 1, wherein a capacitance electrode which is farthest away from the transistor among the at least five capacitance electrodes has light shielding properties, on the substrate.

11. An electronic apparatus comprising:
the electro-optical device according to claim 1.

* * * * *